(12) United States Patent
Jang et al.

(10) Patent No.: US 11,508,876 B2
(45) Date of Patent: Nov. 22, 2022

(54) LIGHT EMITTING DEVICE PACKAGE AND DISPLAY DEVICE HAVING THE SAME

(71) Applicant: SEOUL VIOSYS CO., LTD., Ansan-si (KR)

(72) Inventors: Jong Min Jang, Ansan-si (KR); Chang Youn Kim, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 98 days.

(21) Appl. No.: 16/728,360

(22) Filed: Dec. 27, 2019

(65) Prior Publication Data

US 2020/0212262 A1 Jul. 2, 2020

Related U.S. Application Data

(60) Provisional application No. 62/786,631, filed on Dec. 31, 2018.

(51) Int. Cl.
*H01L 33/38* (2010.01)
*H01L 33/50* (2010.01)
(Continued)

(52) U.S. Cl.
CPC ........ *H01L 33/382* (2013.01); *H01L 25/0753* (2013.01); *H01L 33/504* (2013.01); *H01L 33/62* (2013.01)

(58) Field of Classification Search
CPC ............. H01L 33/504; H01L 33/04–06; H01L 33/10–105; H01L 27/3211–3218;
(Continued)

(56) References Cited

U.S. PATENT DOCUMENTS 6,100,103 A 8/2000 Shim et al.
10,304,998 B2 5/2019 Kim et al.
(Continued)

FOREIGN PATENT DOCUMENTS

JP H11-503879 3/1999
KR 10-2015-0035113 4/2015
(Continued)

OTHER PUBLICATIONS

Extended European Search Report dated Sep. 8, 2022, issued to European Patent Application No. 19906925.3.

*Primary Examiner* — Lawrence C Tynes, Jr.
*Assistant Examiner* — Na
(74) *Attorney, Agent, or Firm* — H.C. Park & Associates, PLC

(57) ABSTRACT

A light emitting device package including a substrate, a light emitting structure including a plurality of epitaxial stacks sequentially stacked on the substrate configured to emit light having different wavelength bands from each other, the light emitting structure having a light emitting area defined by the epitaxial stacks, a plurality of bump electrodes disposed on the light emitting structure, at least a portion of each bump electrode overlapping with the light emitting area, a molding layer covering a side surface and an upper surface of the light emitting structure, a plurality of fan-out lines disposed on the molding layer and connected to the light emitting structure through the bump electrodes, and an insulating layer disposed on the fan-out lines and exposing a portion of the fan-out lines, in which the exposed portion of the fan-out lines does not overlap with the light emitting area.

16 Claims, 44 Drawing Sheets

(51) Int. Cl.
*H01L 33/62* (2010.01)
*H01L 25/075* (2006.01)

(58) Field of Classification Search
CPC ....... H01L 27/3244–3279; H01L 21/565–566; H01L 23/3142; H01L 33/52–56; H01L 51/5253–5256; H01L 2224/0391; H01L 2224/022–02215; H01L 21/02293; H01L 21/02631; H01L 21/02634; H01L 21/2018; H01L 21/2022–2026; G09G 2300/0443–0447; G09G 2300/0478–0495; C30B 25/02–22

See application file for complete search history.

(56) References Cited

U.S. PATENT DOCUMENTS

| | | | |
|---|---|---|---|
| 2006/0169994 A1* | 8/2006 | Tu | H01L 33/387 257/89 |
| 2007/0069220 A1* | 3/2007 | Ogihara | H01L 25/0756 257/79 |
| 2012/0074441 A1* | 3/2012 | Seo | H01L 33/505 257/91 |
| 2015/0333230 A1* | 11/2015 | Moon | H01L 33/46 257/88 |
| 2016/0079491 A1* | 3/2016 | Endo | H01L 33/54 257/100 |
| 2019/0165207 A1* | 5/2019 | Kim | H01L 33/505 |
| 2019/0189596 A1* | 6/2019 | Chae | H01L 33/50 |
| 2019/0189681 A1* | 6/2019 | Chae | G09G 3/3225 |
| 2019/0189850 A1* | 6/2019 | Wang | H01L 33/145 |
| 2019/0393279 A1* | 12/2019 | Lee | H01L 27/3234 |
| 2020/0251613 A1* | 8/2020 | Yang | H01L 33/62 |
| 2020/0279983 A1* | 9/2020 | Takojima | H01L 33/641 |
| 2020/0303605 A1* | 9/2020 | Jang | H01L 33/08 |
| 2020/0303607 A1* | 9/2020 | Jang | H01L 25/0753 |
| 2020/0365647 A1* | 11/2020 | Jang | H01L 33/62 |
| 2020/0365648 A1* | 11/2020 | Jang | H01L 33/08 |
| 2020/0365649 A1* | 11/2020 | Jang | H01L 33/44 |
| 2021/0082887 A1* | 3/2021 | Jang | H01L 27/153 |

FOREIGN PATENT DOCUMENTS

| | | |
|---|---|---|
| KR | 10-2016-0011723 | 2/2016 |
| KR | 10-2016-0081473 | 7/2016 |
| KR | 10-2018-0000177 | 1/2018 |

* cited by examiner

LIGHT EMITTING DEVICE PACKAGE AND DISPLAY DEVICE HAVING THE SAME

CROSS-REFERENCE TO RELATED APPLICATION

This application claims the benefit of U.S. Provisional Application No. 62/786,631, filed on Dec. 31, 2018, which is hereby incorporated by reference for all purposes as if fully set forth herein.

BACKGROUND

Field

Exemplary embodiments of the invention relate generally to a light emitting device package implementing colors and, more specifically, to a display device having the same.

Discussion of the Background

In recent years, display devices employing a light emitting diode (LED) have been developed. The display device employing the light emitting diode may be manufactured by forming structures of red, green, and blue light emitting diodes, which are individually grown, on a substrate.

However, in addition to the needs for a high-resolution and full-color display device, the needs for a display device having a high level of color purity and color reproducibility that can be manufactured by a simplified process are also steadily increasing.

The above information disclosed in this Background section is only for understanding of the background of the inventive concepts, and, therefore, it may contain information that does not constitute prior art.

SUMMARY

Light emitting packages constructed according to exemplary embodiments of the invention and display devices including the same have a simple structure and are capable of being simply manufactured.

Additional features of the inventive concepts will be set forth in the description which follows, and in part will be apparent from the description, or may be learned by practice of the inventive concepts.

A light emitting device package according to an exemplary embodiment includes a substrate, a light emitting structure including a plurality of epitaxial stacks sequentially stacked on the substrate configured to emit light having different wavelength bands from each other, the light emitting structure having a light emitting area defined by the epitaxial stacks, a plurality of bump electrodes disposed on the light emitting structure, at least a portion of each bump electrode overlapping with the light emitting area, a molding layer covering a side surface and an upper surface of the light emitting structure, a plurality of fan-out lines disposed on the molding layer and connected to the light emitting structure through the bump electrodes, and an insulating layer disposed on the fan-out lines and exposing a portion of the fan-out lines, in which the exposed portion of the fan-out lines does not overlap with the light emitting area.

An area of the fan-out lines overlapping with the light emitting area may be less than an area of the bump electrodes overlapping with the light emitting area.

The epitaxial stacks may include a first epitaxial stack configured to emit a first light, a second epitaxial stack disposed on the first epitaxial stack and configured to emit a second light having a wavelength band different from the first light, and a third epitaxial stack disposed on the second epitaxial stack and configured to emit a third light having a wavelength band different from the first and second lights.

Each of the first, second, and third epitaxial stacks may include a p-type semiconductor layer, an active layer disposed on the p-type semiconductor layer, and an n-type semiconductor layer disposed on the active layer.

The bump electrodes may include a first bump electrode connected to the n-type semiconductor layer of the first epitaxial stack, a second bump electrode connected to the n-type semiconductor layer of the second epitaxial stack, a third bump electrode connected to the n-type semiconductor layer of the third epitaxial stack, and a fourth bump electrode connected to the p-type semiconductor layers of the first, second, and third epitaxial stacks.

The fan-out lines may include first, second, third, and fourth fan-out lines respectively connected to the first, second, third, and fourth bump electrodes.

The light emitting device package may further include connection electrodes disposed between the fan-out lines and the bump electrodes to connect the fan-out lines and the bump electrodes, respectively.

A distance between two connection electrodes adjacent to each other may be greater than a distance between two bump electrodes adjacent to each other, and less than a distance between two fan-out lines adjacent to each other.

The first, second, third, and fourth bump electrodes may be disposed over an edge of the first, second, and third epitaxial stacks.

A distance between two of the fan-out lines adjacent to each other may be greater than a distance between two of the bump electrodes adjacent to each other.

A distance between the exposed portions of two fan-out lines adjacent to each other may be greater than the distance between two bump electrodes adjacent to each other.

The light emitting device package may further include pads disposed between the bump electrodes and the first, second, and third epitaxial stacks, the pads may include a first pad connecting the n-type semiconductor layer of the first epitaxial stack to the first bump electrode, a second pad connecting the n-type semiconductor layer of the second epitaxial stack to the second bump electrode, a third pad connecting the n-type semiconductor layer of the third epitaxial stack to the third bump electrode, and a fourth pad connecting the p-type semiconductor layers of the first, second, and third epitaxial stacks to the fourth bump electrode.

The light emitting device package may further include an insulation layer disposed between the first, second, and third epitaxial stacks and the first, second, third, and fourth pads, the insulation layer having a plurality of contact holes defined therethrough, in which the first, second, and third epitaxial stacks may be connected to the first, second, third, and fourth pads respectively through the contact holes.

The contact holes may include a first contact hole through which a portion of the n-type semiconductor layer of the first epitaxial stack is exposed, a second contact hole through which a portion of the n-type semiconductor layer of the second epitaxial stack is exposed, a third contact hole through which a portion of the n-type semiconductor layer of the third epitaxial stack is exposed, and a fourth contact hole through which a portion of the p-type semiconductor layers of the first, second, and third epitaxial stacks is exposed.

The fourth contact hole may include a first sub-contact hole through which a portion of the p-type semiconductor layer of the first epitaxial stack is exposed, and a second sub-contact hole through which a portion of the p-type semiconductor layer of each of the second and third epitaxial stacks is exposed.

The light emitting device package may further include redistribution lines disposed on the insulating layer and respectively connected to the fan-out lines.

A distance between the redistribution lines adjacent to each other may be different from a distance between the fan-out lines adjacent to each other.

A display device according to another exemplary embodiment includes a plurality of pixels, each of the pixels including a light emitting structure including a substrate and a plurality of epitaxial stacks sequentially stacked on the substrate and configured to emit light having different wavelength bands from each other, the light emitting structure having a light emitting area defined by the epitaxial stacks, a molding layer covering a side surface and an upper surface of the light emitting structure, a plurality of bump electrodes disposed on the light emitting structure, at least a portion of each bump electrode overlapping with the light emitting area, and a plurality of fan-out lines disposed on the molding layer and connected to the light emitting structure through the bump electrodes, in which an area of the fan-out lines overlapping with the light emitting area is less than an area of the bump electrodes overlapping with the light emitting area.

A light emitting device package module according to still another exemplary embodiment includes a printed circuit board including a plurality of electrodes, a light emitting device package disposed on the printed circuit board, and a solder disposed between the printed circuit board and the light emitting device package, the light emitting device package including a substrate, a light emitting structure including a plurality of epitaxial stacks sequentially stacked on the substrate and configured to emit light having different wavelength bands from each other, the light emitting structure having a light emitting area defined by the epitaxial stacks, a plurality of bump electrodes disposed on the light emitting structure, at least a portion of each bump electrode overlapping with the light emitting area, a molding layer covering a side surface and an upper surface of the light emitting structure, a plurality of fan-out lines disposed on the molding layer and connected to the light emitting structure through the bump electrodes, and an insulating layer disposed on the fan-out lines to expose a portion of the fan-out lines, in which the exposed portion of the fan-out lines is spaced apart from the light emitting area.

A portion of the solder may be exposed to an outside of the light emitting device package.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
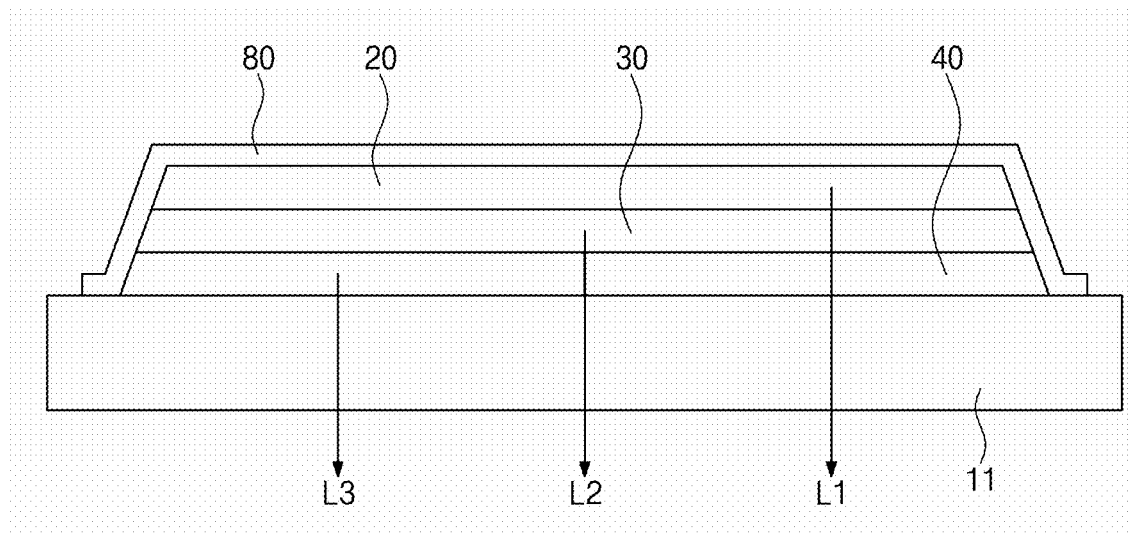
FIG. 1 is a schematic cross-sectional view of a light emitting device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Exemplary embodiments of the disclosure relate to a light emitting device that emits light. The light emitting device according to exemplary embodiments may be employed in various devices as a light source.

FIG. 1 is a cross-sectional view of a light emitting device according to an exemplary embodiment.

Referring to FIG. 1, the light emitting device according to an exemplary embodiment includes a light emitting structure including a plurality of epitaxial stacks sequentially stacked one over another. The epitaxial stacks are disposed on a substrate 11.

The substrate 11 has substantially a plate shape having with a front surface and a rear surface.

According to an exemplary embodiment, the light emitting device may include two or more epitaxial stacks each emitting light having different wavelength bands. More particularly, the epitaxial stack may be provided in plural numbers, and light emitted from the epitaxial stacks may have the same energy bands as each other, or have different energy bands from each other. In the illustrated exemplary embodiment, three epitaxial stacks sequentially stacked on the substrate 11 are shown. The epitaxial stacks are stacked on the front surface of the substrate 11 in the order of a third epitaxial stack 40, a second epitaxial stack 30, and a first epitaxial stack 20.

The substrate 11 may include a light transmitting insulating material. As used herein, "the substrate 11 has a light transmitting property" may refer that the substrate 11 is transparent to transmit the entire light, the substrate 11 is semi-transparent to transmit only light having a specific wavelength, or the substrate 11 is partially transparent to transmit only a portion of light having the specific wavelength.

Each epitaxial stack may emit light in a direction toward the rear surface of the substrate 11. In this case, light emitted from one epitaxial stack may travel in the direction toward the rear surface of the substrate 11 while passing through one or more epitaxial stacks located in the optical path.

The substrate 11 may be a growth substrate capable of growing an epitaxial stack directly disposed thereon, such as the third epitaxial stack 40. In this case, the substrate 11 may be a sapphire substrate and be integrally formed with the third epitaxial stack 40 in a non-separable body. However, the inventive concepts are not limited thereto, and in some exemplary embodiments, the substrate 11 may include various transparent insulating materials other than the sapphire substrate, as long as the substrate 11 may be provided with an epitaxial stack on one surface thereof and has light transmitting and insulating properties. For example, as the material for the substrate 11, a glass, a quartz, a silicon, an organic polymer, or an organic-inorganic composite material may be used. According to an exemplary embodiment, when the substrate 11 is a separate substrate, rather than a growth substrate, a line part may be further disposed on the substrate 11 to apply a light emitting signal and a common voltage to each of the epitaxial stacks. In this case, the substrate 11 may be provided as a printed circuit board or a composite substrate, which may be formed by forming the line part and/or a driving device on the glass, quartz, silicon, organic polymer, or organic-inorganic composite material.

As described above, epitaxial stacks may be disposed on the substrate 11, and the substrate 11 may be formed integrally with the third epitaxial stack 40 or may be formed separately as a separate component. However, in some exemplary embodiments, the substrate 11 may be removed from the epitaxial layer stacks. In particular, when the substrate 11 is used as a growth substrate, after the epitaxial stacks are formed on the substrate 11, the substrate 11 may be removed by a method, such as laser lift-off. In this case, the growth substrate is removed, and each epitaxial stack emits light in a direction toward the top surface of the substrate 11.

In the illustrated exemplary embodiment, the first epitaxial stack 20 emits a first light L1, the second epitaxial stack 30 emits a second light L2, and the third epitaxial stack 40 emits a third light L3. The first, second, and third lights L1, L2, and L3 may be the same or different from each other. According to an exemplary embodiment, the first, second, and third lights L1, L2, and L3 may be color lights in a visible light wavelength band. According to an exemplary embodiment, the first light L1 is red light, the second light L2 is blue light, and the third light L3 is green light.

According to an exemplary embodiment, the first, second, and third lights L1, L2, and L3 may have different wavelength bands from each other, which may be sequentially shortened. In particular, the first, second, and third lights L1, L2, and L3 may have a short wavelength band having an energy that gradually increases from the first light L1 to the third light L3. For example, the first light L1 may be a red light, the second light L2 may be a green light, and the third light L3 may be a blue light.

In some exemplary embodiments, the first, second, and third lights L1, L2, and L3 may have different wavelength bands from each other, which are sequentially lengthened, or may have different wavelength bands that are irregularly arranged regardless of the length of the wavelength.

In some exemplary embodiments, each of the first, second, and third lights L1, L2, and L3 may not have different wavelength bands, and at least two among the first, second, and third lights L1, L2, and L3 may have the same wavelength band.

An insulating layer 80 is disposed on side surfaces of the epitaxial stacks, e.g., on the side surfaces of the first, second, and third epitaxial stacks 20, 30, and 40. The insulating layer 80 may cover an upper surface of the uppermost epitaxial stack in addition to the side surfaces of the epitaxial stacks. In particular, the insulating layer 80 overlaps with the epitaxial stacks when viewed in a plan view. Accordingly, a fraction of light traveling in an upper direction may be reflected or absorbed by the insulating layer 80. More particularly, when the fraction of light is reflected by the insulating layer 80, the reflected light travels towards the substrate 11, and thus, a luminous efficiency towards the substrate 11 may be improved. The insulating layer 80 is not particularly limited as long as the insulating layer 80 may block light transmission by reflecting or absorbing light.

According to an exemplary embodiment, the side surface of each of the epitaxial stacks may be inclined with respect to one surface of the substrate 11. For example, an angle between the side surfaces of the first, second, and third epitaxial stacks 20, 30, and 40 and the one surface of the substrate 11 in a cross-sectional view may be greater than about 0 degrees and less than about 90 degrees. In this manner, the insulating layer 80 may be easily formed on the epitaxial stacks. In addition, according to an exemplary embodiment, each epitaxial stack may have a tapered shape at a predetermined angle, so that a light reflection effect by the insulating layer 80 may be increased.

In the light emitting structure according to an exemplary embodiment, the epitaxial stacks may be independently driven as signal lines that respectively apply light emitting signals to the epitaxial stacks are independently connected to the epitaxial stacks. Accordingly, various colors may be implemented depending whether light is emitted from each epitaxial stack. In addition, since the epitaxial stacks may emit light having different wavelengths while being overlapped with each other, the light emitting structure may be formed in a narrow area.

Figure 2:
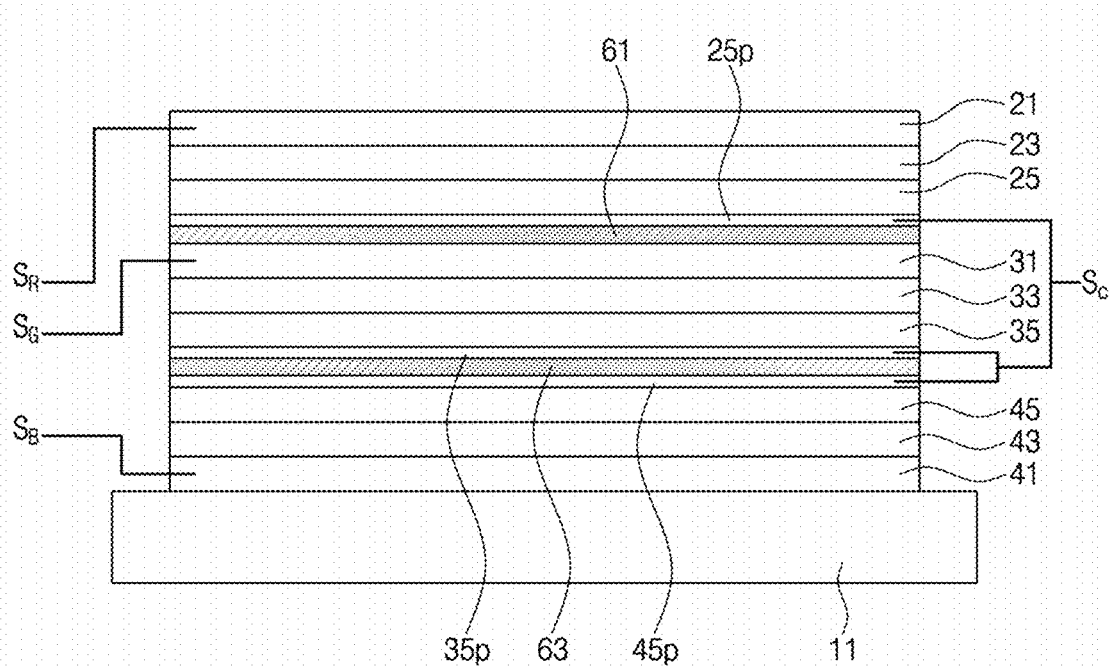
FIG. 2 is a schematic cross-sectional view of a light emitting device including a line part according to an exemplary embodiment.

FIG. 2 is a cross-sectional view of a light emitting structure including a line part according to an exemplary embodiment.

Referring to FIG. 2, in the light emitting structure according to the illustrated exemplary embodiment, the third epitaxial stack 40 is disposed on the substrate 11, the second epitaxial stack 30 is disposed on the third epitaxial stack 40 with a second adhesive layer 63 interposed therebetween, and the first epitaxial stack 20 is disposed on the second epitaxial stack 30 with a first adhesive layer 61 interposed therebetween.

The first and second adhesive layers 61 and 63 may include a non-conductive material that has a light transmitting property. For example, the first and second adhesive layers 61 and 63 may be an optically clear adhesive (OCA). The material for the first and second adhesive layers 61 and 63 is not particularly limited, as long as the first and second adhesive layers 61 and 63 are optically clear and may stably attach the adjacent epitaxial stacks.

The third epitaxial stack 40 includes an n-type semiconductor layer 41, an active layer 43, and a p-type semiconductor layer 45, which are sequentially stacked. The n-type semiconductor layer 41, the active layer 43, and the p-type semiconductor layer 45 of the third epitaxial stack 40 may include a semiconductor material that emits blue light. A third p-type contact electrode 45p is disposed on the p-type semiconductor layer 45 of the third epitaxial stack 40.

The n-type semiconductor layer 41, the active layer 43, and the p-type semiconductor layer 45 may include a semiconductor material that emits blue light. As the semiconductor material that emits blue light, gallium nitride (GaN), indium gallium nitride (InGaN), and zinc selenide (ZnSe) may be used, without being limited thereto.

The second epitaxial stack 30 includes a p-type semiconductor layer 35, an active layer 33, and an n-type semiconductor layer 31, which are sequentially stacked. The p-type semiconductor layer 35, the active layer 33, and the n-type semiconductor layer 31 of the second epitaxial stack 30 may include a semiconductor material that emits green light. A second p-type contact electrode 35p is disposed under the p-type semiconductor layer 35 of the second epitaxial stack 30.

The p-type semiconductor layer 35, the active layer 33, and the n-type semiconductor layer 31 may include a semiconductor material that emits green light. As the semiconductor material that emits green light, indium gallium nitride (InGaN), gallium nitride (GaN), gallium phosphide (GaP), aluminum gallium indium phosphide (AlGaInP), and aluminum gallium phosphide (AlGaP) may be used, without being limited thereto.

The first epitaxial stack 20 includes a p-type semiconductor layer 25, an active layer 23, and an n-type semiconductor layer 21, which are sequentially stacked. The p-type semiconductor layer 25, the active layer 23, and the n-type semiconductor layer 21 of the first epitaxial stack 20 may include a semiconductor material that emits red light. As the semiconductor material that emits red light, aluminum gallium arsenide (AlGaAs), gallium arsenide phosphide (GaAsP), aluminum gallium indium phosphide (AlGaInP), and gallium phosphide (GaP) may be used, without being limited thereto.

A first p-type contact electrode 25p is disposed under the p-type semiconductor layer 25 of the first epitaxial stack 20.

A first n-type contact electrode may be disposed on the n-type semiconductor layer 21 of the first epitaxial stack 20. According to an exemplary embodiment, the first n-type contact electrode may include an Au—Te alloy or an Au—Ge alloy, without being limited thereto. The first n-type contact electrode may have a single-layer structure or a multi-layer structure of a metal material. For example, the first n-type contact electrode may include metal, such as Al, Au, Ag, Ti, Sn, Ni, Cr, W, Cu, or an alloy thereof.

When the first n-type contact electrode may includes metal having high reflectance, a light emission efficiency of light emitted from the first epitaxial stack 20 in a downward direction may be improved due to the first n-type contact electrode including metal having high reflectance.

According to an exemplary embodiment, each of the n-type semiconductor layers 21, 31, and 41 and each of the p-type semiconductor layers 25, 35, and 45 of the first, second, and third epitaxial stacks 20, 30, and 40 may have a single-layer structure, however, in some exemplary embodiments, these layers may have a multi-layer structure and include a superlattice layer. The active layers 23, 33, and 43 of the first, second, and third epitaxial stacks 20, 30, and 40 may have a single quantum well structure or a multiple quantum well structure.

According to an exemplary embodiment, the first, second, and third p-type contact electrodes 25p, 35p, and 45p may include a transparent conductive material to transmit light. For example, each of the first, second, and third p-type contact electrodes 25p, 35p, and 45p may include a transparent conductive oxide (TCO). The transparent conductive oxide may include tin oxide (SnO), indium oxide (InO$_2$), zinc oxide (ZnO), indium tin oxide (ITO), and indium tin zinc oxide (ITZO), for example.

According to an exemplary embodiment, the first, second, and third p-type contact electrodes 25p, 35p, and 45p may be connected to a common line. The common line may be a line, to which the common voltage is applied. In addition, light emitting signal lines may be respectively connected to the n-type semiconductor layers 21, 31, and 41 of the first, second, and third epitaxial stacks 20, 30, and 40. In this case, the light emitting signal line is connected to the n-type semiconductor layer 21 of the first epitaxial stack 20 through the first n-type contact electrode. In the illustrated exemplary embodiment, a common voltage Sc is applied to the first, second, and third p-type contact electrodes 25p, 35p, and 45p through the common line, and the light emitting signal is applied to the n-type semiconductor layers 21, 31, and 41 of the first, second, and third epitaxial stacks 20, 30, and 40 through the light emitting signal lines. Accordingly, the light emission of the first, second, and third epitaxial stacks 20, 30, and 40 may be individually controlled. In this case, the light emitting signal includes first, second, and third light emitting signals $S_R$, $S_G$, and $S_B$ respectively corresponding to the first, second, and third epitaxial stacks 20, 30, and 40. In the illustrated exemplary embodiment, the first, second, and third light emitting signals $S_R$, $S_G$, and $S_B$ may be signals respectively corresponding to the light emissions of the red light, the green light, and the blue light.

According to the illustrated exemplary embodiment, the first, second, and third epitaxial stacks 20, 30, and 40 may be driven in response to the light emitting signal applied thereto. In particular, the first epitaxial stack 20 may be driven in response to the first light emitting signal $S_R$, the second epitaxial stack 30 may be driven in response to the second light emitting signal $S_G$, and the third epitaxial stack 40 may be driven in response to the third light emitting signal $S_B$. Alternatively, the first epitaxial stack 20 may be driven according to the first emission signal $S_R$, the second epitaxial stack 30 may be driven according to the second emission signal $S_B$, and the third epitaxial stack 40 may be driven according to the third light emission signal $S_G$. In this case, the first, second, and third light emitting signals $S_R$, $S_G$, and $S_B$ may be independently applied to the first, second, and third epitaxial stacks 20, 30, and 40, and thus, the first, second, and third epitaxial stacks 20, 30, and 40 may be independently driven. The light emitting structure may provide light having various colors at various amounts by a combination of the first, second, and third lights emitted from the first, second, and third epitaxial stacks 20, 30, and 40 towards the substrate 11.

In the illustrated exemplary embodiment, the common voltage is described as being applied to the p-type semiconductor layers 25, 35, and 45 of the first, second, and third epitaxial stacks 20, 30, and 40, and the light emitting signal is applied to the n-type semiconductor layers 21, 31, and 41 of the first, second, and third epitaxial stacks 20, 30, and 40. However, the inventive concepts are not limited thereto. In some exemplary embodiments, the common voltage may be applied to the n-type semiconductor layers 21, 31, and 41 of the first, second, and third epitaxial stacks 20, 30, and 40, and the light emitting signal may be applied to the p-type semiconductor layers 25, 35, and 45 of the first, second, and third epitaxial stacks 20, 30, and 40.

The light emitting structure according to the illustrated exemplary embodiment may display various colors through a combination of light having different colors emitted from an overlapping area, rather than from areas that are spaced apart from each other on a plane. As such, the light emitting device may be downsized and integrated. In general, conventional light emitting devices that emit light having different colors, e.g., red, green, and blue lights, are spaced apart from each other on a plane to implement a full color display. Accordingly, an area occupied by the conventional light emitting devices is relatively large since light emitting devices are disposed to be spaced apart from each other on the plane. However, according to an exemplary embodiment, portions of the light emitting devices that emit light having different colors are disposed in the same area while being overlapped with each other to form the light emitting structure, and thus, the full color display may be implemented through an area that is significantly smaller than that of the conventional art. In this manner, a high-resolution display device may be manufactured in a small area.

In addition, when the epitaxial stacks that emit light having the same wavelength band are stacked one over another in the light emitting structure having the above-described structure, it is possible to manufacture a light emitting apparatus, in which an intensity of light is controlled in various ways.

Further, even when a conventional light emitting apparatus were manufactured in a stacked manner, the conventional light emitting apparatus is manufactured by individually forming a contact part in each light emitting device, e.g., by forming light emitting elements individually and separately, and connecting the light emitting device to each other using a wiring. In this case, the structure of the light emitting apparatus becomes complex, and the manufacturing complexity may be increased. However, the light emitting structure according to an exemplary embodiment may be manufactured by sequentially stacking plural epitaxial stacks on one substrate 11, forming the contact part in the epitaxial stacks through a minimal process, and connecting the line part to the epitaxial stacks. In addition, since one light emitting structure is mounted rather than plural light emitting devices, the manufacturing method of the display device according to an exemplary embodiment may be significantly simplified as compared with the conventional display device manufacturing method, which separately manufactures the light emitting devices of individual colors and mounts the light emitting devices individually.

In some exemplary embodiments, the light emitting device may further include various components to provide light with high purity and high efficiency. For example, the light emitting device according to an exemplary embodiment may include a wavelength pass filter to prevent light having a relatively short wavelength from traveling to the epitaxial stack that emits light having a relatively long wavelength.

The light emitting device may further include various components to provide high efficiency uniform light. In some exemplary embodiments, the light emitting device may include various concave-convex portions on a light emitting surface. For example, the concave-convex portions may be formed on the n-type semiconductor layer and/or p-type semiconductor layer of at least one of the first, second, and third epitaxial stacks 20, 30, and 40.

The concave-convex portion of each epitaxial stack may be selectively formed. For example, the concave-convex portion may be disposed on the first epitaxial stack 20, the concave-convex portion may be disposed on the first and third epitaxial stacks 20 and 40, or the concave-convex portion may be disposed on the first, second, and third epitaxial stacks 20, 30, and 40. The concave-convex portion of each epitaxial stack may be disposed on semiconductor layers that function as the light emitting surfaces of the first, second, and third epitaxial stacks 20, 30, and 40.

The concave-convex portion may improve light emitting efficiency. The concavo-convex portion may be provided in various shapes, such as substantially a polygonal pyramid, a hemisphere, or a surface having a roughness, on which concavo-convex portions are randomly arranged. The concave-convex portion may be textured through various etching processes, or may be formed using a patterned sapphire substrate.

The first, second, and third lights emitted from the first, second, and third epitaxial stacks 20, 30, and 40 may have a difference in intensity, and the intensity difference may cause a difference in visibility. According to an exemplary embodiment, the light emitting efficiency may be improved by the concave-convex portion that is selectively formed on the light emitting surfaces of the first, second, and third epitaxial stacks 20, 30, and 40. In this manner, the difference in visibility between the first, second, and third lights may be reduced. Since light corresponding to the red and/or blue colors has a visibility lower than that of light corresponding to the green color, the difference in visibility may be reduced by texturing the first epitaxial stack 20 and/or the third epitaxial stack 40. In particular, the red color light has a relatively smaller intensity because the red color light is provided from an uppermost portion of the light emitting device. In this case, when the concave-convex portion is formed on the upper surface of the first epitaxial stack 20, the light efficiency may be improved.

The light emitting device having the above-described structure may correspond to a light emitting device capable of displaying various colors, and may be employed in a display device as a pixel. In the following descriptions, a display device that employs the light emitting device having the above-described structure as its component will be described.

Figure 3:
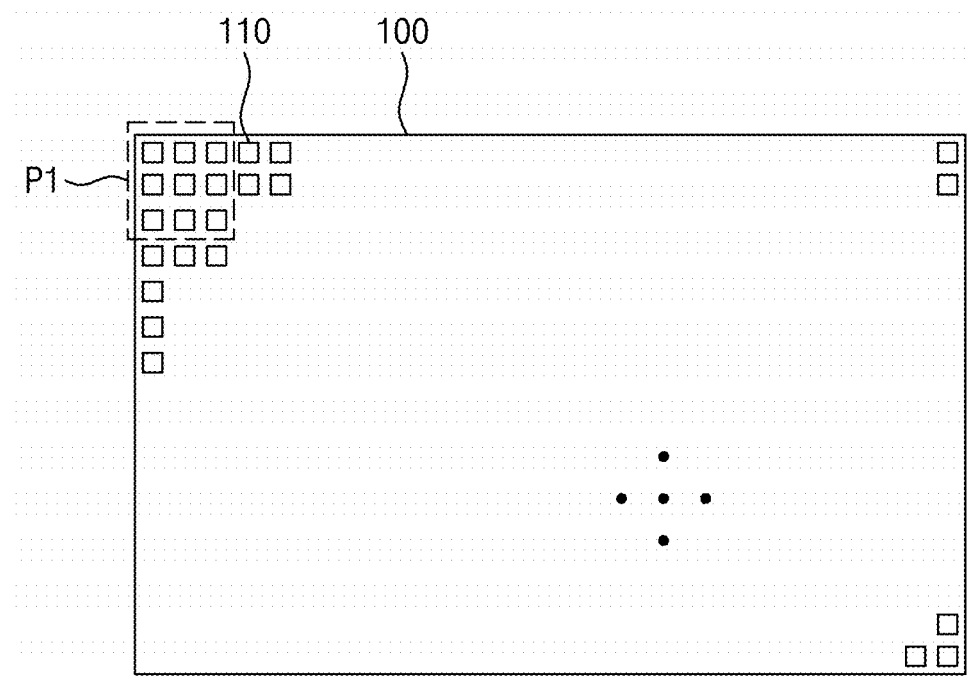
FIG. 3 is a plan view of a display device according to an exemplary embodiment.
Figure 4:
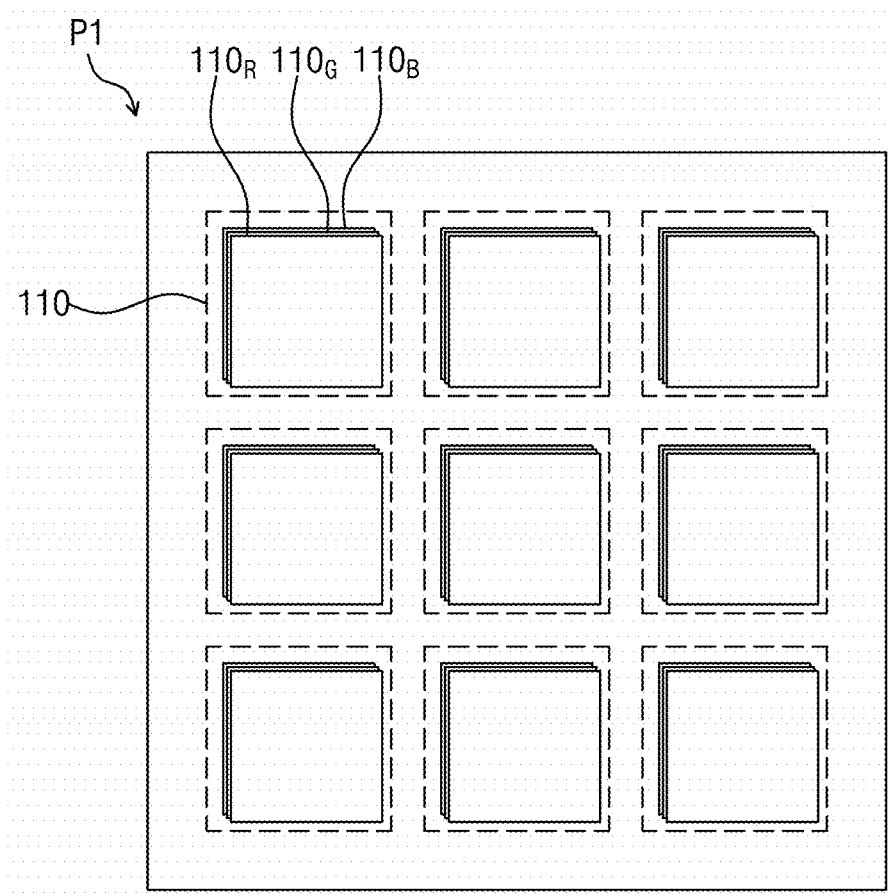
FIG. 4 is an enlarged plan view of a portion P1 of FIG. 3.

FIG. 3 is a plan view of a display device according to an exemplary embodiment, and FIG. 4 is an enlarged plan view of a portion P1 of FIG. 3.

Referring to FIGS. 3 and 4, the display device 100 according to an exemplary embodiment may display arbitrary visual information, such as a text, a video, a photograph, and a 2- or 3-dimensional image.

The display device 100 may have various shapes, such as a closed polygonal shape with straight sides, like substantially a rectangular shape, a circular or oval shape with a curved side, and a semi-circular or semi-oval shape with a straight side and a curved side. In the illustrated exemplary embodiment, the display device is exemplarily shown as having a rectangular shape.

The display device 100 includes a plurality of pixels 110 that display an image. Each pixel 110 may be a minimum unit that displays the image. Each pixel 110 may include the light emitting device having the above-described structure, and may emit a white light and/or a color light.

According to an exemplary embodiment, each pixel 110 includes a first pixel $110_R$ emitting the red color light, a second pixel $110_G$ emitting the green color light, and a third pixel $110_B$ emitting the blue color light. The first, second, and third pixels $110_R$, $110_G$, and $110_B$ may respectively correspond to the first, second, and third epitaxial stacks 20, 30, and 40 of the light emitting device described above. However, the inventive concepts are not limited thereto. For example, in some exemplary embodiments, at least two pixels may emit the same color light, or the first, second, and third pixels may emit different color lights from each other, such as yellow, magenta, and cyan, which are different from the above-mentioned colors.

The pixels 110 may be arranged in a matrix form. As used herein, the expression that "the pixels 110 are arranged in the matrix form" may refer that the pixels 110 are arranged exactly in line along rows or columns, as well as the pixels 110 are arranged along the rows or columns as a whole while detailed locations of the pixels 110 are being changed, e.g., a zigzag form.

Figure 5:
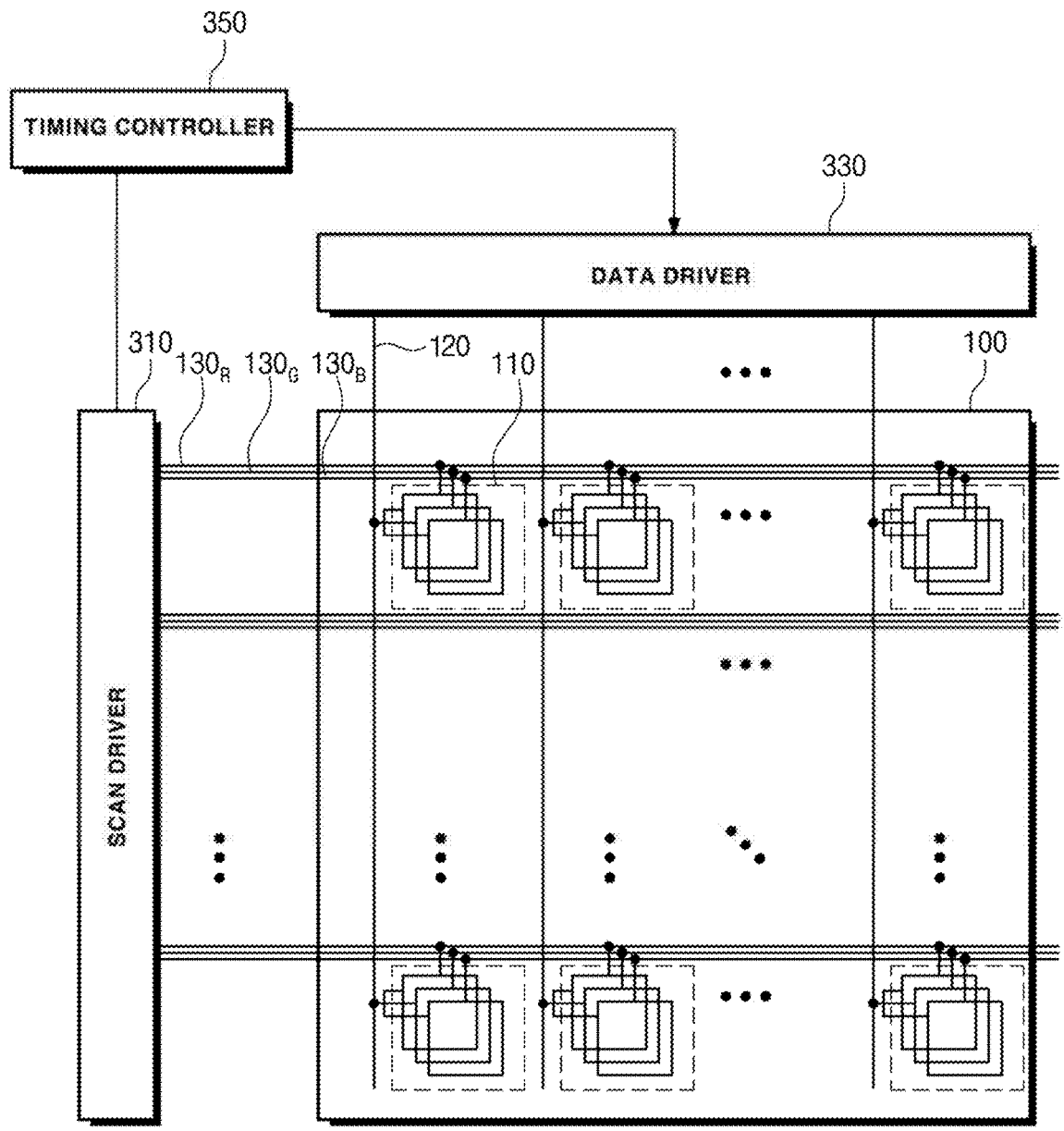
FIG. 5 is a block diagram of a display device according to an exemplary embodiment.

FIG. 5 is a block diagram of a display device according to an exemplary embodiment.

Referring to FIG. 5, the display device 100 according to an exemplary embodiment includes a timing controller 350, a scan driver 310, a data driver 330, a line part, and the pixels. Each of the pixels is individually connected to the scan driver 310 and the data driver 330 through the line part.

The timing controller 350 may receive various control signals and image data for driving the display device 100 from an external source (e.g., a system that transmits the image data). The timing controller 350 may rearrange the received image data and apply the rearranged image data to the data driver 330. In addition, the timing controller 350 may generate scan control signals and data control signals for driving the scan driver 310 and the data driver 330, and apply the generated scan control signals and the data control signals to the scan driver 310 and the data driver 330, respectively.

The scan driver 310 may receive the scan control signals from the timing controller 350 and generate scan signals in response to the scan control signals.

The data driver 330 may receive the data control signals and the image data from the timing controller 350 and generate data signals in response to the data control signals.

The line part includes a plurality of signal lines. In particular, the line part includes scan lines 130 that connect the scan driver 310 and the pixels, and data lines 120 that connect the data driver 330 and the pixels. The scan lines 130 may be connected to each of the pixels, and the scan lines corresponding to each of the pixels are illustrated as first, second, and third scan lines 130R, 130G, and 130B (hereinafter, collectively be referred to as the scan line 130).

The line part may further include lines that connect the timing controller 350 and the scan driver 310, the timing controller 350 and the data driver 330, or other components to each other to transmit signals.

The scan lines 130 apply the scan signals generated by the scan driver 310 to the pixels. The data signals generated by the data driver 330 are applied to the data lines 120.

The pixels are connected to the scan lines 130 and the data lines 120. The pixels selectively emit light in response to the data signals provided from the data lines 120 when the scan signals from the scan lines 130 are applied thereto. For example, each of the pixels emits light having a brightness that corresponds to the data signal applied thereto during each frame period. The pixels applied with the data signals that correspond to a black brightness may not emit light during a corresponding frame period, and thus, a black color may be displayed.

The pixels may be driven in a passive or active matrix manner. When the display device is driven in the active matrix manner, the display device 100 may be driven by being further supplied with first and second pixel power sources in addition to the scan signals and the data signals.

Figure 6:
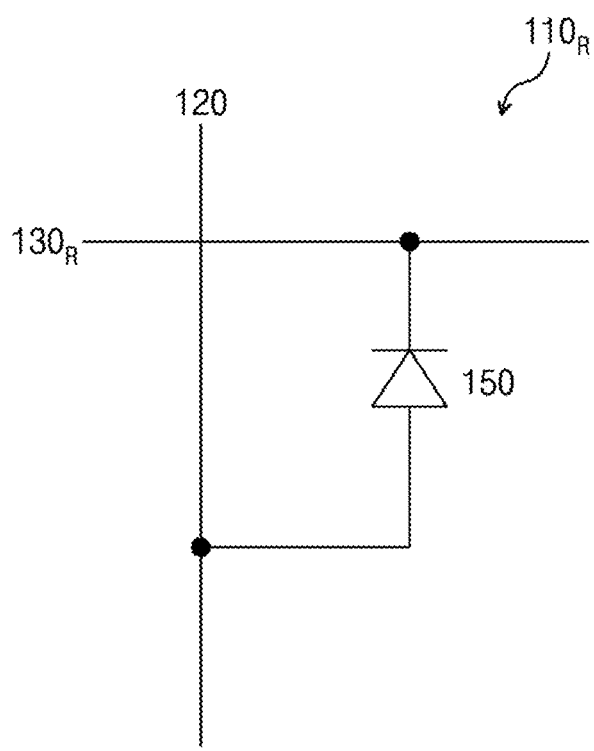
FIG. 6 is a circuit diagram of one pixel for a passive matrix type display device according to an exemplary embodiment.

FIG. 6 is a circuit diagram of one pixel for a passive matrix type display device. The pixel may be one of the pixels, e.g., the red pixel, the green pixel, and the blue pixel, and the first pixel $110_R$ is exemplarily illustrated in FIG. 6. The second and third pixels may be driven in substantially the same manner as the first pixel, and thus, repeated descriptions regarding circuit diagrams of the second and third pixels will be omitted.

Referring to FIG. 6, the first pixel $110_R$ includes a light emitting device 150 connected between the scan line 130 and the data line 120. The light emitting device 150 corresponds to the first epitaxial stack 20. When a voltage equal to or greater than a threshold voltage is applied to between the p-type semiconductor layer and the n-type semiconductor layer, the first epitaxial stack 20 emits light with a brightness corresponding to a level of the voltage applied thereto. In particular, the light emission of the first pixel $110_R$ may be controlled by controlling a voltage of the scan signal applied to the first scan line $130_R$ and/or a voltage of the data signal applied to the data line 120.

Figure 7:
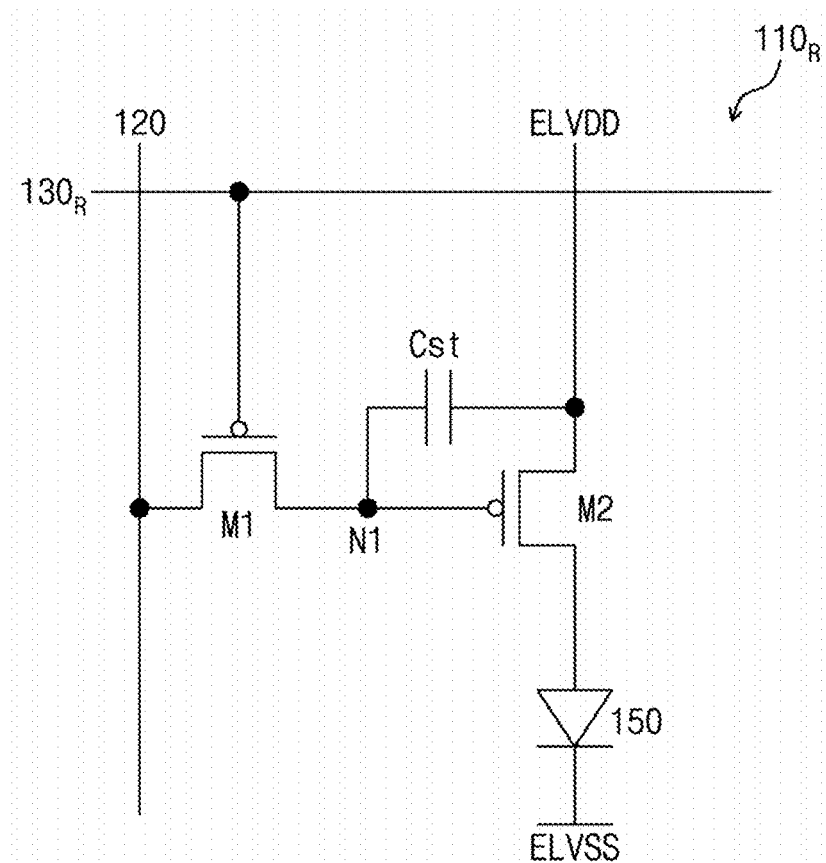
FIG. 7 is a circuit diagram of one pixel for an active matrix type display device according to an exemplary embodiment.

FIG. 7 is a circuit diagram of the first pixel 110R for an active matrix type display device.

When the display device is the active matrix type display device, the first pixel $110_R$ may be driven by being further supplied with first and second pixel power sources ELVDD and ELVSS, in addition to the scan signals and the data signals.

Referring to FIG. 7, the first pixel $110_R$ includes a light emitting device 150 and a transistor part connected to the light emitting device 150.

The light emitting device 150 may correspond to the first epitaxial stack 20, the p-type semiconductor layer of the light emitting device 150 may be connected to the first pixel power source ELVDD via the transistor part, and the n-type semiconductor layer of the light emitting device 150 may be connected to the second pixel power source ELVSS. The first pixel power source ELVDD and the second pixel power source ELVSS may have different electric potentials from each other. For example, the second pixel power source ELVSS may have the electric potential lower than the electric potential of the first pixel power source ELVDD by the threshold voltage of the light emitting device. Each of the light emitting devices emits light with a brightness corresponding to a driving current controlled by the transistor part.

According to the illustrated exemplary embodiment, the transistor part includes first and second transistors M1 and M2 and a storage capacitor Cst, without being limited thereto.

The first transistor M1 (e.g., switching transistor) includes a source electrode connected to the data line 120, a drain electrode connected to a first node N1, and a gate electrode connected to the first scan line 130$_R$. The first transistor M1 is turned on to electrically connect the data line 120 and the first node N1 when the scan signal having the voltage sufficient to turn on the first transistor M1 is provided through the first scan line 130$_R$. In this case, the data signal of a corresponding frame is applied to the data line 120, and thus, the data signal is applied to the first node N1. The storage capacitor Cst is charged with the data signal applied to the first node N1.

The second transistor M2 (e.g., driving transistor) includes a source electrode connected to the first pixel power source ELVDD, a drain electrode connected to the n-type semiconductor layer of the light emitting device 150, and a gate electrode connected to the first node N1. The second transistor M2 controls an amount of the driving current supplied to the light emitting device 150 in response to the voltage of the first node N1.

One electrode of the storage capacitor Cst is connected to the first pixel power source ELVDD, and the other electrode of the storage capacitor Cst is connected to the first node N1. The storage capacitor Cst is charged with the voltage corresponding to the data signal applied to the first node N1 and maintains the charged voltage until a data signal of a next frame is provided.

FIG. 7 exemplarily shows the transistor part including two transistors. However, the inventive concepts are not limited to a particular number of the transistors included in the transistor part, and in some exemplary embodiments, the configuration of the transistor part may be changed in various ways. For example, the transistor part may include more transistors and more capacitors. In addition, in the illustrated exemplary embodiment, configurations of the first and second transistors, the storage capacitor, and the lines are not shown in detail, however, the first and second transistors, the storage capacitor, and the lines may be changed in various ways as known in the art.

The structure of the above-described pixel may be changed in various ways, which will be described in more detail below. Hereinafter, the pixel will be exemplarily described with reference a passive matrix-type pixel.

Figure 8A:
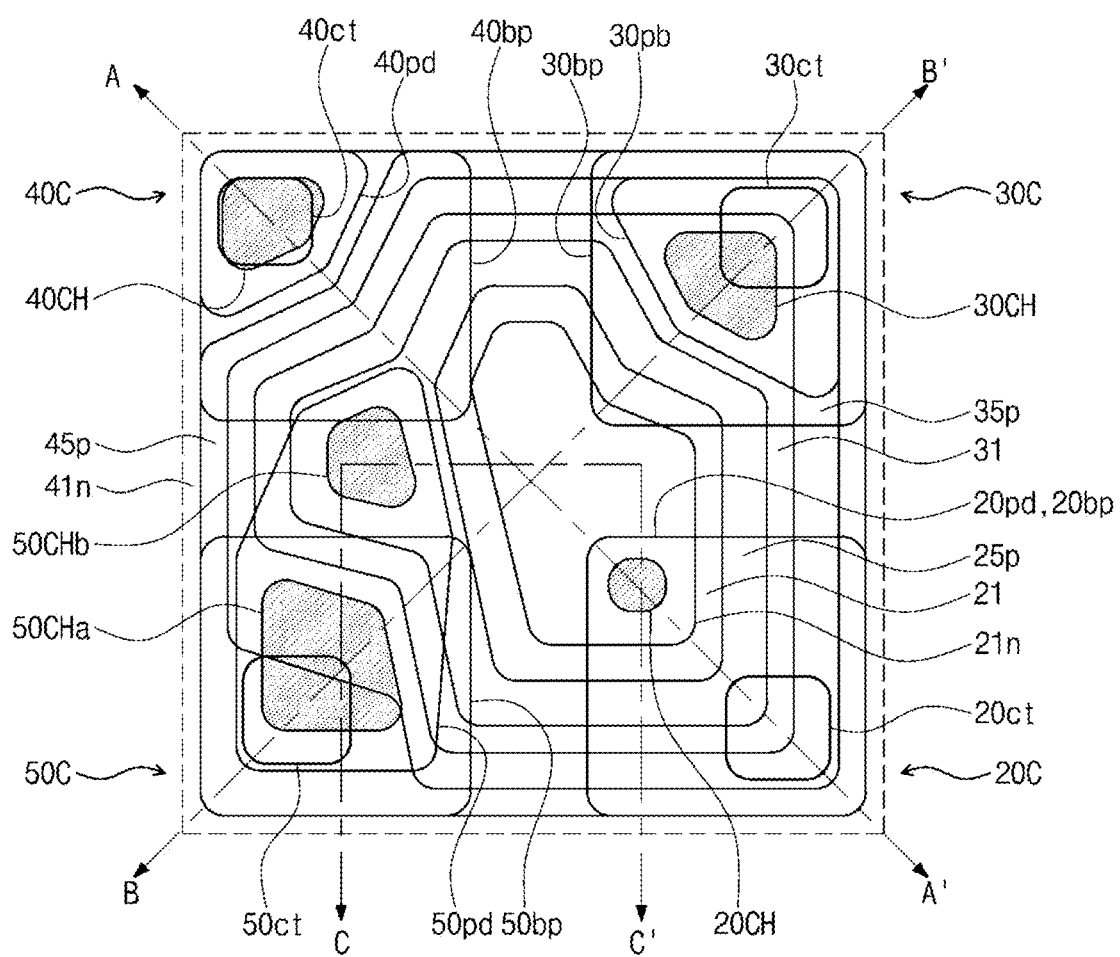
FIG. 8A is a plan view of a pixel according to an exemplary embodiment.
Figure 8B:
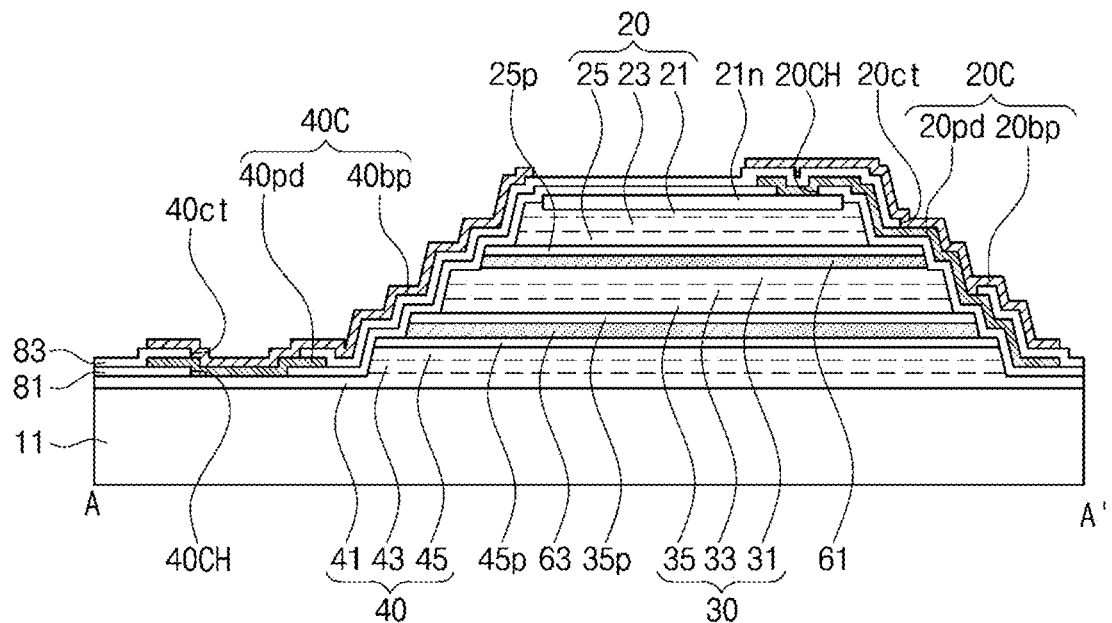
FIGS. 8B, 8C, and 8D are cross-sectional views respectively taken along lines A-A', B-B', and C-C' of FIG. 8A.
Figure 8C:
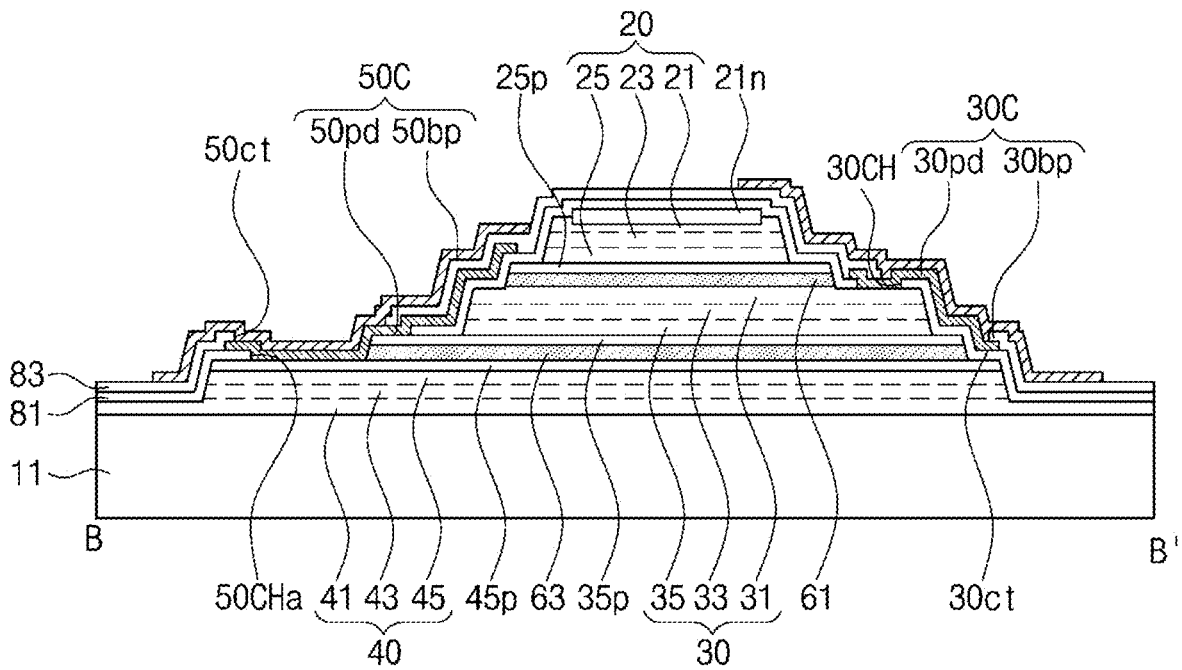
Figure 8D:
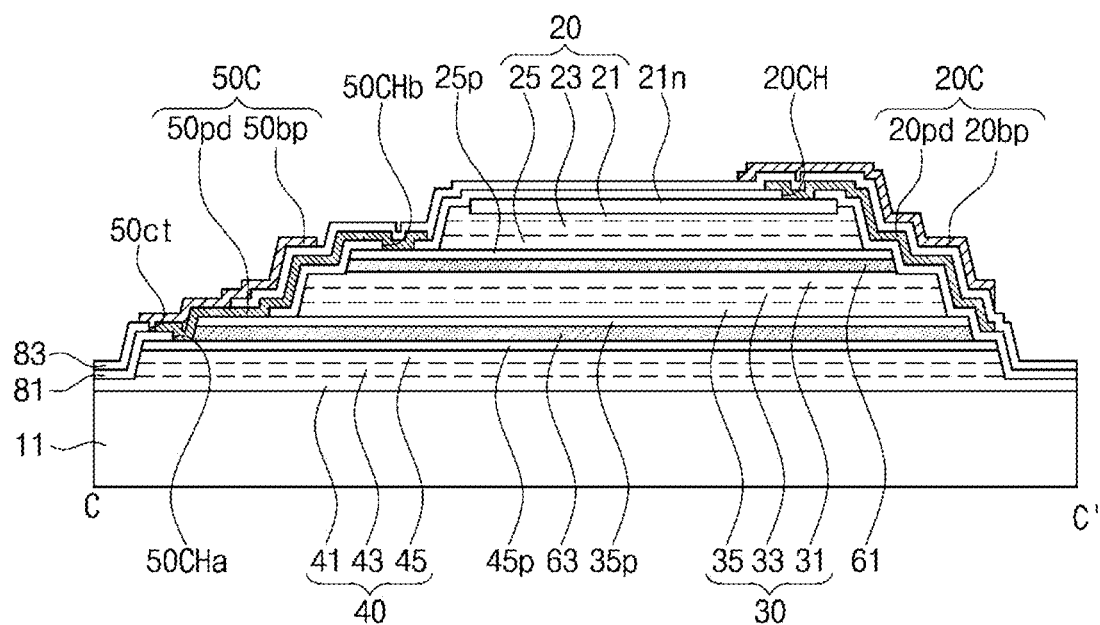

FIG. 8A is a plan view of a pixel according to an exemplary embodiment, and FIGS. 8B, 8C, and 8D are cross-sectional views respectively taken along lines A-A', B-B', and C-C' of FIG. 8A.

Referring to FIGS. 8A, 8B, and 8C, the pixel according to an exemplary embodiment includes a light emitting area, in which the plural epitaxial stacks are stacked when viewed in a plan view. The stacked structure of the pixel may be changed depending on to which polarity type semiconductor layers of the first, second, and third epitaxial stacks 20, 30, and 40 the common voltage is applied. Hereinafter, the common voltage will exemplarily be described as being applied to the p-type semiconductor layer of the first, second, and third epitaxial stacks 20, 30, and 40.

The epitaxial stacks include the third epitaxial stack 40, the second epitaxial stack 30, and the first epitaxial stack 20 stacked on the substrate 11.

Each of the first, second, and third epitaxial stacks 20, 30, and 40 includes the p-type semiconductor layer, the active layer disposed on the p-type semiconductor layer, and the n-type semiconductor layer disposed on the active layer. In particular, the first epitaxial stack 20 includes the first p-type semiconductor layer 25, the first active layer 23 disposed on the first p-type semiconductor layer 25, and the first n-type semiconductor layer 21 disposed on the first active layer 23. The second epitaxial stack 30 includes the second p-type semiconductor layer 35, the second active layer 33 disposed on the second p-type semiconductor layer 35, and the second n-type semiconductor layer 31 disposed on the second active layer 33. The third epitaxial stack 40 includes the third n-type semiconductor layer 41, the third active layer 43 disposed on the third n-type semiconductor layer 41, and the third p-type semiconductor layer 45 disposed on the third active layer 43.

The third p-type contact electrode 45p directly making contact with the third p-type semiconductor layer 45, the second adhesive layer 63, and the second p-type contact electrode 35p are sequentially disposed on the third p-type semiconductor layer 45 of the third epitaxial stack 40. The second p-type contact electrode 35p directly makes contact with the second p-type semiconductor layer 35 of the second epitaxial stack 30.

The first adhesive layer 61 and the first p-type contact electrode 25p are sequentially disposed on the second n-type semiconductor layer 31 of the second epitaxial stack 30. The first p-type contact electrode 25p directly makes contact with the first p-type semiconductor layer 25 of the first epitaxial stack 20.

The first n-type contact electrode 21n is disposed on the first n-type semiconductor layer 21 of the first epitaxial stack 20. The first n-type semiconductor layer 21 has a structure, in which a portion of an upper surface thereof is recessed, and the first n-type contact electrode 21n may be disposed in the recessed portion.

A single- or multi-layer insulating layer is disposed on the substrate 11, on which the first, second, and third epitaxial stacks 20, 30, and 40 are stacked. In the illustrated exemplary embodiment, a first insulating layer 81 and a second insulating layer 83 are disposed on portions of the side surfaces and the upper surface of the first, second, and third epitaxial stacks 20, 30, and 40 to cover the stacked structure of the first, second, and third epitaxial stacks 20, 30, and 40. The first and/or second insulating layers 81 and 83 may include various organic/inorganic insulating materials, and the material and shape of the first and/or second insulating layers 81 and 83 are not particularly limited. For example, according to an exemplary embodiment, the first and/or second insulating layers 81 and 83 may include a distributed Bragg reflector (DBR). According to another exemplary embodiment, the first and/or second insulating layers 81 and 83 may include a black-colored organic polymer layer. In some exemplary embodiment, a metal reflection layer that is in a floating state may be further disposed on the first and/or second insulating layers 81 and 83. According to an exemplary embodiment, the insulating layer may be formed by depositing two or more insulating layers having different refractive indices from each other.

The contact part is disposed in the pixel to connect the line part to the first, second, and third epitaxial stacks 20, 30, and 40. The contact part includes a first contact part 20C to apply the light emitting signal to the first epitaxial stack 20, a second contact part 30C to apply the light emitting signal to the second epitaxial stack 30, a third contact part 40C to apply the light emitting signal to the third epitaxial stack 40, and a fourth contact part 50C to apply the common voltage to the first, second, and third epitaxial stacks 20, 30, and 40.

In the illustrated exemplary embodiment, the first, second, third, and fourth contact parts 20C, 30C, 40C, and 50C may be disposed at various positions when viewed in a plan view. For example, when the light emitting device has substantially a quadrangular shape, the first, second, third, and fourth contact parts 20C, 30C, 40C, and 50C may be disposed in areas respectively corresponding to corners of the quadrangular shape. In this case, at least a portion of the contact part may overlap with the light emitting area. However, the positions of the first, second, third, and fourth contact parts 20C, 30C, 40C, and 50C are not limited thereto, and may be changed in various ways depending on the shape of the light emitting device.

The first, second, third, and fourth contact parts 20C, 30C, 40C, and 50C may include first, second, third, and fourth pads 20pd, 30pd, 40pd, and 50pd, respectively, and first, second, third, and fourth bump electrodes 20bp, 30bp, 40bp, and 50bp, respectively.

The first, second, third, and fourth pads 20pd, 30pd, 40pd, and 50pd are spaced apart from and insulated from each other.

The first, second, third, and fourth bump electrodes 20bp, 30bp, 40bp, and 50bp are spaced apart from and insulated from each other. The first, second, third, and fourth bump electrodes 20bp, 30bp, 40bp, and 50bp are disposed to overlap at least a portion of the first, second, and third epitaxial stacks 20, 30, and 40, more particularly, the light emitting area. Each of the first, second, third, and fourth bump electrodes 20bp, 30bp, 40bp, and 50bp may be formed over edges of the first, second, and third epitaxial stacks 20, 30, and 40, and thus, may cover the side surfaces of the active layers 23, 33, and 43 of the first, second, and third epitaxial stacks 20, 30, and 40. Since the first, second, third, and fourth bump electrodes 20bp, 30bp, 40bp, and 50bp cover the side surfaces of the first, second, and third epitaxial stacks 20, 30, and 40, heat generated from the first, second, and third epitaxial stacks 20, 30, and 40 may be easily discharged through the first, second, third, and fourth bump electrodes 20bp, 30bp, 40bp, and 50bp. In this manner, deterioration of the first, second, and third epitaxial stacks 20, 30, and 40 from each may be reduced due to the heat-discharge effect by the first, second, third, and fourth bump electrodes 20bp, 30bp, 40bp, and 50bp.

The first contact part 20C includes the first pad 20pd and the first bump electrode 20bp electrically connected to the first pad 20pd. The first pad 20pd is disposed on the first n-type contact electrode 21n of the first epitaxial stack 20 and connected to the first n-type contact electrode 21n through a first contact hole 20CH defined through the first insulating layer 81. At least a portion of the first bump electrode 20bp overlaps with the first pad 20pd. The first bump electrode 20bp is connected to the first pad 20pd through a first through hole 20ct with the second insulating layer 83 interposed therebetween in an overlapping area between the first bump electrode 20bp and the first pad 20pd. In this case, the first pad 20pd and the first bump electrode 20bp have substantially the same shape as each other and may overlap with each other. However, the shape of the first pad 20pd and the first bump electrode 20bp are not limited thereto, and the first pad 20pd and the first bump electrode 20bp may have different shapes and sizes from each other in other exemplary embodiments.

The second contact part 30C includes the second pad 30pd and the second bump electrode 30bp electrically connected to the second pad 30pd. The second pad 30pd is disposed on the second n-type semiconductor layer 31 of the second epitaxial stack 30 and connected to the second n-type semiconductor layer 31 through a second contact hole 30CH defined through the first insulating layer 81. At least a portion of the second bump electrode 30bp overlaps with the second pad 30pd. The second bump electrode 30bp is connected to the second pad 30pd through a second through hole 30ct with the second insulating layer 83 interposed therebetween in an overlapping area between the second bump electrode 30bp and the second pad 30pd.

The third contact part 40C includes the third pad 40pd and the third bump electrode 40bp electrically connected to the third pad 40pd. The third pad 40pd is disposed on the third n-type semiconductor layer 41 of the third epitaxial stack 40 and connected to the third n-type semiconductor layer 41 through a third contact hole 40CH defined through the first insulating layer 81. At least a portion of the third bump electrode 40bp overlaps with the third pad 40pd. The third bump electrode 40bp is connected to the third pad 40pd through a third through hole 40ct with the second insulating layer 83 interposed therebetween in an overlapping area between the third bump electrode 40bp and the third pad 40pd.

The fourth contact part 50C includes the fourth pad 50pd and the fourth bump electrode 50bp electrically connected to the fourth pad 50pd. The fourth pad 50pd is connected to the first, second, and third p-type semiconductor layers 25, 35, and 45 of the first, second, and third epitaxial stacks 20, 30, and 40 through a first sub-contact hole 50CHa and a second sub-contact hole 50CHb defined on first insulating layer 81. In particular, the fourth pad 50pd is connected to the first p-type contact electrode 25p through the second sub-contact hole 50CHb defined above the first p-type contact electrode 25p, and substantially connected to the second and third p-type contact electrodes 35p and 45p through the first sub-contact hole 50CHa defined above the second and third p-type contact electrodes 35p and 45p. In this case, since the fourth pad 50pd may be connected to the second and third p-type contact electrodes 35p and 45p through one first sub-contact hole 50CHa without respectively forming contact holes with respect to the second and third p-type contact electrodes 35p and 45p, a manufacturing process of the light emitting device may be simplified, and an area occupied by the contact holes in the light emitting device may be reduced. At least a portion of the fourth bump electrode 50bp overlaps with the fourth pad 50pd. The fourth bump electrode 50bp is connected to the fourth pad 50pd through a fourth through hole 50ct with the second insulating layer 83 interposed therebetween in an overlapping area between the fourth bump electrode 50bp and the fourth pad 50pd.

In the illustrated exemplary embodiment, the first, second, third, and fourth bump electrodes 20bp, 30bp, 40bp, and 50bp may have substantially the same shape and area when viewed in a plan view, however, the inventive concept are not limited thereto. In some exemplary embodiments, the first, second, third, and fourth bump electrodes 20bp, 30bp, 40bp, and 50bp may have various shapes and areas.

According to an exemplary embodiment, the line part (refer to FIG. 5) corresponding to the first, second, third, and fourth contact parts 20C, 30C, 40C, and 50C and electrically connected to each of the first, second, third, and fourth bump electrodes 20bp, 30bp, 40bp, and 50bp and/or the driving device, such as the thin film transistor connected to the line part, may be further disposed on the substrate 11.

For example, first, second, and third light emitting signal lines that respectively apply the light emitting signals to the first, second, and third epitaxial stacks 20, 30, and 40, and the common line that applies the common voltage to each of the first, second, and third epitaxial stacks 20, 30, and 40 may be connected to the first, second, and third epitaxial stacks 20, 30, and 40. According to an exemplary embodiment, the first, second, and third light emitting signal lines may correspond to the first, second, and third scan lines, respectively, and the common line may correspond to the data line.

The pixel having the above-described structure may be manufactured by sequentially stacking and patterning the third epitaxial stack, the second epitaxial stack, and the first epitaxial stack on the substrate, which will be described in more detail below.

FIGS. 9A, 10A, 11A, 12A, 13A, 14A, 15A, 16A, 17A, and 18A are plan views illustrating a method of manufacturing the light emitting device according to an exemplary embodiment, FIGS. 9B, 10B, 11B, 12B, 13B, 14B, 15B, 16B, 17B, and 18B are cross-sectional views taken along line A-A' of FIGS. 9A, 10A, 11A, 12A, 13A, 14A, 15A, 16A, 17A, and 18A, respectively, and FIGS. 9C, 10C, 11C, 12C, 13C, 14C, 15C, 16C, 17C, and 18C are cross-sectional views taken along line B-B' of FIGS. 9A, 10A, 11A, 12A, 13A, 14A, 15A, 16A, 17A, and 18A, respectively.

Figure 9A:
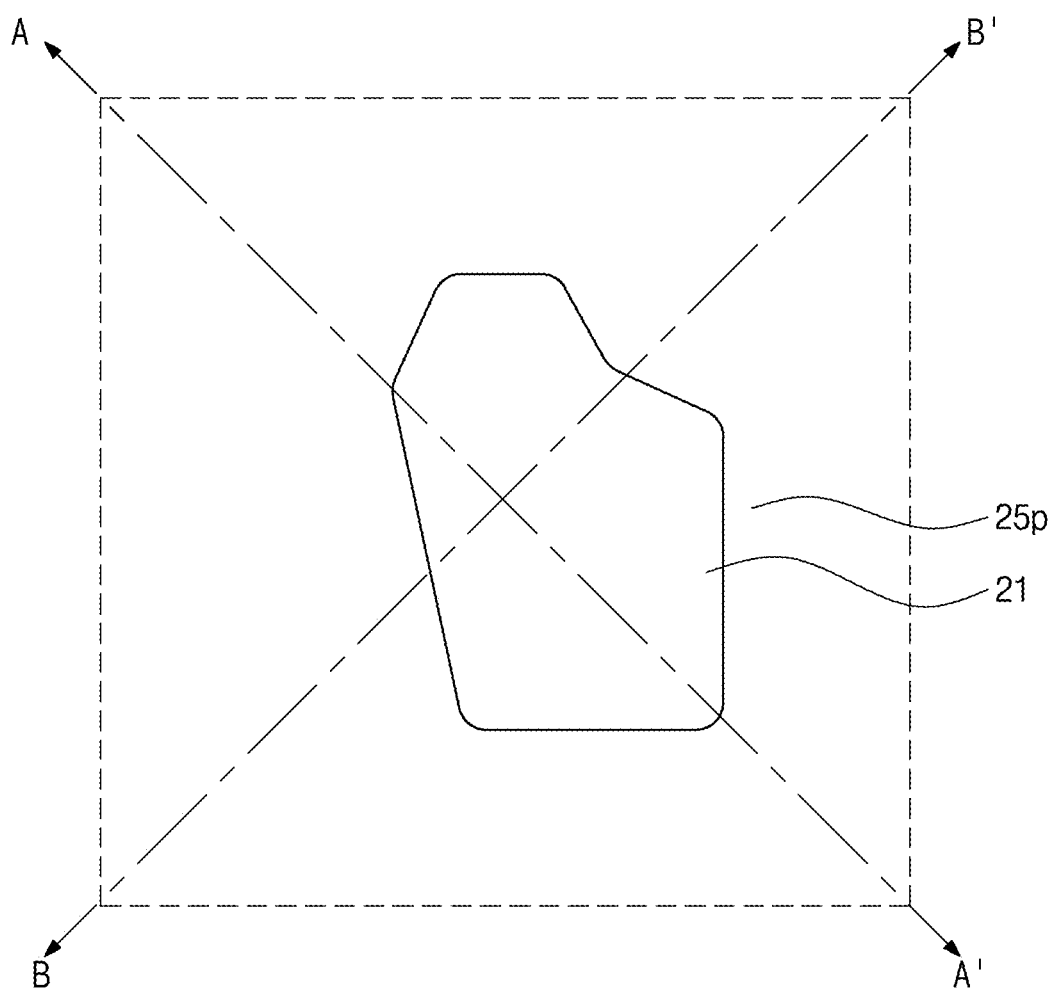
FIGS. 9A, 10A, 11A, 12A, 13A, 14A, 15A, 16A, 17A, and 18A are plan views showing a method of manufacturing a light emitting device according to an exemplary embodiment.
Figure 9B:
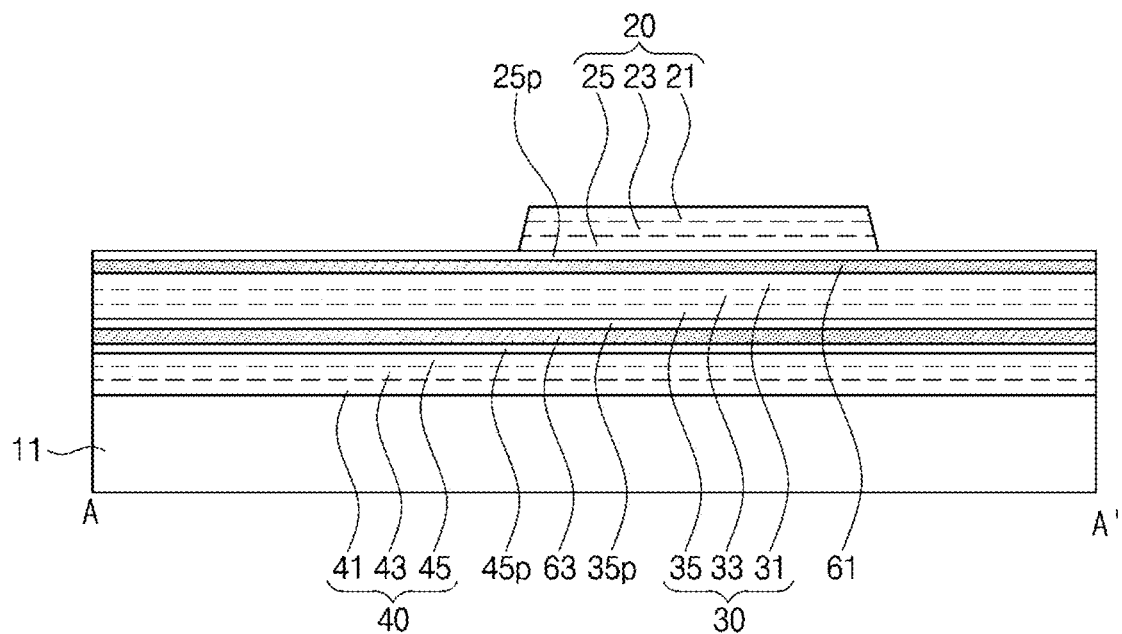
FIGS. 9B, 10B, 11B, 12B, 13B, 14B, 15B, 16B, 17B, and 18B are cross-sectional views taken along line A-A' of FIGS. 9A, 10A, 11A, 12A, 13A, 14A, 15A, 16A, 17A, and 18A, respectively.
Figure 9C:
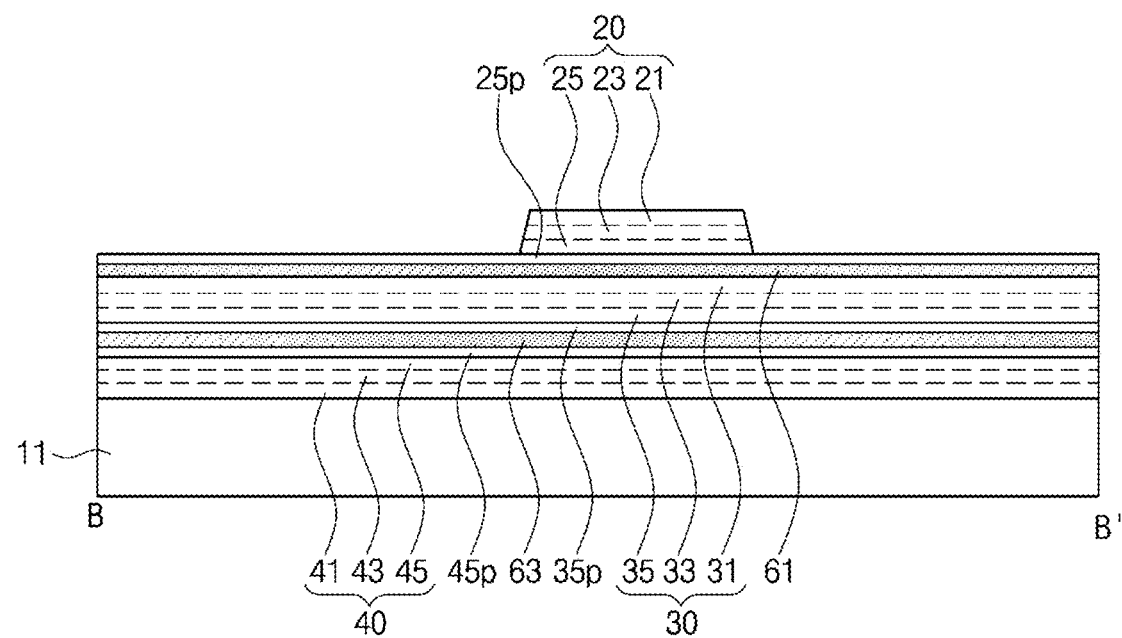
FIGS. 9C, 10C, 11C, 12C, 13C, 14C, 15C, 16C, 17C, and 18C are cross-sectional views taken along line B-B' of FIGS. 9A, 10A, 11A, 12A, 13A, 14A, 15A, 16A, 17A, and 18A, respectively.

Referring to FIGS. 9A, 9B, and 9C, the third epitaxial stack 40, the second epitaxial stack 30, and the first epitaxial stack 20 are sequentially stacked on the substrate 11, and the first epitaxial stack 20 is patterned.

In particular, the third epitaxial stack 40 and the third p-type contact electrode 45p are formed first on the substrate 11.

The substrate 11 may be a sapphire ($Al_2O_3$), silicon carbide (SiC), gallium nitride (GaN), indium gallium nitride (InGaN), aluminum gallium nitride (AlGaN), aluminum nitride (AlN), gallium oxide ($Ga_2O_3$), or silicon substrate 11. The third n-type semiconductor layer 41, the third active layer 43, and the third p-type semiconductor layer 45 may be sequentially grown on the substrate 11 by processes, such as a metal organic chemical vapor deposition (MOCVD) method or a molecular beam epitaxy (MBE) method. The third p-type contact electrode 45p may be formed on the third p-type semiconductor layer 45 by a chemical vapor deposition method, for example. The third p-type contact electrode 45p may include at least one of indium tin oxide (ITO), indium zinc oxide (IZO), indium zinc tin oxide (IZTO), and zinc oxide (ZnO). For example, when the third epitaxial stack 40 emits blue light, the substrate 11 may include the sapphire, and the third p-type contact electrode 45p may include zinc oxide (ZnO).

The second epitaxial stack 30 may be formed by sequentially growing the second n-type semiconductor layer 31, the second active layer 33, and the second p-type semiconductor layer 35 on a temporary substrate by the processes, such as the MOCVD or MBE. The second p-type contact electrode 35p may be formed on the second p-type semiconductor layer 35 by a chemical vapor deposition method, for example. The second p-type contact electrode 35p may include at least one of indium tin oxide (ITO), indium zinc oxide (IZO), indium zinc tin oxide (IZTO), and zinc oxide (ZnO). For example, when the second epitaxial stack 30 emits green light, the temporary substrate may include one of sapphire and gallium nitride (GaN), and the second p-type contact electrode 35p may include zinc oxide (ZnO).

The first epitaxial stack 20 may be formed by sequentially growing the first n-type semiconductor layer 21, the first active layer 23, and the first p-type semiconductor layer 25 on a temporary substrate by the processes, such as the MOCVD or MBE. The first p-type contact electrode 25p may be formed on the first p-type semiconductor layer 25 by a chemical vapor deposition method, for example. The first p-type contact electrode 25p may include at least one of indium tin oxide (ITO), indium zinc oxide (IZO), indium zinc tin oxide (IZTO), and zinc oxide (ZnO). For example, when the first epitaxial stack 20 emits red light, the temporary substrate may include gallium arsenide nitride (GaAsN), and the first p-type contact electrode 25p may include indium tin oxide (ITO).

Then, the third p-type contact electrode 45p and the second p-type contact electrode 35p formed on the temporary substrate may be disposed to face each other, and the third epitaxial stack 40 and the second epitaxial stack 30 may be attached to each other with the second adhesive layer 63 interposed therebetween. The temporary substrate provided with the second epitaxial stack 30 may be removed by a laser lift-off process, or the like.

Next, the second n-type semiconductor layer 31 and the first p-type contact electrode 25p formed on the temporary substrate may be disposed to face each other, and the second epitaxial stack 30 and the first epitaxial stack 20 may be attached to each other with the first adhesive layer 61 interposed therebetween. The temporary substrate provided with the first epitaxial stack 20 may be removed by a laser lift-off process, or the like.

After that, a first mask pattern may be formed on the first epitaxial stack 20, and the first n-type semiconductor layer 21, the first active layer 23, and the first p-type semiconductor layer 25 may be etched using the first mask pattern as an etch mask.

The first epitaxial stack 20 may be patterned into various shapes by taking into account an overall line connection structure of the light emitting structure. For example, the first epitaxial stack 20 may be formed in a polygonal shape when viewed in a plan view in consideration of the positions of the above-described contact holes, through holes, and pads. More particularly, the first epitaxial stack 20 may have substantially a quadrangular shape of which corners are cut, such that V-shaped sidewalls recessed inwardly of the first epitaxial stack 20 may be formed.

According to an exemplary embodiment, after the etching process, each of the first n-type semiconductor layer 21, the first active layer 23, and the first p-type semiconductor layer 25 may have inclined sidewalls, and the side surfaces of the first n-type semiconductor layer 21, the side surfaces of the first active layer 23, the side surfaces of the first p-type semiconductor layer 25, which are etched, may be disposed on substantially the same plane. According to another exemplary embodiment, each of the first n-type semiconductor layer 21, the first active layer 23, and the first p-type semiconductor layer 25 may have vertical sidewalls, and the side surfaces of the first n-type semiconductor layer 21, the side surfaces of the first active layer 23, the side surfaces of the first p-type semiconductor layer 25, which are etched, may be disposed on substantially the same plane.

According to an exemplary embodiment, the first p-type contact electrode 25p may serve as an etch stop layer. In particular, the etching process may be performed until the first p-type contact electrode 25p is exposed. However, in some exemplary embodiments, a portion of an upper surface of the first p-type contact electrode 25p, which is exposed by the first n-type semiconductor layer 21, the first active layer 23, and the first p-type semiconductor layer 25, may be selectively etched.

According to an exemplary embodiment, the first n-type semiconductor layer 21, the first active layer 23, and the first p-type semiconductor layer 25 may have a minimum size to the extent that the first epitaxial stack 20 to be subsequently completed may function as a light emitting diode.

Figure 10A:
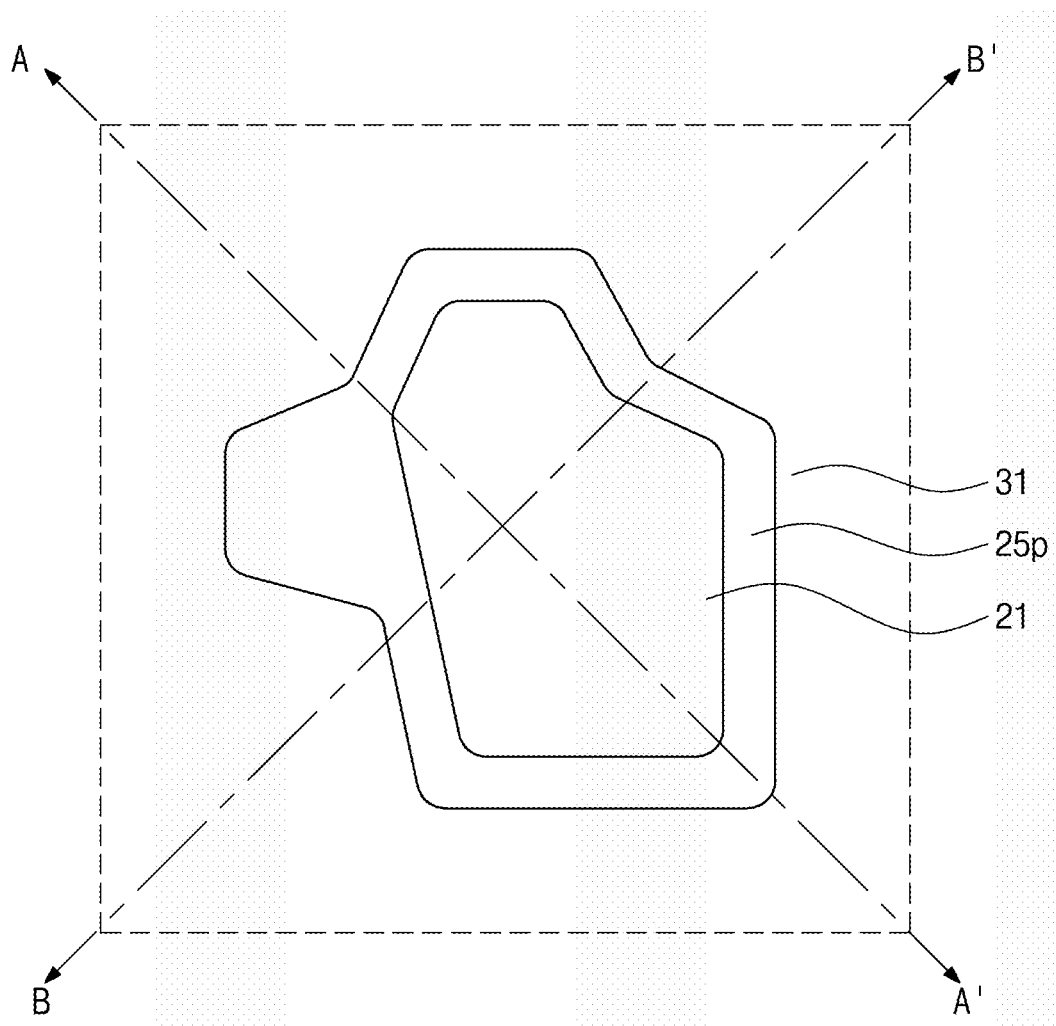
Figure 10B:
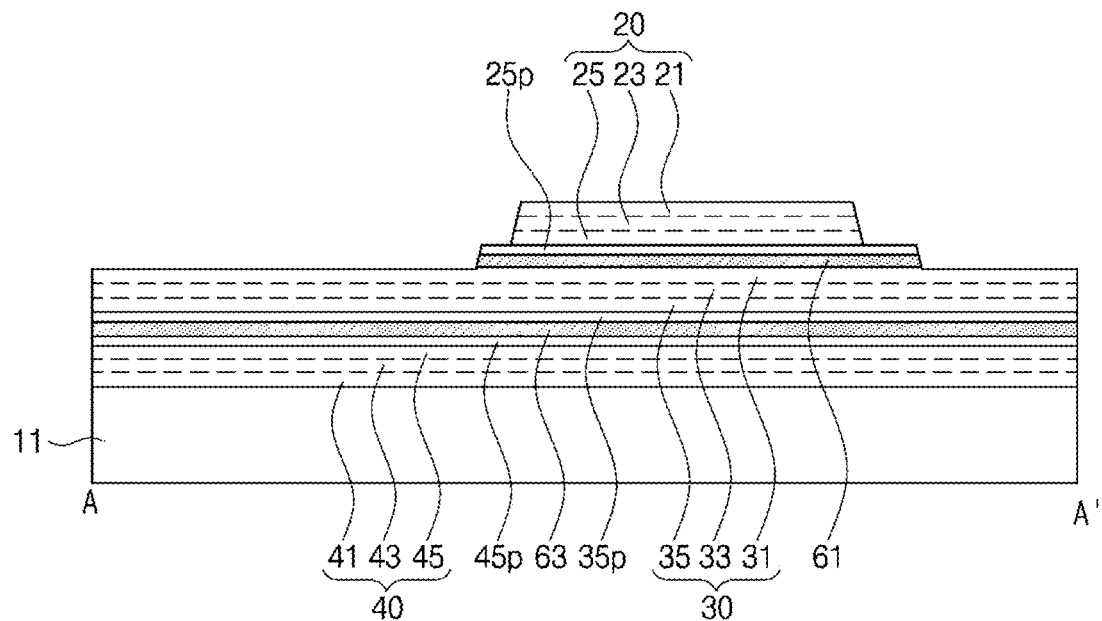
Figure 10C:
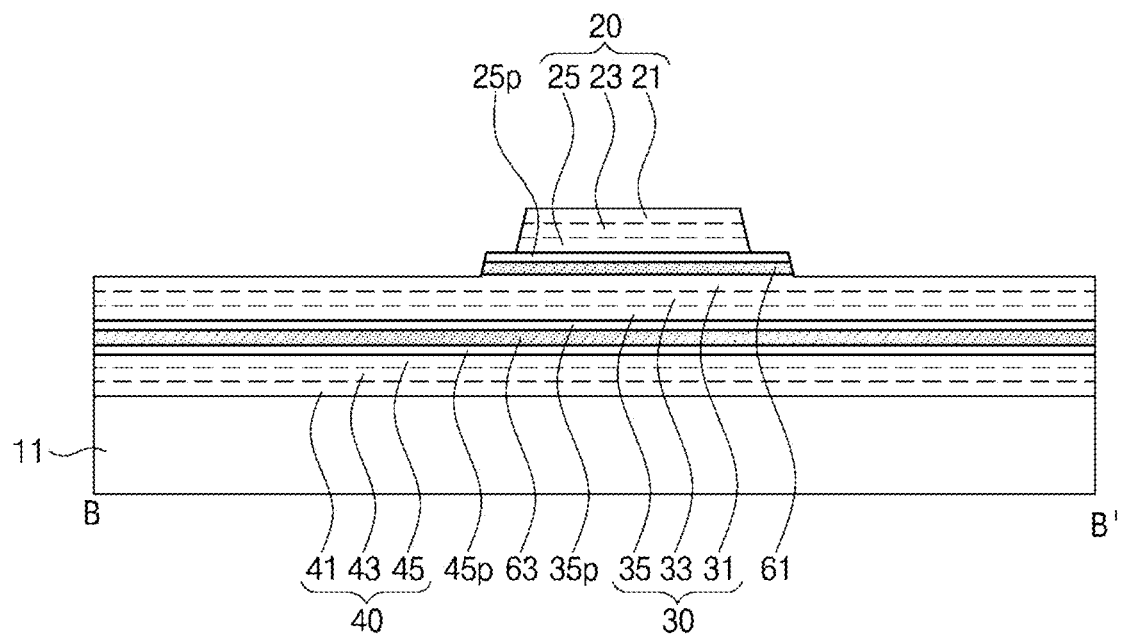

Referring to FIGS. 10A, 10B, and 10C, a second mask pattern may be formed on the first p-type contact electrode 25p to cover the first n-type semiconductor layer 21, the first active layer 23, the first p-type semiconductor layer 25, and a portion of the first p-type contact electrode 25p and the first adhesive layer 61 may be etched using the second mask pattern as an etch mask.

The first p-type contact electrode 25p and the first adhesive layer 61 may be patterned into various shapes by taking into account the overall line connection structure of the light emitting structure. For example, the first p-type contact electrode 25p and the first adhesive layer 61 may have substantially a quadrangular shape, such that V-shaped sidewalls recessed inwardly of the third epitaxial stack 40 may be formed, when viewed in a plan view.

According to an exemplary embodiment, the first p-type contact electrode 25p and the first adhesive layer 61 may have inclined sidewalls, and the sidewalls of the first p-type contact electrode 25p and the sidewalls of the first adhesive layer 61 may be disposed on substantially the same plane. According to another exemplary embodiment, the first p-type contact electrode 25p and the first adhesive layer 61 may have vertical sidewalls. In this case, the sidewalls of the first p-type contact electrode 25p and the sidewalls of the first adhesive layer 61 may be disposed on substantially the same plane.

The etching process may be performed while controlling a process recipe, such as etching gas injection time, so that the etching process may stop at a point where the second n-type semiconductor layer 31 is exposed. According to an exemplary embodiment, a portion of an upper portion of the second n-type semiconductor layer 31 may be etched.

Figure 11A:
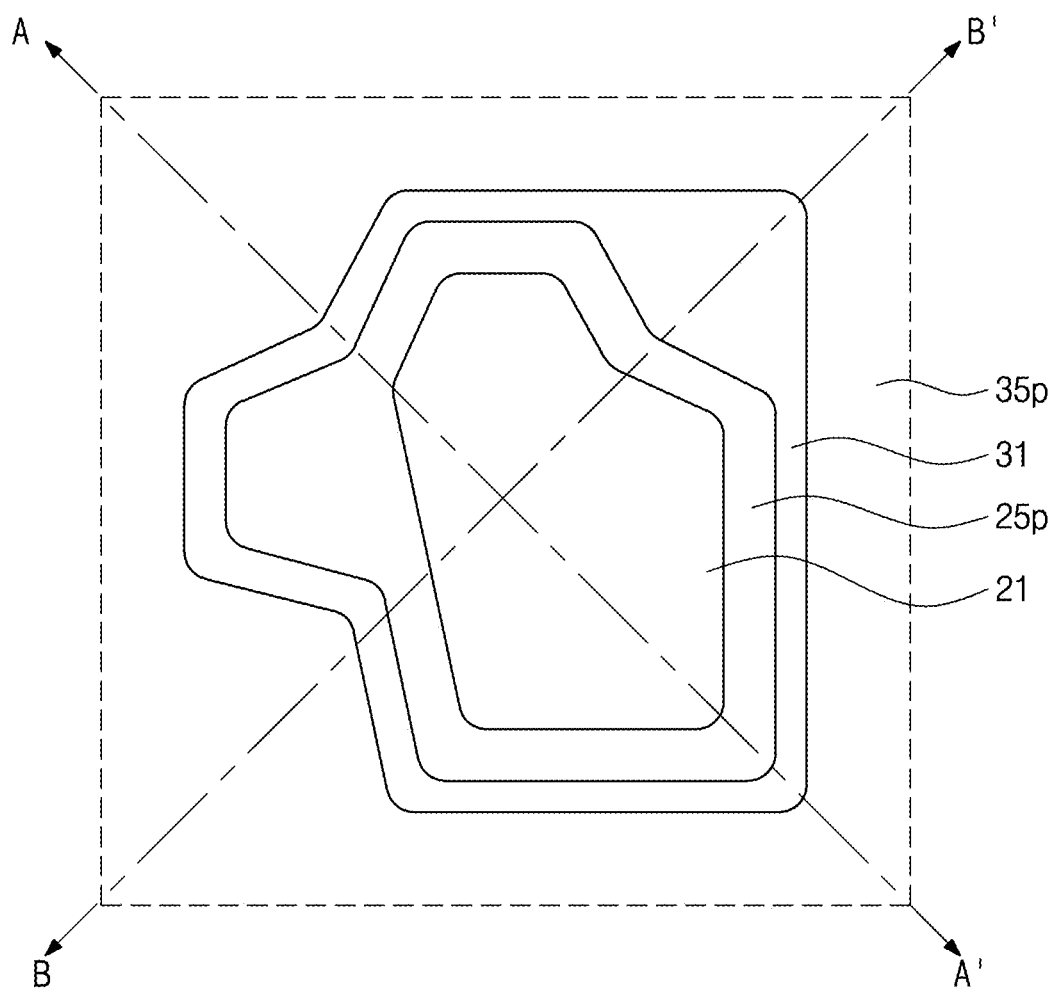
Figure 11B:
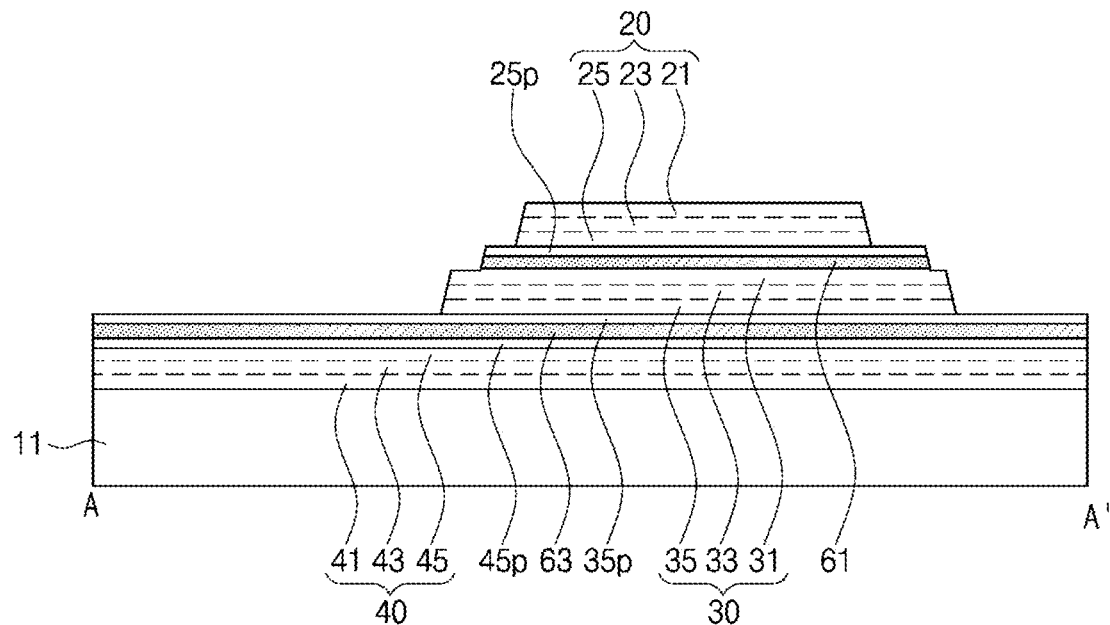
Figure 11C:
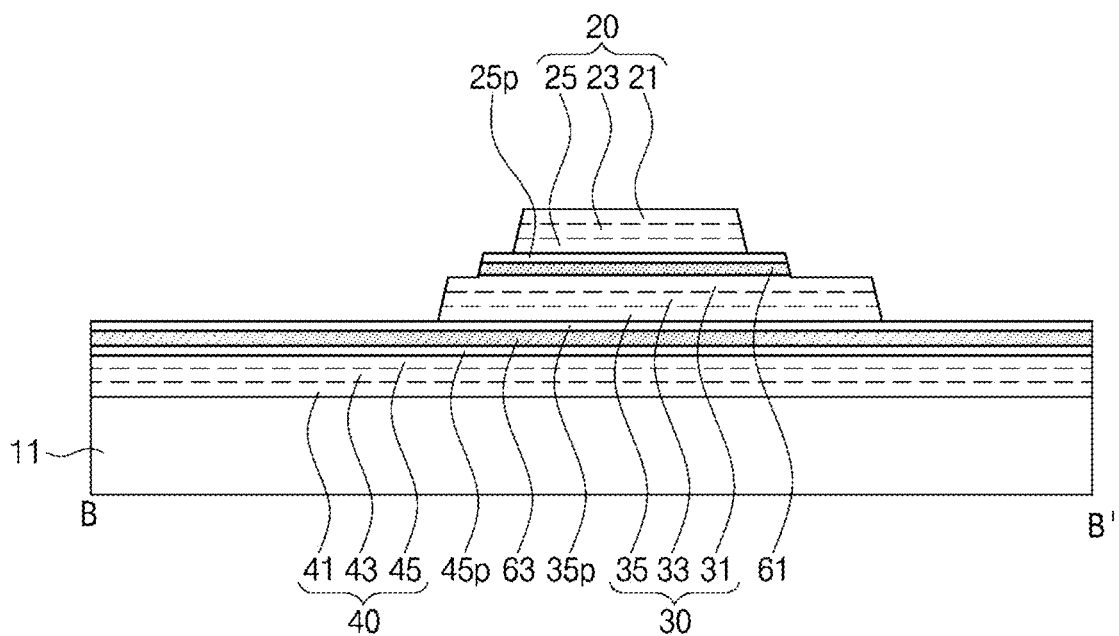

Referring to FIGS. 11A, 11B, and 11C, a third mask pattern may be formed on the second n-type semiconductor layer 31 to cover the first epitaxial stack 20 and the first adhesive layer 61, and the second n-type semiconductor layer 31, the second active layer 33, and the second p-type semiconductor layer 35 may be etched using the third mask pattern as an etch mask.

The second epitaxial stack 30 may be patterned into various shapes by taking into account the overall line connection structure of the light emitting structure. For example, the second epitaxial stack 30 may be formed in a polygonal shape when viewed in a plan view in consideration of the positions of the above-described first to fourth contact parts and positions of the contact holes, the through holes, and the pads. More particularly, the second epitaxial stack 30 may have substantially a quadrangular shape of which corners are cut, such that V-shaped sidewalls recessed inwardly of the second epitaxial stack 30 may be formed.

According to an exemplary embodiment, each of the second n-type semiconductor layer 31, the second active layer 33, and the second p-type semiconductor layer 35 may have inclined sidewalls, and the sidewalls of the second n-type semiconductor layer 31, the sidewalls of the second active layer 33, and the sidewalls of the second p-type semiconductor layer 35 may be disposed on substantially the same plane. According to another exemplary embodiment, each of the second n-type semiconductor layer 31, the second active layer 33, and the second p-type semiconductor layer 35 may have vertical sidewalls. In this case, the sidewalls of the second n-type semiconductor layer 31, the sidewalls of the second active layer 33, the sidewalls of the second p-type semiconductor layer 35 may be disposed on substantially the same plane.

According to an exemplary embodiment, the second p-type contact electrode 35p may serve as an etch stop layer. More particularly, the etching process may be performed until the second p-type contact electrode 35p is exposed. However, in some exemplary embodiments, a portion of an upper surface of the second p-type contact electrode 35p, which is exposed by the second n-type semiconductor layer 31, the second active layer 33, and the second p-type semiconductor layer 35, may be selectively etched.

Figure 12A:
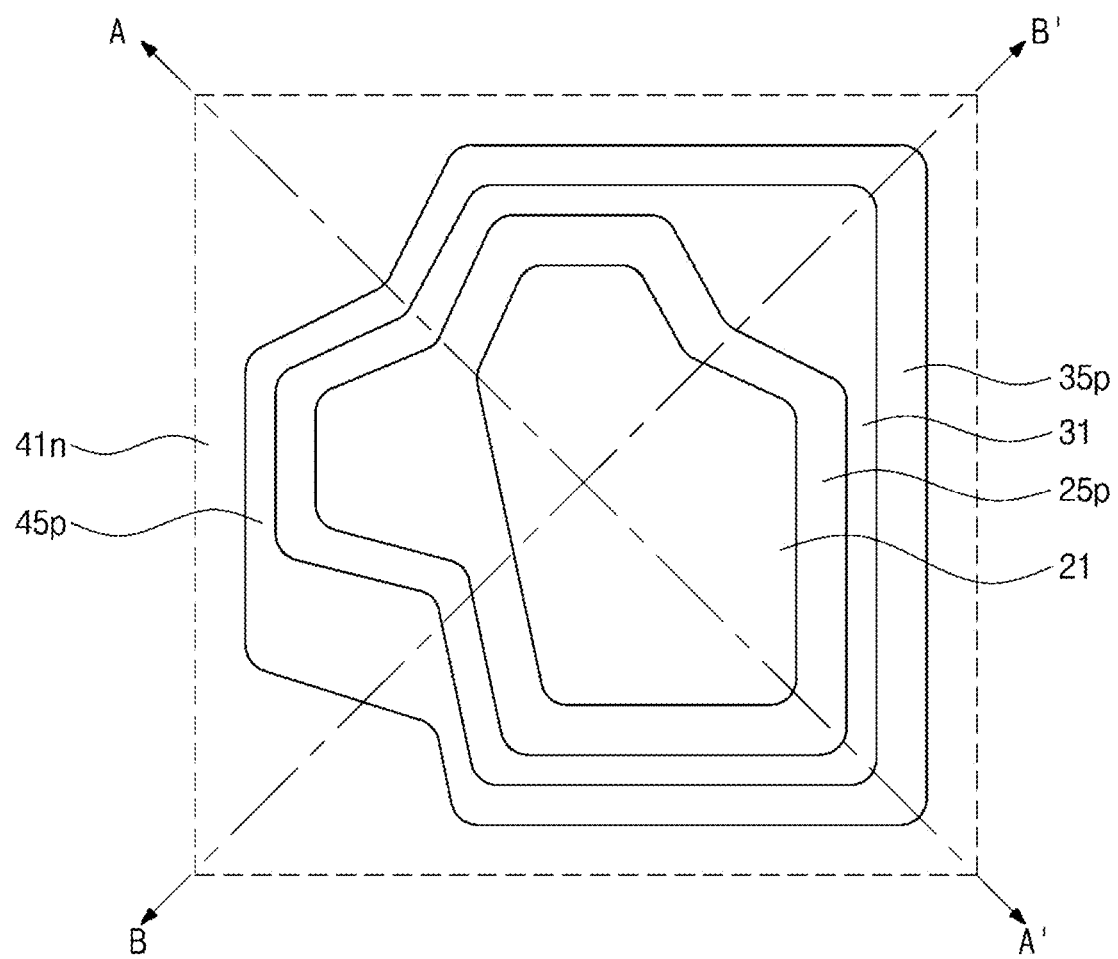
Figure 12B:
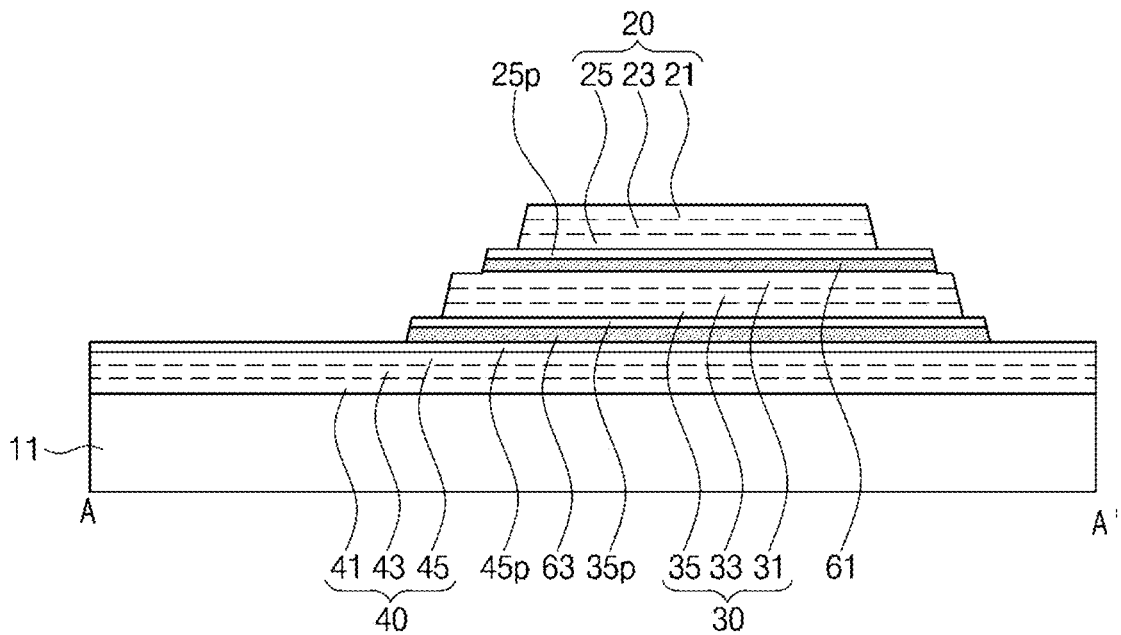
Figure 12C:
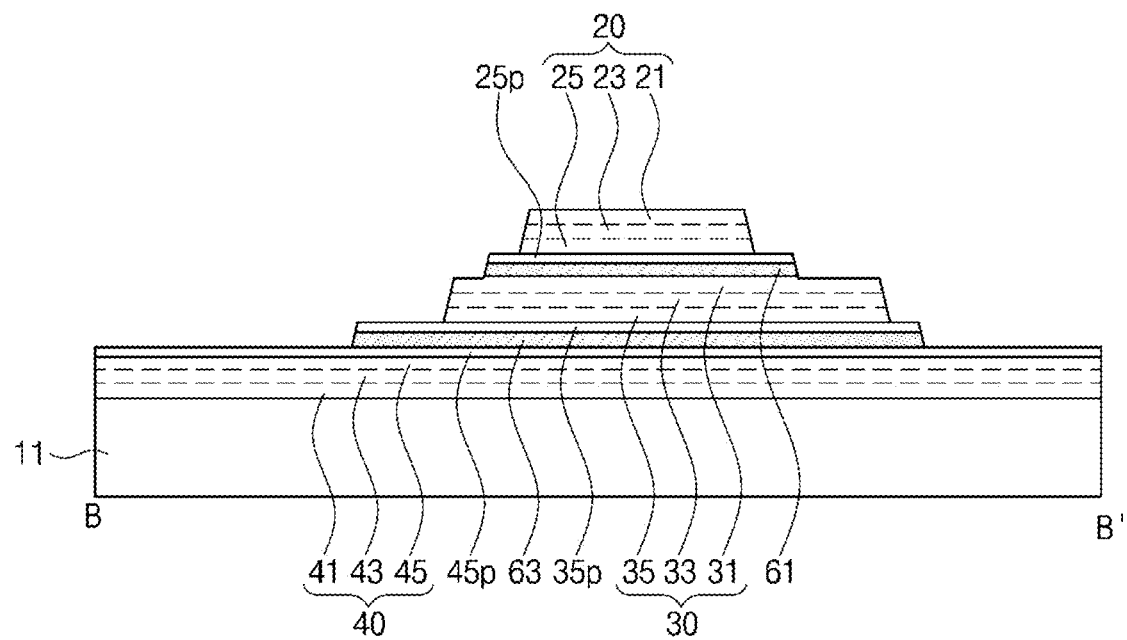

Referring to FIGS. 12A, 12B, and 12C, a fourth mask pattern may be formed on the second p-type contact electrode 35p to cover the first epitaxial stack 20, the first adhesive layer 61, the second n-type semiconductor layer 31, the second active layer 33, and the second p-type semiconductor layer 35, and the second p-type contact electrode 35p and the second adhesive layer 63 may be etched using the fourth mask pattern as an etch mask.

The second p-type contact electrode 35p and the second adhesive layer 63 may be patterned into various shapes by taking into account the overall line connection structure of the light emitting structure.

According to the illustrated exemplary embodiment, each of the second p-type contact electrode 35p and the second adhesive layer 63 may have inclined sidewalls, and the sidewalls of the second p-type contact electrode 35p and the sidewalls of the second adhesive layer 63 may be disposed on substantially the same plane. According to another exemplary embodiment, each of the second p-type contact electrode 35p and the second adhesive layer 63 may have vertical sidewalls. In this case, the sidewalls of the second p-type contact electrode 35p and the sidewalls of the second adhesive layer 63 may be disposed on substantially the same plane.

According to an exemplary embodiment, the third p-type contact electrode 45p may serve as an etch stop layer. More particularly, the etching process may be performed until the third p-type contact electrode 45p is exposed. However, in some exemplary embodiments, a portion of an upper surface of the third p-type contact electrode 45p, which is exposed by the second p-type contact electrode 35p and the second adhesive layer 63, may be selectively etched.

Figure 13A:
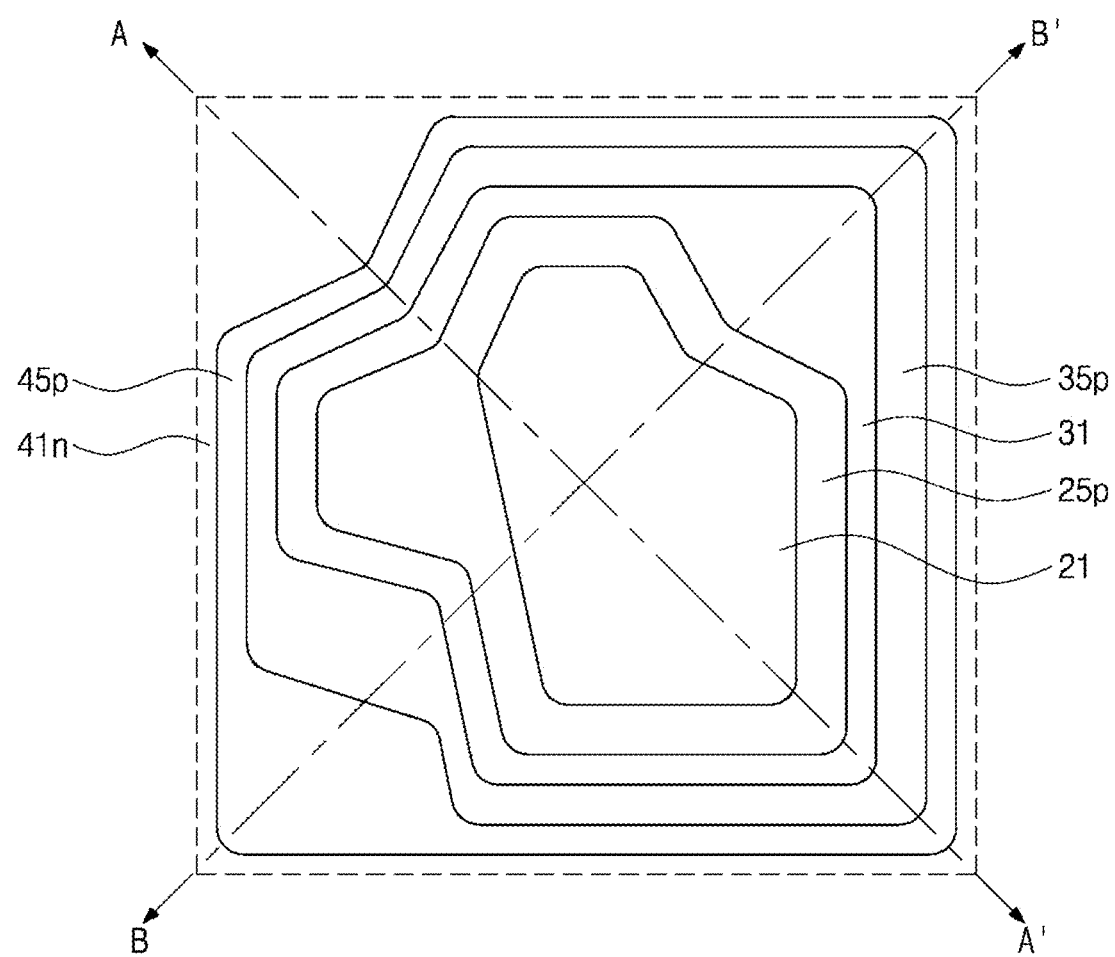
Figure 13B:
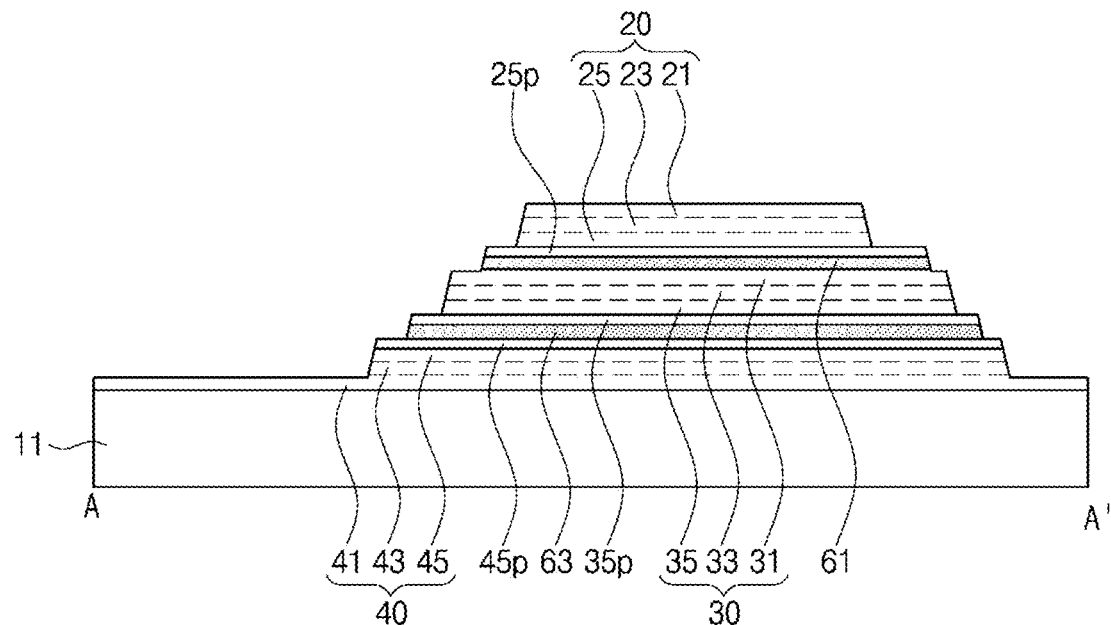
Figure 13C:
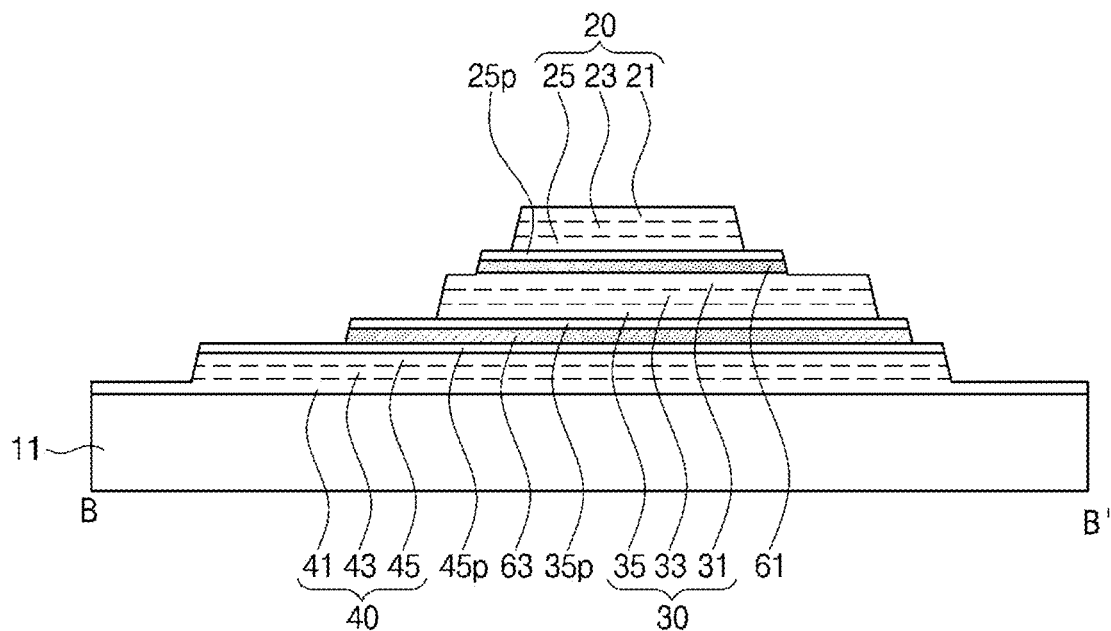

Referring to FIGS. 13A, 13B, and 13C, a fifth mask pattern may be formed on the third p-type contact electrode 45p to cover the second epitaxial stack 30, the first epitaxial stack 20, and the second adhesive layer 63, and the third p-type contact electrode 45p, the third p-type semiconductor layer 45, and the third active layer 43 may be etched using the fifth mask pattern as an etch mask.

The third epitaxial stack 40 may be patterned into various shapes by taking into account the overall line connection structure of the light emitting structure. For example, the third epitaxial stack 40 may have substantially a quadrangular shape, of which corners are removed from some areas.

According to an exemplary embodiment, each of the third p-type semiconductor layer 45, the third active layer 43, and the third n-type semiconductor layer 41 may have inclined sidewalls, and the sidewalls of the third p-type semiconductor layer 45, the sidewalls of the third active layer 43, and the sidewalls of the third n-type semiconductor layer 41 may be disposed on substantially the same plane. According to another exemplary embodiment, each of the third p-type semiconductor layer 45, the third active layer 43, and the third n-type semiconductor layer 41 may have vertical sidewalls. In this case, the sidewalls of the third p-type semiconductor layer 45, the sidewalls of the third active layer 43, the sidewalls of the third n-type semiconductor layer 41 may be disposed on substantially the same plane.

The etching process may be performed while controlling a process recipe, such as etching gas injection time, so that the etching process may stop at a point where the third n-type semiconductor layer 41 is exposed. According to an exemplary embodiment, a portion of an upper portion of the third n-type semiconductor layer 41 may be etched. In addition, an etching process for isolation may be performed to separate each epitaxial stack structure through an additional mask process. Through the etching process, the substrate 11 may be exposed between the epitaxial stacked structures.

Figure 14A:
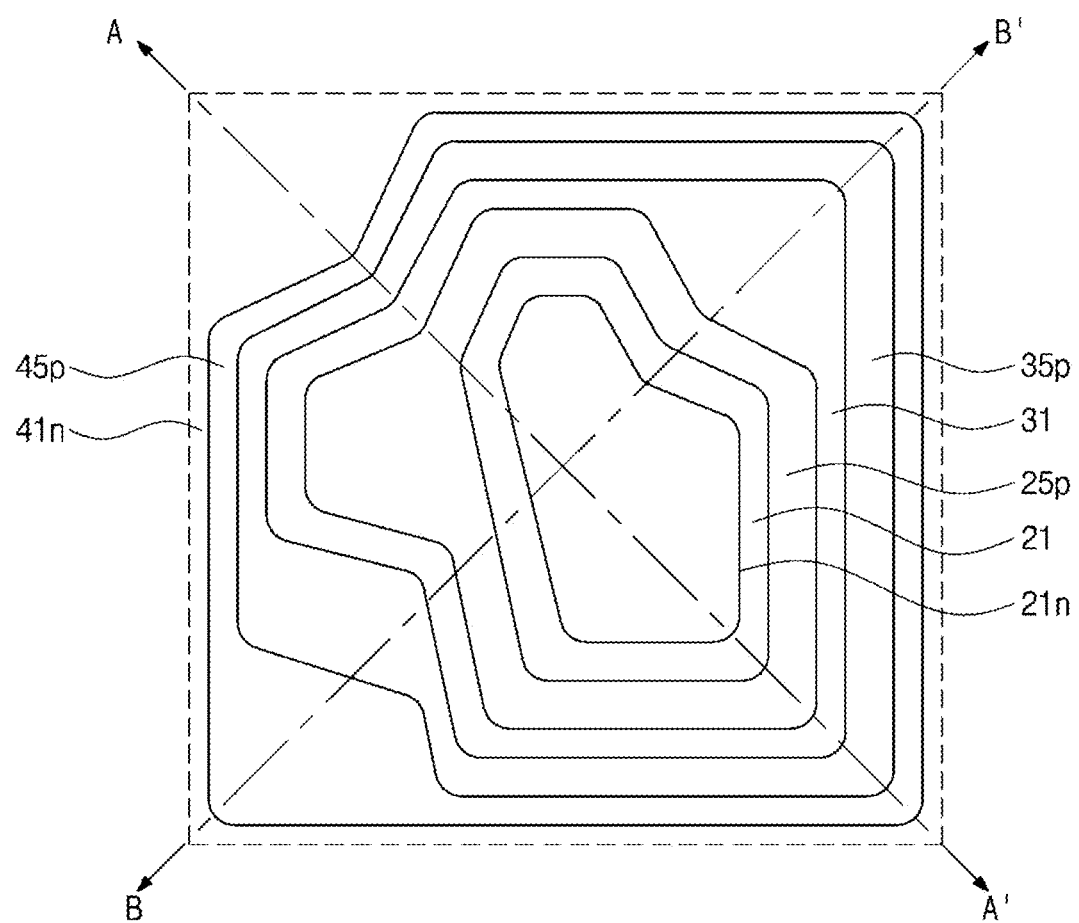
Figure 14B:
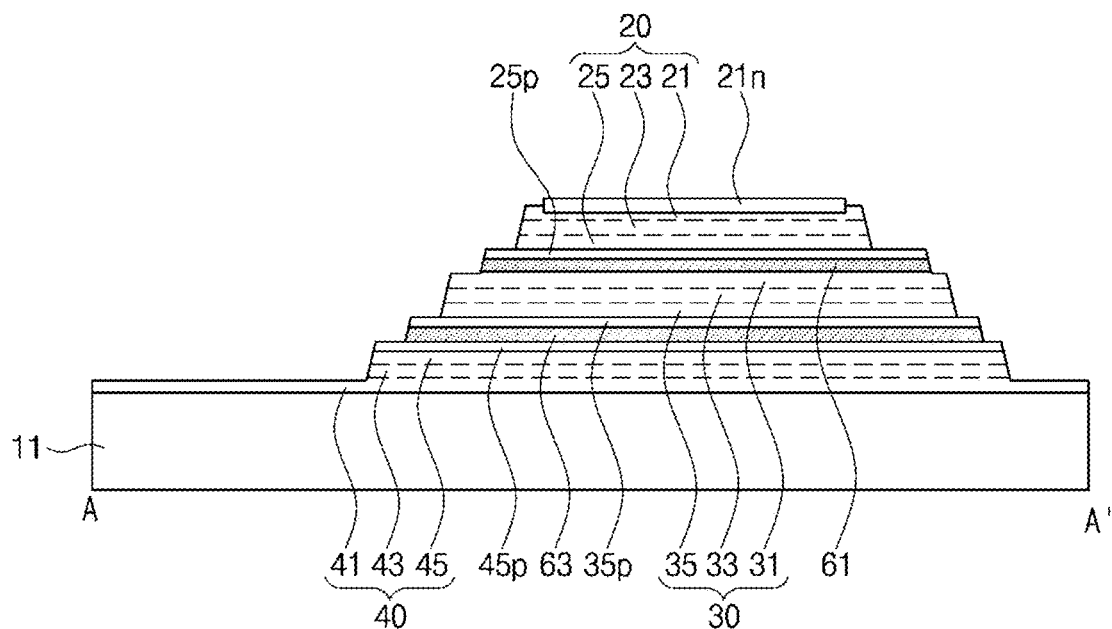
Figure 14C:
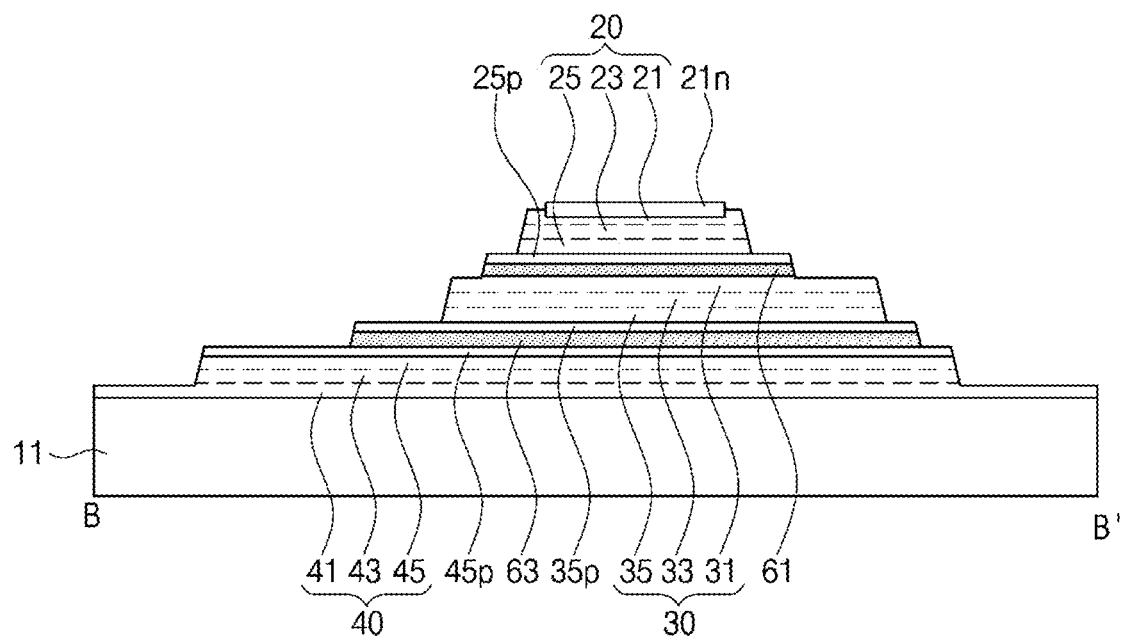

Referring to FIGS. 14A, 14B, and 14C, the first n-type contact electrode 21n is formed on the first n-type semiconductor layer 21. The first n-type contact electrode 21n may be formed by etching a portion of an upper surface of the first n-type semiconductor layer 21 to form the recessed portion recessed from the upper surface of the first n-type semiconductor layer 21, and by forming a conductor, such as metal, in the recessed portion. The first n-type contact electrode 21n may include various metals, for example, an Au/Te alloy or an Au/Ge alloy.

Figure 15A:
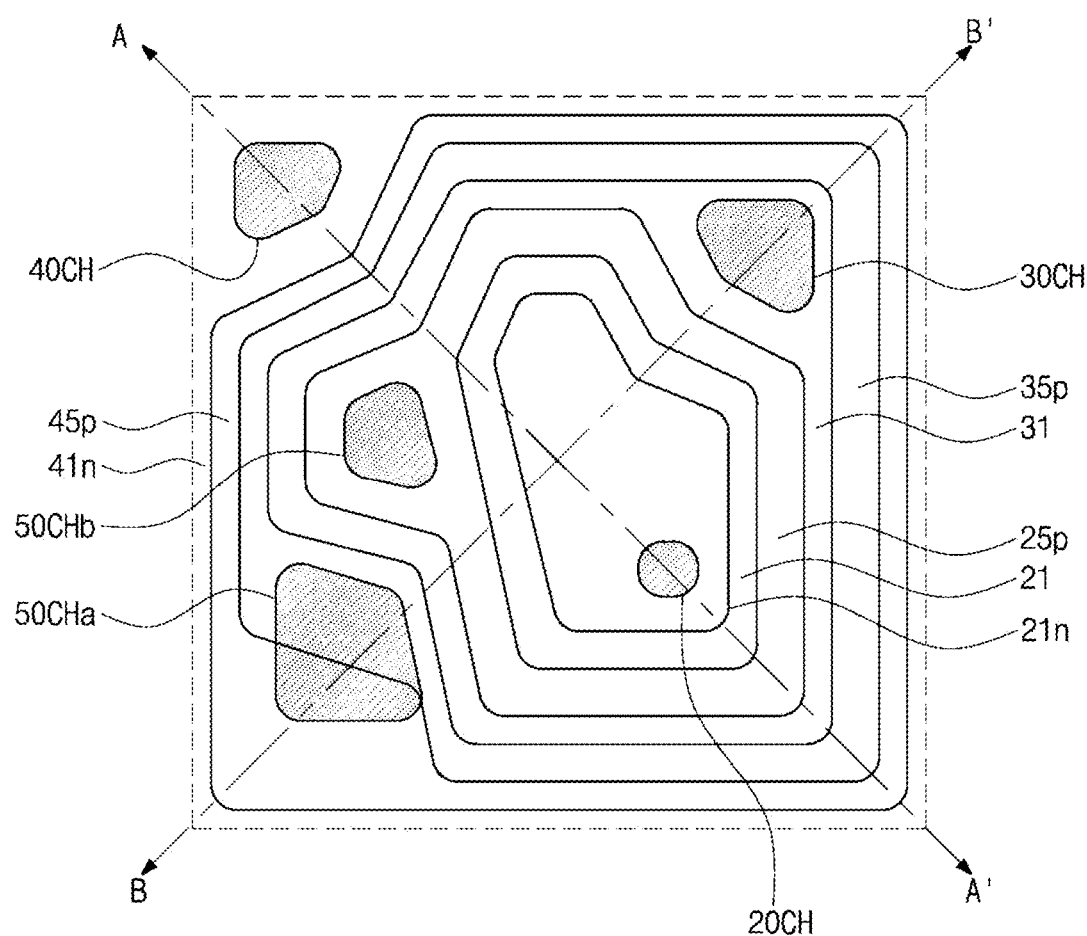
Figure 15B:
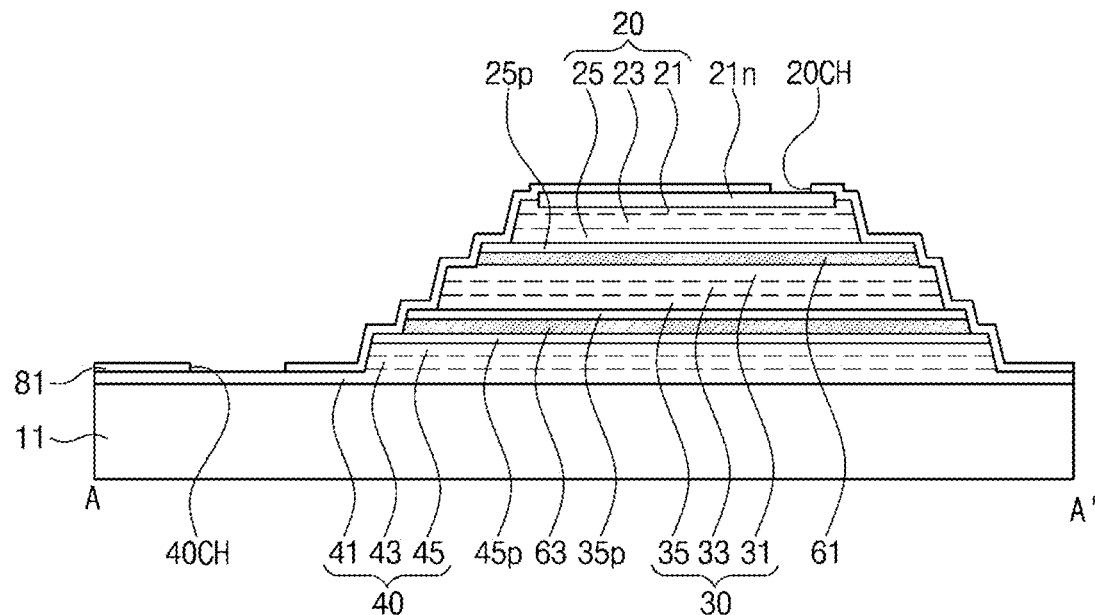
Figure 15C:
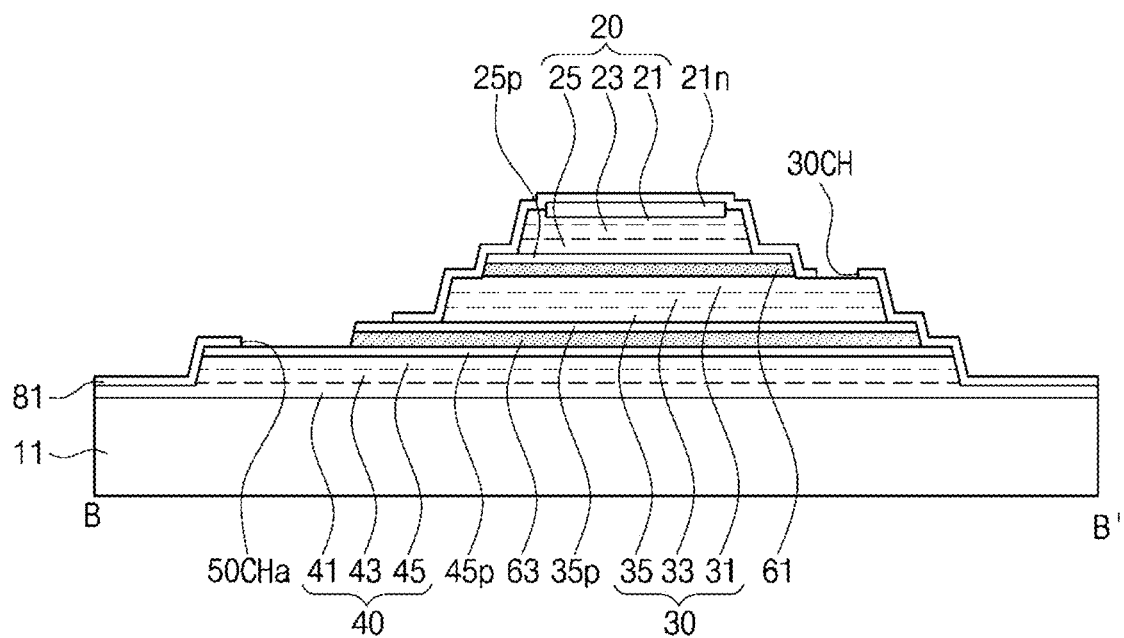

Referring to FIGS. 15A, 15B, and 15C, the first insulating layer 81 may be conformally formed on the vertically-stacked light emitting structure. The first insulating layer 81 may include oxide, e.g., silicon oxide, and/or silicon nitride.

According to an exemplary embodiment, since the light emitting structure has a mesa structure including a stepped sidewall, the first insulating layer 81 may be conformally deposited on the mesa structure at a uniform thickness. According to an exemplary embodiment, since the mesa structure has the stepped sidewall that is inclined, the first insulating layer 81 may be conformally deposited at a uniform thickness even on or under the mesa structure or between the mesa structures.

The first insulating layer 81 is patterned and partially removed to form the first, second, third, and fourth contact holes 20CH, 30CH, 40CH, and 50CH. In FIG. 15A, portions corresponding to the contact holes are shown as in a darker color.

The first contact hole 20CH is defined in the first insulating layer 81 to expose a portion of the first n-type contact electrode 21n. The second contact hole 30CH is defined in the first insulating layer 81 to expose a portion of the second n-type semiconductor layer 31. The third contact hole 40CH is defined in the first insulating layer 81 to expose a portion of the third n-type semiconductor layer 41. The fourth contact hole 50CH is defined in the first insulating layer 81 to expose portions of the first, second, and third p-type contact electrodes 25p, 35p, and 45p. According to an exemplary embodiment, the fourth contact hole 50CH may be provided in a single or plural number. For example, as shown in figures, the fourth contact hole 50CH according to the illustrated exemplary embodiment may include the first sub-contact hole 50CHa defined in the first insulating layer 81 to expose a portion of the first p-type contact electrode 25p and the second sub-contact hole 50CHb defined in the first insulating layer 81 to simultaneously expose portions of the second and third p-type contact electrodes 35p and 45p.

Figure 16A:
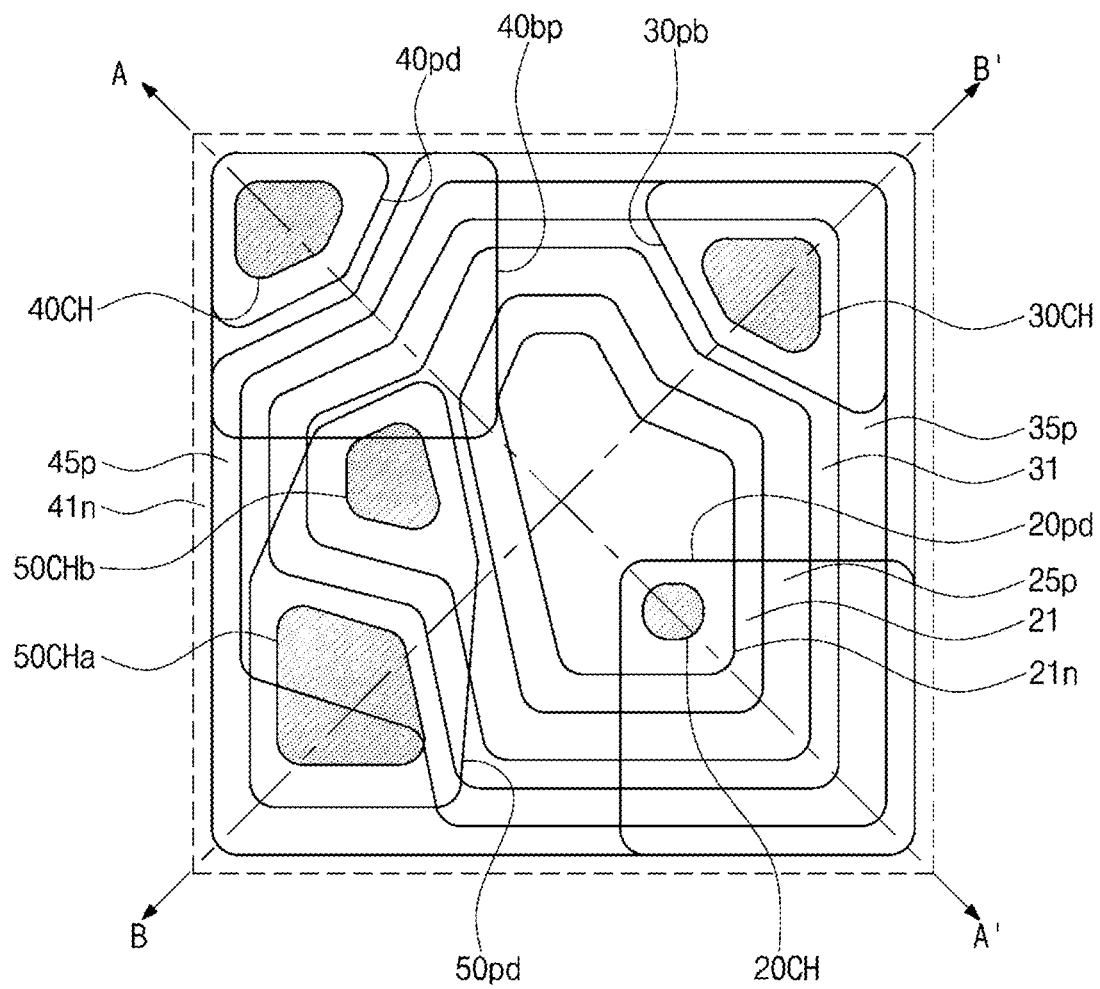
Figure 16B:
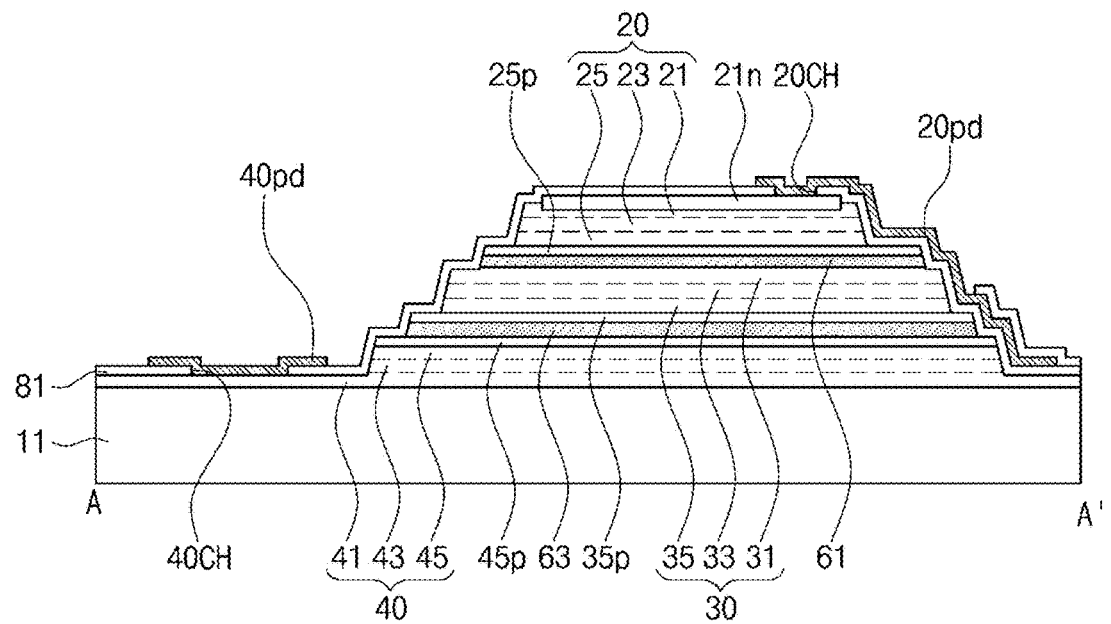
Figure 16C:
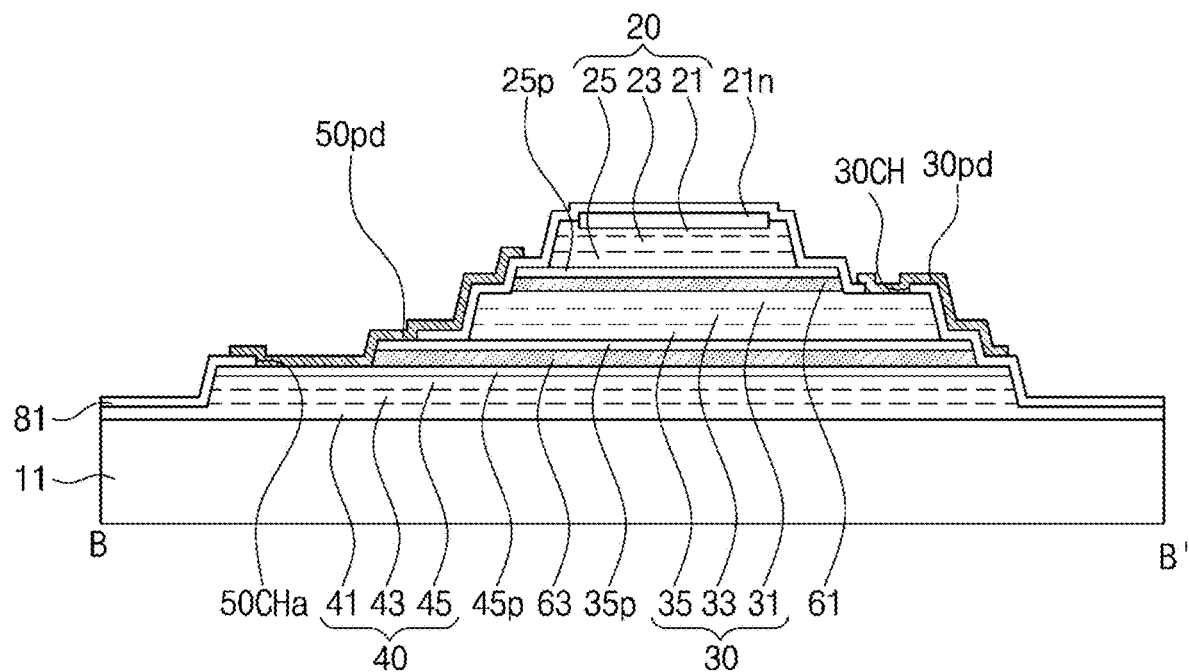

Referring to FIGS. 16A, 16B, and 16C, the first, second, third, and fourth pads 20pd, 30pd, 40pd, and 50pd are formed on the first insulating layer 81, in which the first, second, third, and fourth contact holes 20CH, 30CH, 40CH, and 50CH are formed. The first, second, third, and fourth pads 20pd, 30pd, 40pd, and 50pd may be formed by forming a conductive layer on the entire surface of the substrate 11 using the conductor, such as metal, and performing a photolithography process on the conductive layer.

The first pad 20pd is formed to overlap an area where the first contact hole 20CH is defined, and thus, the first pad 20pd is connected to the first n-type contact electrode 21n through the first contact hole 20CH. The second pad 30pd is formed to overlap with an area where the second contact hole 30CH is defined, and thus, the second pad 30pd is connected to the second n-type semiconductor layer 31 through the second contact hole 30CH. The third pad 40pd is formed to overlap an area where the third contact hole 40CH is defined, and thus, the third pad 40pd is connected to the third n-type semiconductor layer 41 through the third contact hole 40CH. The fourth pad 50pd is formed to overlap an area where the fourth contact hole 50CH is defined, i.e., the areas where the first and second sub-contact holes 50CHa and 50CHb are defined, and thus, the fourth pad 50pd is connected to the first, second, and third p-type contact electrodes 25p, 35p, and 45p through the first and second sub-contact holes 50CHa and 50CHb.

Figure 17A:
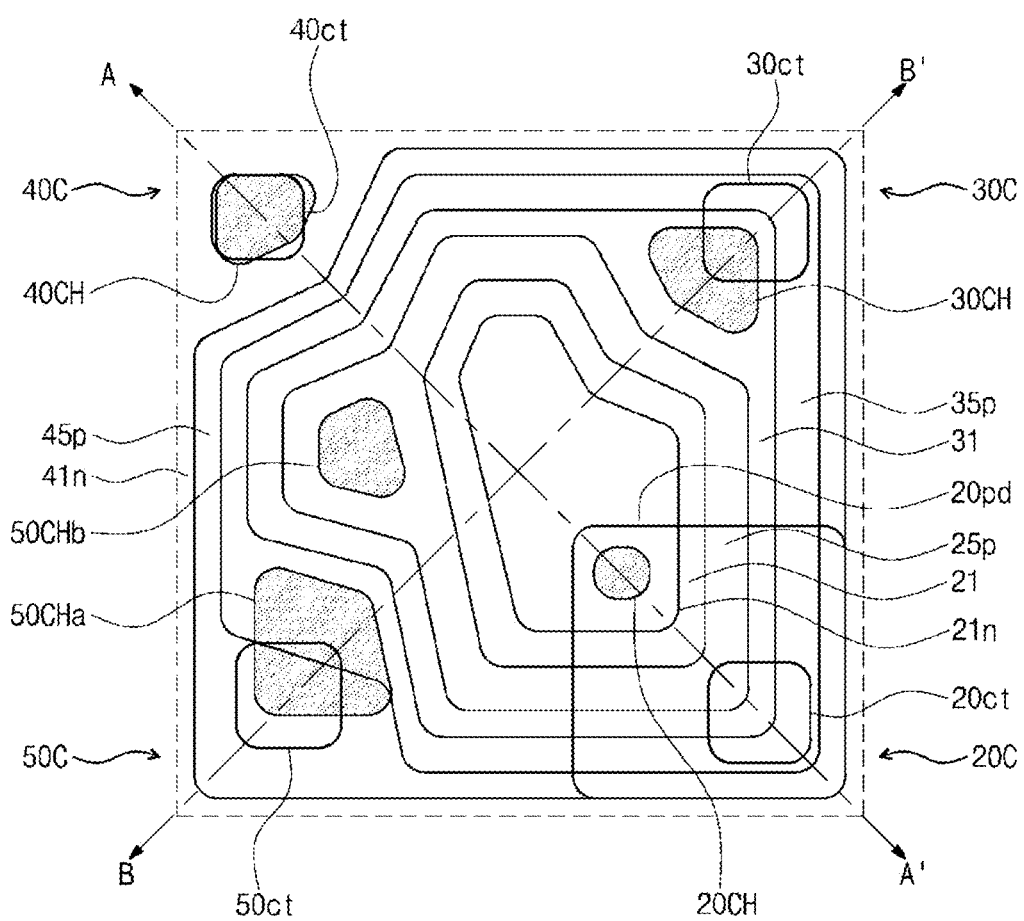
Figure 17B:
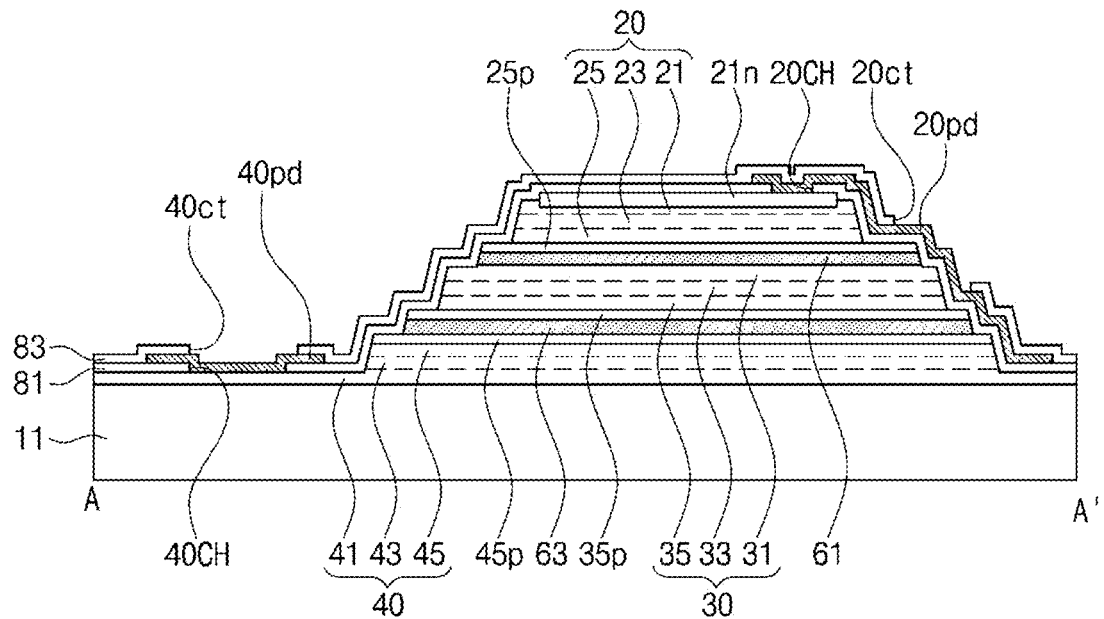
Figure 17C:
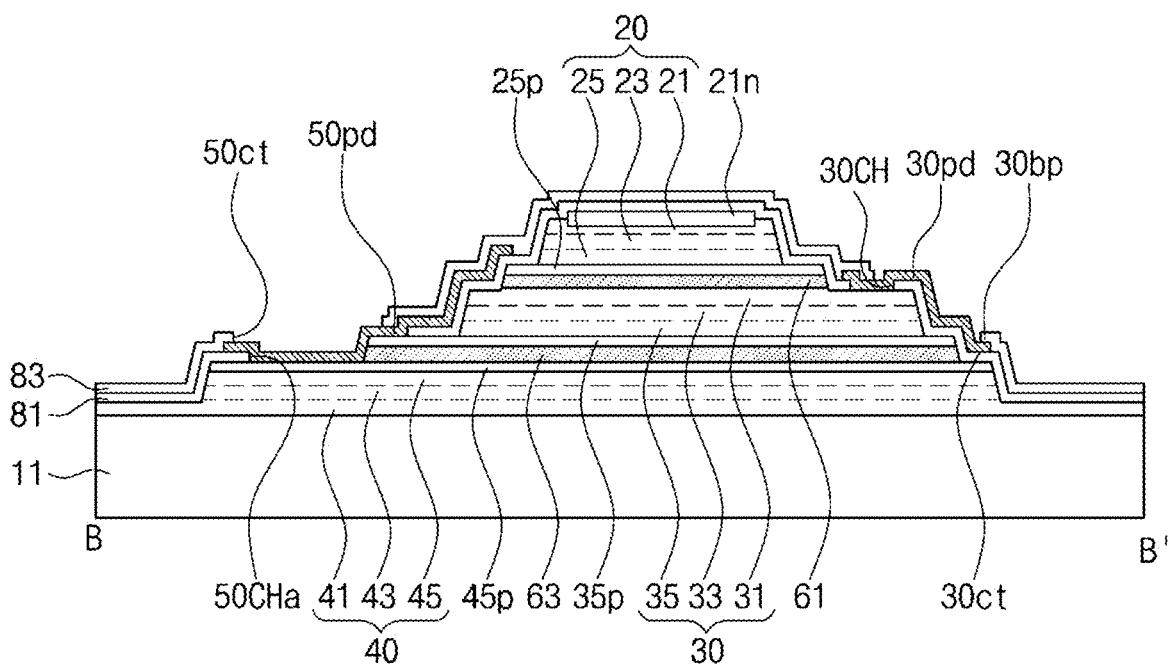

Referring to FIGS. 17A, 17B, and 17C, the second insulating layer 83 may be conformally formed on the first insulating layer 81. The second insulating layer 83 may include oxide, e.g., silicon oxide, and/or silicon nitride.

The second insulating layer 83 is patterned and partially removed to form the first, second, third, and fourth through holes 20ct, 30ct, 40ct, and 50ct.

The first through hole 20ct is defined in the second insulating layer 83 to expose a portion of the first pad 20pd. The second through hole 30ct is defined in the second insulating layer 83 to expose a portion of the second pad 30pd. The third through hole 40ct is defined in the second insulating layer 83 to expose a portion of the third pad 40pd. The fourth through hole 50ct is defined in the second insulating layer 83 to expose a portion of the fourth pad 50pd. In the illustrated exemplary embodiment, the first, second, third, and fourth through holes 20ct, 30ct, 40ct, and 50ct may be respectively defined in areas around where the first, second, third, and fourth pads 20pd, 30pd, 40pd, and 50pd are respectively formed.

Figure 18A:
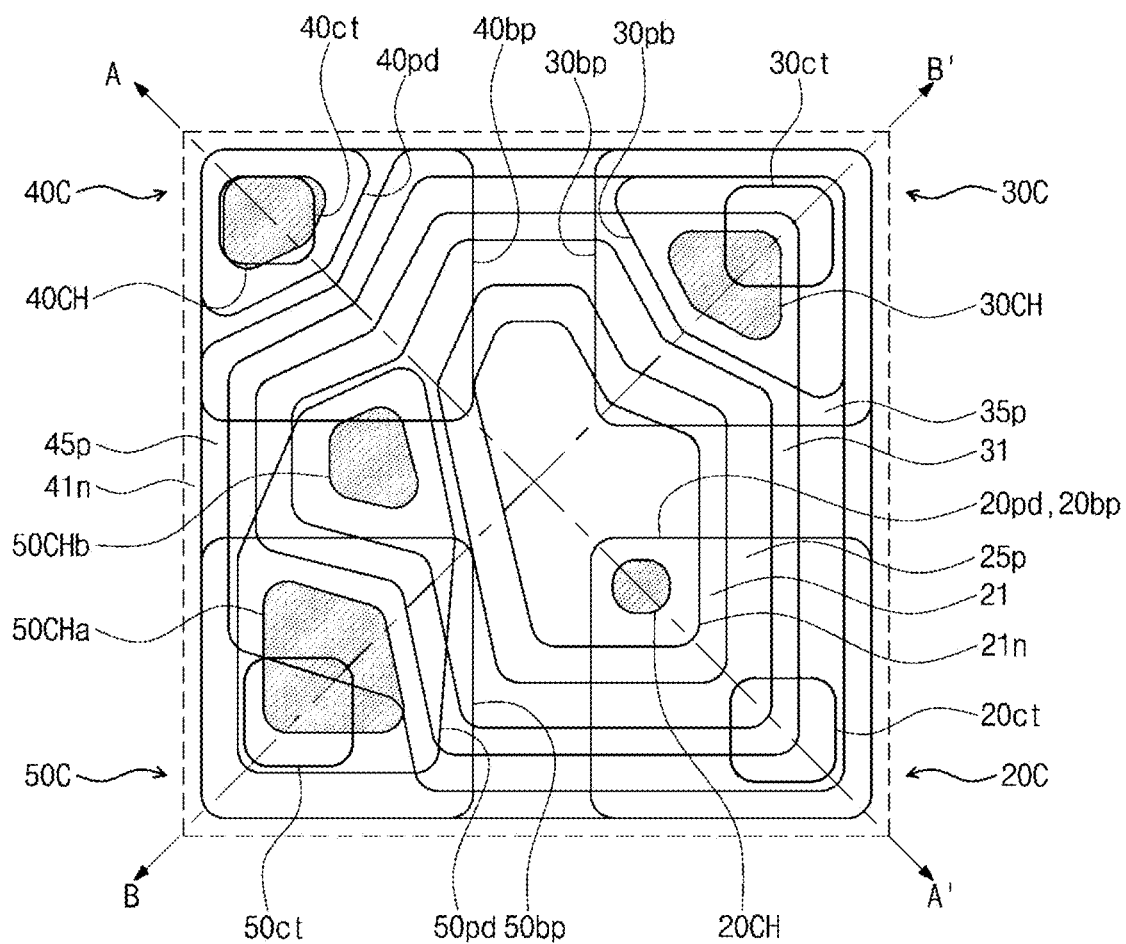
Figure 18B:
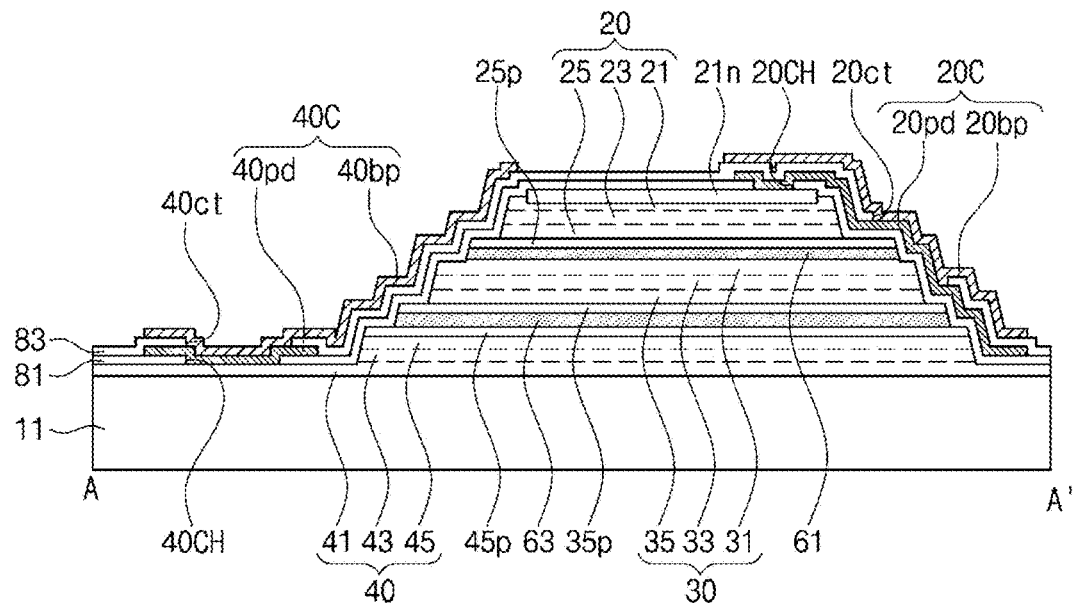
Figure 18C:
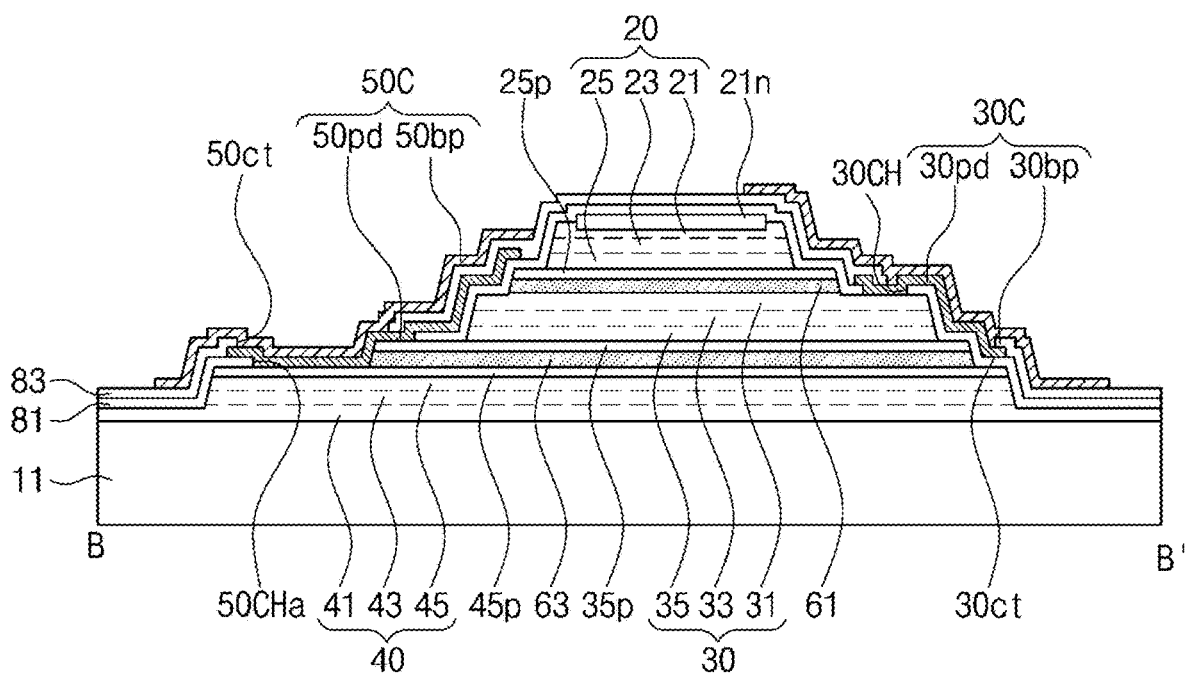

Referring to FIGS. 18A, 18B, and 18C, the first, second, third, and fourth bump electrodes 20bp, 30bp, 40bp, and 50bp are formed on the second insulating layer 83, in which the first, second, third, and fourth through holes 20ct, 30ct, 40ct, and 50ct are formed.

The first bump electrode 20bp is formed to overlap an area where the first through hole 20ct is defined, and thus, the first bump electrode 20bp is connected to the first pad 20pd through the first through hole 20ct. The second bump electrode 30bp is formed to overlap an area where the second through hole 30ct is defined, and thus, the second bump electrode 30bp is connected to the second pad 30pd through the second through hole 30ct. The third bump electrode 40bp is formed to overlap an area where the third through hole 40ct is defined, and thus, the third bump electrode 40bp is connected to the third pad 40pd through the third through hole 40ct. The fourth bump electrode 50bp is formed to overlap an area where the fourth through hole 50ct is defined, and thus, the fourth bump electrode 50bp is connected to the fourth pad 50pd through the fourth through hole 50ct.

Each of the first, second, third, and fourth bump electrodes 20bp, 30bp, 40bp, and 50bp may have an area greater than that of a corresponding pad among the first, second, third, and fourth pads 20pd, 30pd, 40pd, and 50pd. In addition, at least a portion of the first, second, third, and fourth bump electrodes 20*bp*, 30*bp*, 40*bp*, and 50*bp* may overlap with the light emitting area through which the first, second, and third epitaxial stacks 20, 30, and 40 emit light when viewed in a plan view.

The first, second, third, and fourth pads 20*pd*, 30*pd*, 40*pd*, and 50*pd* and the first, second, third, and fourth bump electrodes 20*bp*, 30*bp*, 40*bp*, and 50*bp* may be conformally formed by forming a conductive layer on the substrate 11. As described above, since the mesa structure, in which the first and second insulating layers 81 and 83 are formed, has the stepped sidewall, the conductive layer may be conformally deposited at a uniform thickness on the mesa structure in which the insulating layers 81 and 83 are formed. As the conductive layer material for forming the first, second, third, and fourth pads 20*pd*, 30*pd*, 40*pd*, and 50*pd* and/or the first, second, third, and fourth bump electrodes 20*bp*, 30*bp*, 40*bp*, and 50*bp*, at least one selected from the group consisting of Ni, Ag, Au, Pt, Ti, Al, and Cr may be used.

The light emitting device having the above-described structure may be implemented as a package, and may be mounted on another device, for example, a printed circuit board, to function as one pixel. As such, the package according to an exemplary embodiment may include a light emitting device and a fan-out line to facilitate mounting of the package to another device.

Figure 19A:
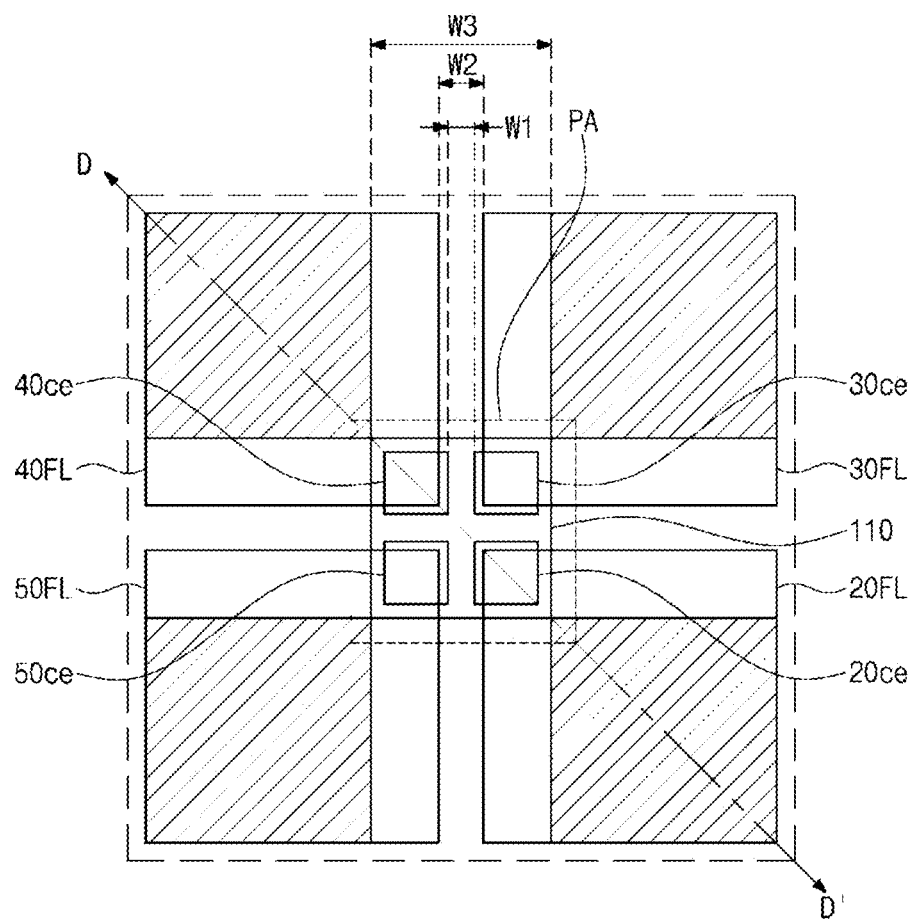
FIG. 19A is a plan view of a light emitting device package including a fan-out line and a light emitting device according to an exemplary embodiment.
Figure 19B:
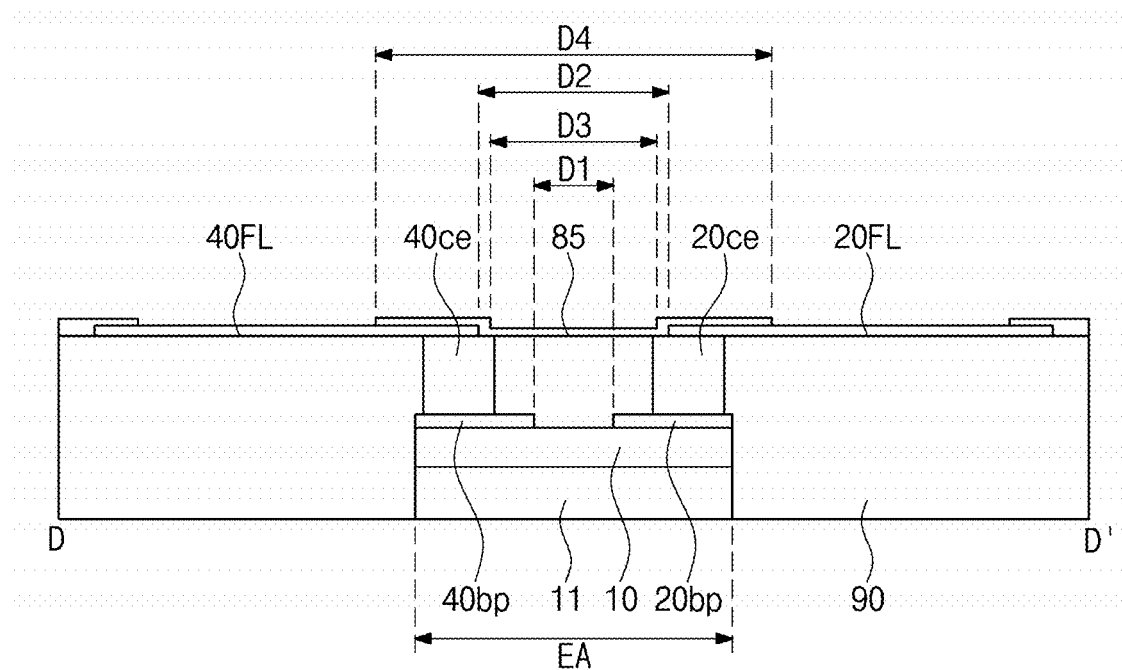
FIGS. 19B and 19C are cross-sectional views taken along line D-D' of FIG. 19A, respectively.
Figure 20A:
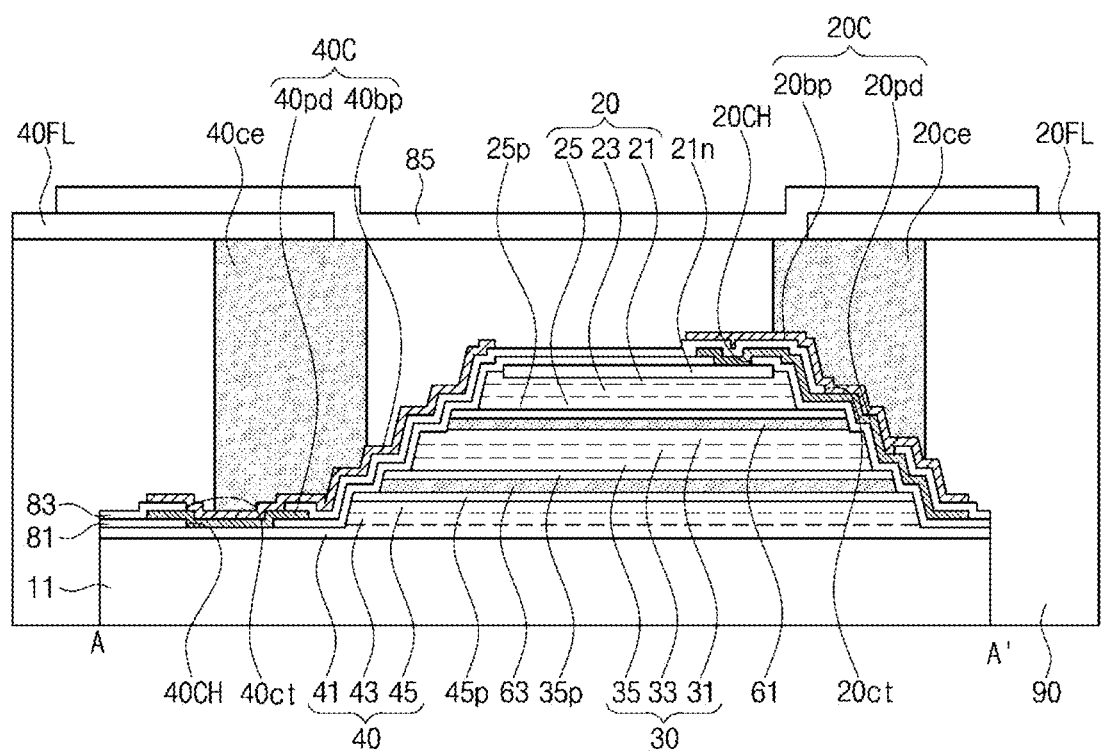
FIGS. 20A and 20B are cross-sectional views of an area "PA" of FIG. 19A according to an exemplary embodiment.
Figure 20B:
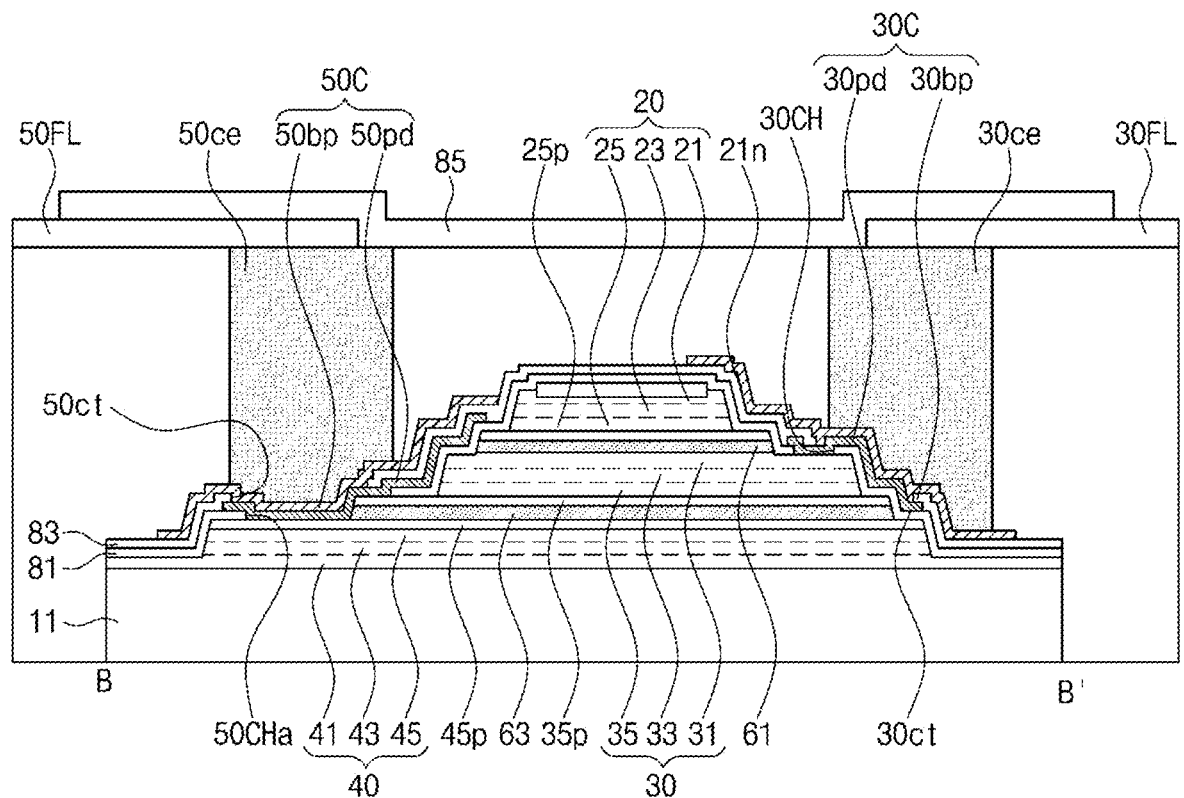

FIG. 19A is a plan view of a light emitting device implemented in a package form by applying the fan-out line to the light emitting device according to an exemplary embodiment. FIG. 19B is a cross-sectional view taken along line D-D' of FIG. 19A. In FIGS. 19A and 19B, the first to third epitaxial stacks are shown in simplified form as a light emitting structure 10, and the first, second, third, and fourth bump electrodes 20*bp*, 30*bp*, 40*bp*, and 50*bp* are simply shown as being formed on the light emitting structure 10. More particularly, the light emitting structure 10 is shown as having a flat upper surface, however, the light emitting structure 10 has a step difference and/or an inclination on its upper surface, and the connection structure between the connection electrodes and the fan-out line according to the shape of the upper surface of the light emitting structure 10 is shown in FIGS. 20A and 20B. FIGS. 20A and 20B are cross-sectional views of area c "PA" of FIG. 19A.

Referring to FIGS. 19A, 19B, 20A, and 20B, the light emitting device package includes the substrate 11, the light emitting structure 10 disposed on the substrate 11, a molding layer 90 covering the light emitting structure 10, the first, second, third, and fourth bump electrodes 20*bp*, 30*bp*, 40*bp*, and 50*bp* disposed on the light emitting structure 10, and first, second, third, and fourth fan-out lines 20FL, 30FL, 40FL, and 50FL disposed on the molding layer 90.

The molding layer 90 may be provided in substantially a plate shape, and the substrate 11 and the light emitting structure 10 may be embedded in the plate-shaped molding layer 90. Accordingly, the molding layer 90 may cover the side and upper surfaces of the substrate 11 and the light emitting structure 10, except for the rear surface of the substrate 11, and may support the light emitting structure 10 and the substrate 11 as a whole.

Figure 19C:
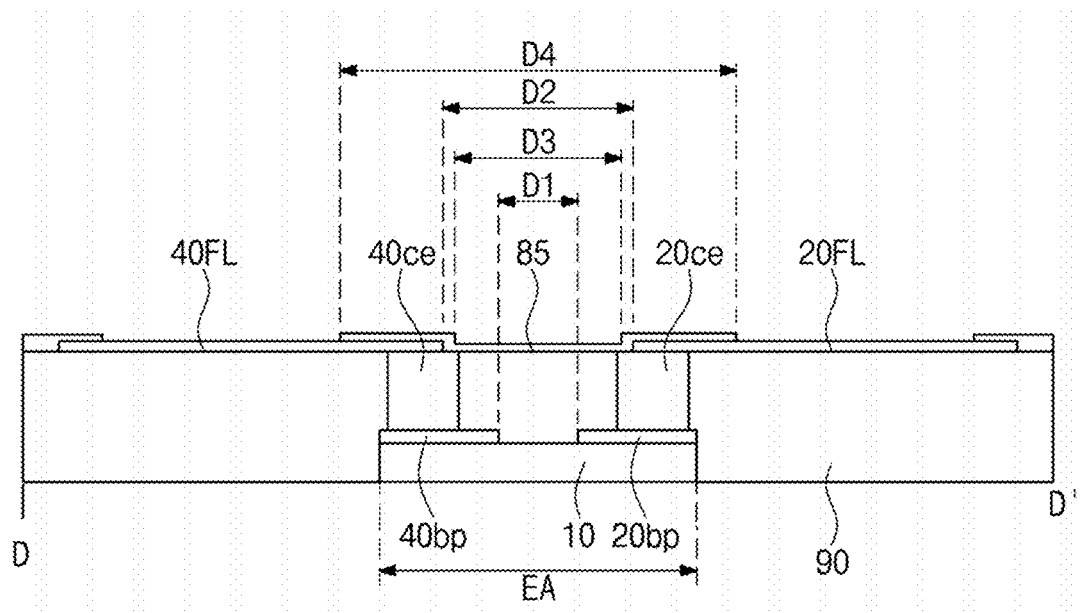
Figure 20C:
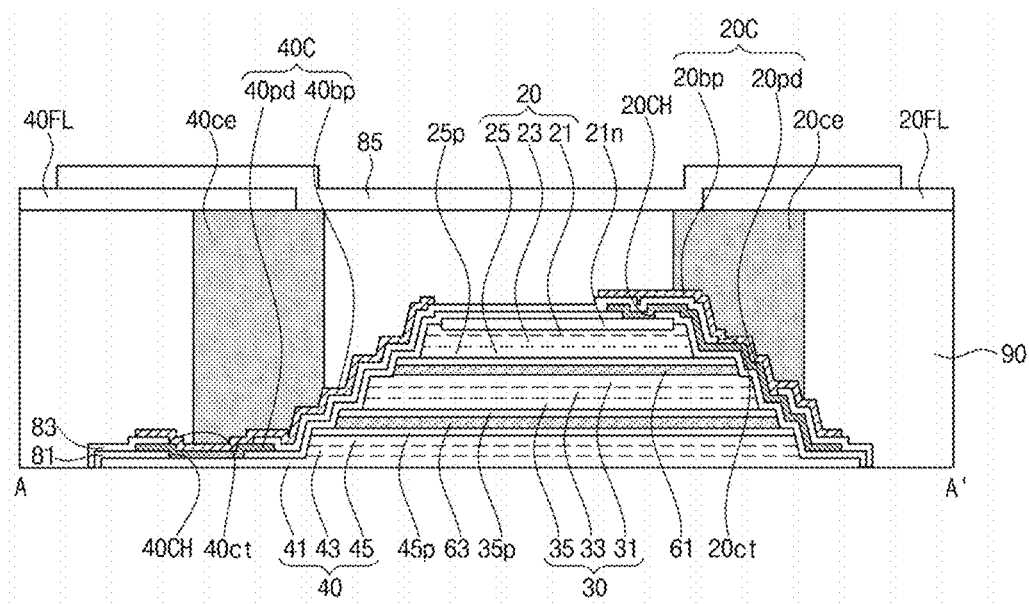
FIGS. 20C and 20D are cross-sectional views of an area "PA" of FIG. 19A according to another exemplary embodiment.
Figure 20D:
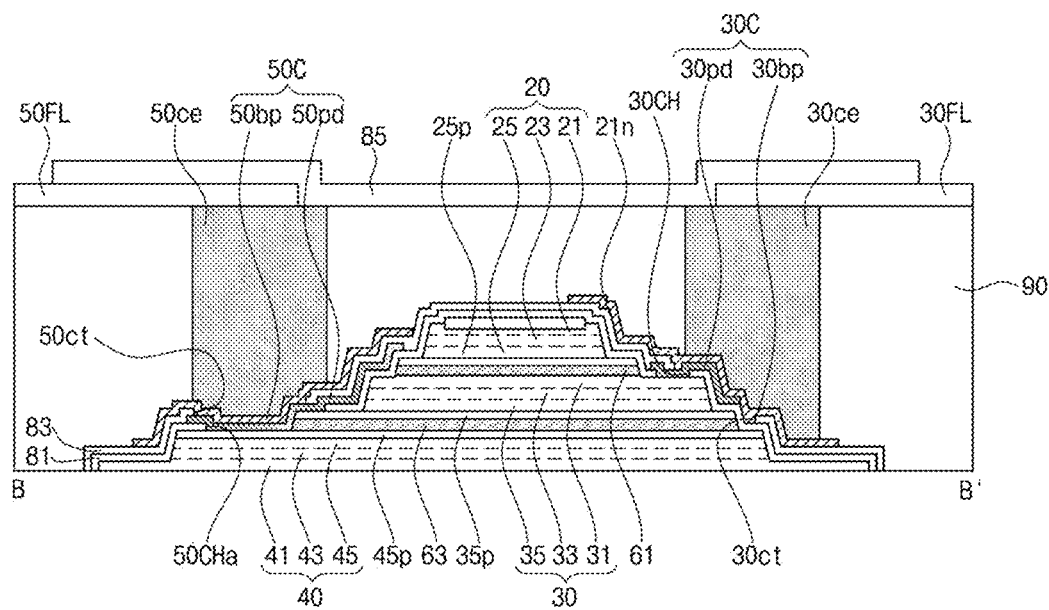

The inventive concepts are not limited thereto, and the light emitting device package according to other exemplary embodiments may have a different structure according to the shape of the substrate 11. FIGS. 19C, 20C, and 20D show cross-sectional views corresponding to FIGS. 19B, 20A, and 20B with the substrates removed, respectively.

According to an exemplary embodiment, the substrate 11 may be removed by a method, such as laser lift-off, after being used as a growth substrate. As shown in FIGS. 19C, 20C, and 20D, the substrate used as the growth substrate may be removed, so that the lower third epitaxial stack 40 may be exposed to the outside. In this case, the molding layer 90 may cover only the side surface of the epitaxial layers when the growth substrate is removed, and the substrate 11 has the driving circuit unit.

In the illustrated exemplary embodiment, at least a portion of the light emitting structure 10 and an end of the substrate 11 may coincide with each other. More particularly, when viewed in a plan view, the end of the n-type semiconductor layer 41 of the third epitaxial stack 40 and the end of the substrate 11 may coincide with each other in position, and when viewed in a cross section, the side surface of the n-type semiconductor layer 41 of the third epitaxial stack 40 and the side surface of the substrate 11 may be disposed on substantially the same plane.

The molding layer 90 may include an insulating material, for example, an organic polymer, without being limited thereto. The molding layer 90 may include a light blocking material to prevent light emitted from the light emitting structure 10 from being mixed with light emitted from an adjacent light emitting structure. For example, the molding layer 90 may include a black-colored organic polymer. In addition, the black color and the opacity of the molding layer 90 may be partially adjusted by adjusting the carbon content that makes the black color. For example, when using a molding layer having a low opacity by adjusting the carbon content of the molding layer 90, matching the mask pattern during subsequent process of forming a fan-out lines to be described later may become easier.

Since the molding layer 90 covers the side and upper surfaces of the light emitting structure 10, the molding layer 90 may prevent light emitted from the light emitting structure 10 from traveling toward the side and upper surfaces of the light emitting structure 10, and thus, light may travel towards the substrate 11. In this case, the substrate 11 may serve as a light guide member through which light emitted from the light emitting structure 10 passes. According to the illustrated exemplary embodiment, since the molding layer 90 covers the side surfaces of the substrate 11, the molding layer 90 may prevent light from exiting from the side surface of the substrate 11 that functions as the light guide member. In this manner, since the molding layer 90 is not disposed on the rear surface of the substrate 11, only light emitted in a direction, to which the rear surface of the light emitting structure 10 faces, may travel without being blocked by the molding layer 90.

The first, second, third, and fourth fan-out lines 20FL, 30FL, 40FL, and 50FL are disposed on the molding layer 90, and may be connected to an external device. The first, second, third, and fourth fan-out lines 20FL, 30FL, 40FL, and 50FL may have an area greater than that of the first, second, third, and fourth bump electrodes 20*bp*, 30*bp*, 40*bp*, and 50*bp* of the light emitting structure 10, and thus, the first, second, third, and fourth fan-out lines 20FL, 30FL, 40FL, and 50FL may be easily electrically and/or physically connected to the external device.

The first, second, third, and fourth fan-out lines 20FL, 30FL, 40FL, and 50FL may be connected to the first, second, third, and fourth bump electrodes 20*bp*, 30*bp*, 40*bp*, and 50*bp* in a one-to-one correspondence.

First, second, third, and fourth connection electrodes 20*ce*, 30*ce*, 40*ce*, and 50*ce* may be provided between the first, second, third, and fourth fan-out lines 20FL, 30FL, 40FL, and 50FL and the first, second, third, and fourth bump electrodes 20*bp*, 30*bp*, 40*bp*, and 50*bp* to connect the first, second, third, and fourth fan-out lines 20FL, 30FL, 40FL, and 50FL to the first, second, third, and fourth bump electrodes 20bp, 30bp, 40bp, and 50bp in the one-to-one correspondence. For example, the first connection electrode 20ce may be provided between the first fan-out line 20FL and the first bump electrode 20bp, the second connection electrode 30ce may be provided between the second fan-out line 30FL and the second bump electrode 30bp, the third connection electrode 40ce may be provided between the third fan-out line 40FL and the third bump electrode 40bp, and the fourth connection electrode 50ce may be provided between the fourth fan-out line 50FL and the fourth bump electrode 50bp. The molding layer 90 may surround each of the first, second, third, and fourth connection electrodes 20ce, 30ce, 40ce, and 50ce.

According to the illustrated exemplary embodiment, the first, second, third, and fourth fan-out lines 20FL, 30FL, 40FL, and 50FL may be attached to the molding layer 90, and thus, an overall rigidity of the light emitting device package may be increased. For example, since the molding layer 90 has brittleness, there may be a difference in thickness between portions where the light emitting structure 10 and the substrate 11 are provided and portions where the light emitting structure 10 and the substrate 11 are not provided. As such, the rigidity of the molding layer 90 may be different depending on areas of the package. Accordingly, forming the first, second, third, and fourth fan-out lines 20FL, 30FL, 40FL, 50FL on the molding layer 90 may increase the overall rigidity of the molding layer 90.

In addition, in the illustrated exemplary embodiment, the first, second, third, and fourth fan-out lines 20FL, 30FL, 40FL, and 50FL may cover not only the area that overlaps with the light emitting structure 10 but also the area that does not overlap with the light emitting structure 10. For example, the first, second, third, and fourth fan-out lines 20FL, 30FL, 40FL, and 50FL may extend outwardly from the overlapping area with the light emitting structure 10. The first, second, third, and fourth fan-out lines 20FL, 30FL, 40FL, and 50FL may be provided as a conductor capable of easily distributing heat, and thus, a heat distribution effect may be improved by the first, second, third, and fourth fan-out lines 20FL, 30FL, 40FL, and 50FL.

In the illustrated exemplary embodiment, a third insulating layer 85 is disposed on the molding layer 90, on which the first, second, third, and fourth fan-out lines 20FL, 30FL, 40FL, and 50FL are formed. The third insulating layer 85 is provided with openings defined therethrough to expose portions of the upper surface of the first, second, third, and fourth fan-out lines 20FL, 30FL, 40FL, and 50FL. When the upper surface of the first, second, third, and fourth fan-out lines 20FL, 30FL, 40FL, and 50FL is partially exposed, other devices may be electrically connected to the first, second, third, and fourth fan-out lines 20FL, 30FL, 40FL, and 50FL through the exposed upper surface. The third insulating layer 85 is disposed between the fan-out lines adjacent to each other, and extends to the upper surface of the fan-out lines to partially cover the upper surface of the fan-out lines. In this manner, a distance between the exposed portions of the fan-out lines adjacent to each other is greater than a distance between two adjacent bump electrodes, and thus, a probability of disconnection of the fan-out lines may be reduced when the fan-out lines are connected to the external device.

According to an exemplary embodiment, the first, second, third, and fourth bump electrodes 20bp, 30bp, 40bp, and 50bp may overlap with the light emitting area EA, in which the light emitting structure 10 is disposed and light is emitted therefrom. The light emitting area EA of the light emitting structure 10 may be changed depending on the size of the light emitting structure 10. However, since a size of the light emitting structure 10 may be very small, the light emitting area EA may be formed in a very narrow area, and thus, the first, second, third, and fourth bump electrodes 20bp, 30bp, 40bp, and 50bp may overlap with the light emitting area EA due to the small size the light emitting structure 10. The first, second, third, and fourth bump electrodes 20bp, 30bp, 40bp, and 50bp are connected to the first, second, third, and fourth fan-out lines 20FL, 30FL, 40FL, and 50FL by the first, second, third, and fourth connection electrodes 20ce, 30ce, 40ce, and 50ce in the overlapping area between the first, second, third, and fourth bump electrodes 20bp, 30bp, 40bp, and 50bp and the first, second, third, and fourth fan-out lines 20FL, 30FL, 40FL, and 50FL. In this manner, the first, second, third, and fourth fan-out lines 20FL, 30FL, 40FL, and 50FL may be disposed outside of the light emitting area EA so as not to overlap with the light emitting area EA. More particularly, the portions of the first, second, third, and fourth fan-out lines 20FL, 30FL, 40FL, and 50FL, which are exposed without being covered by the third insulating layer 85 may not overlap with the light emitting area EA. As such, the exposed portion of the fan-out lines may be spaced apart from the light emitting area EA.

For example, in FIG. 19A, when a width between two connection electrodes adjacent to each other in a horizontal direction is referred to as a "first width W1" and a width between two fan-out lines adjacent to each other in the horizontal direction is referred to as a "second width W2", the second width W2 may be greater than the first width W1. In addition, when a width between the exposed portions of the two fan-out lines adjacent to each other, which are not covered by the third insulating layer 85 and are indicated with a darker color, is referred to as a "third width W3", the third width W3 may be greater than each of the first and second widths W1 and W2. In the illustrated exemplary embodiment, since the distance between the portions of the first, second, third, and fourth fan-out lines 20FL, 30FL, 40FL, and 50FL exposed without being covered by the third insulating layer 85 is formed to be relative large, the risk of disconnection may be reduced when the exposed portions of each of the fan-out lines are electrically connected to other components.

Further, as shown in FIG. 19B, when a distance between two bump electrodes adjacent to each other is referred to as a "first distance D1", a distance between two fan-out lines adjacent to each other is referred to as a "second distance D2", and a distance between two connection electrodes adjacent to each other is referred to as a "third distance D3", the second distance D2 may be greater than the first distance D1. In addition, the third distance D3 may have a value between the first distance D1 and the second distance D2.

In the two adjacent fan-out lines, when a distance between the exposed portions without being covered by the third insulating layer 85 is referred to as a "fourth distance D4", the fourth distance D4 may be greater than the first, second, and third distances D1, D2, and D3.

Accordingly, an area of the fan-out lines overlapped with the light emitting area EA may be less than an area of the bump electrodes overlapped with the light emitting area EA. In this manner, the disconnection of the fan-out lines may be reduced. When the fan-out lines are formed to overlap with the light emitting area EA, the probability of disconnection of the fan-out lines may be increased since the distance between the fan-out lines adjacent to each other may be come small. Accordingly, the fan-out lines according to an exemplary embodiment may be formed not to overlap with the light emitting area EA of the light emitting structure, so that the distance between the adjacent fan-out lines is as wide as possible.

The light emitting device having the above-described fan-out structure may be easily mounted on the external device, e.g., a surface of the printed circuit board, in the form of a package. A method of manufacturing the light emitting device package having the fan-out structure will be described in detail below.

FIGS. 21A to 21I are cross-sectional views sequentially showing the method of manufacturing the light emitting device package according to an exemplary embodiment. In the following drawings, for the convenience of explanation, some components will be omitted, and the substrate and the light emitting structure will be simply described as one light emitting unit 10UT.

Figure 21A:
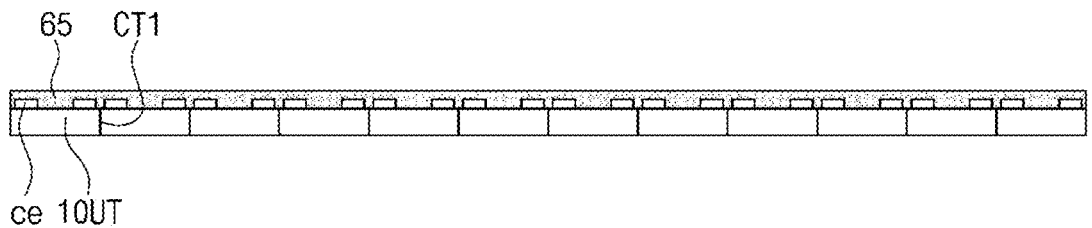
FIGS. 21A, 21B, 21C, 21D, 21E, 21F, 21G, 21H, and 21I are cross-sectional views illustrating a method of manufacturing a light emitting device package according to an exemplary embodiment.

Referring to FIG. 21A, a plurality of light emitting units 10UT is formed on the substrate 11 as described above, and connection electrodes ce are formed on each of the light emitting units 10UT using a plating process, for example. Then, each of the light emitting units 10UT is substantially cut along a first cutting line CT1, for example, to a portion of the substrate 11, and thus, the light emitting units 10UT are substantially separated from each other. A third adhesive layer 65 is disposed on the light emitting units 10UT, and the light emitting units 10UT are supported by the third adhesive layer 65. In this case, the third adhesive layer 65 may be a pressure sensitive adhesive layer that may be separated depending on conditions, rather than for permanent adhesion. However, the inventive concepts are not limited thereto. For example, in some exemplary embodiments, a plurality of light emitting units 10UT may be disposed on a temporary substrate, and the third adhesive layer 65 may be disposed on top of the light emitting units 10UT, on which the connection electrodes ce are formed. Then, the light emitting units 10UT may be cut along the first cutting line CT1 for individualization, while the third adhesive layer 65 may retain the individualized light emitting units 10UT together for subsequent processes.

Figure 21B:
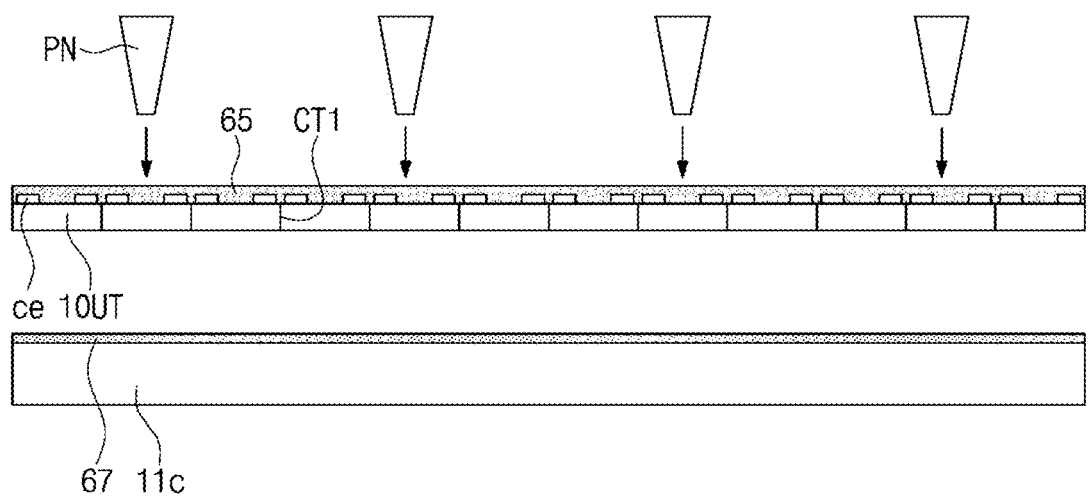

Referring to FIG. 21B, a fourth adhesive layer 67 is formed on a temporary substrate 11c, and the light emitting units 10UT attached to the third adhesive layer 65 are placed above the fourth adhesive layer 67. Then, at least some of the light emitting units 10UT are selectively pressed downward towards the third adhesive layer 65 by using a tool, such as a pin PN. The fourth adhesive layer 67 may be a pressure sensitive layer, and may have an adhesive strength greater than that of the third adhesive layer 65.

In the illustrated exemplary embodiment, only specific light emitting units 10UT may be moved on the temporary substrate 11c by using the tool, such as the pin PN. Further, since the distance between the light emitting units 10UT adjacent to each other may be adjusted in various ways, the light emitting units 10UT may be arranged at regular distances substantially simultaneously. When the distance between the light emitting units 10UT adjacent to each other is sufficiently maintained, the areas to which the fan-out lines are to be formed may be secured.

When the light emitting units 10UT are transferred to another component, e.g., the temporary substrate 11c, the light emitting units 10UT may move in various ways other than the above-described method. For example, the light emitting units 10UT may be transferred in various ways, such as by using a pick and place apparatus or using a selective laser lift-off method.

Figure 21C:
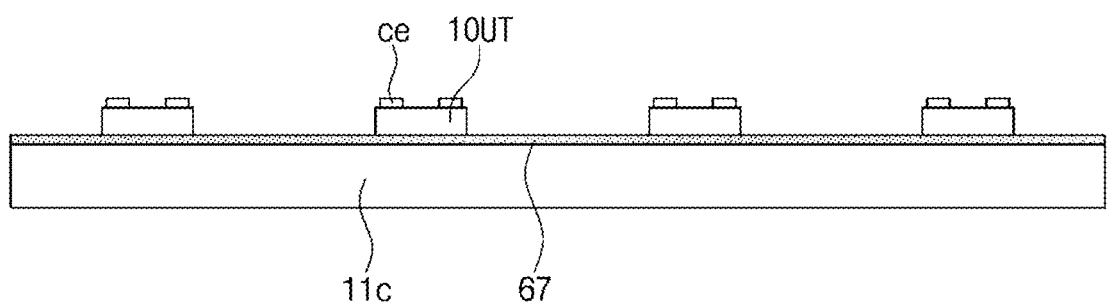

The light emitting units 10UT pressed downwardly may be transferred to the temporary substrate 11c by the fourth adhesive layer 67 as shown in FIG. 21C.

Figure 21D:
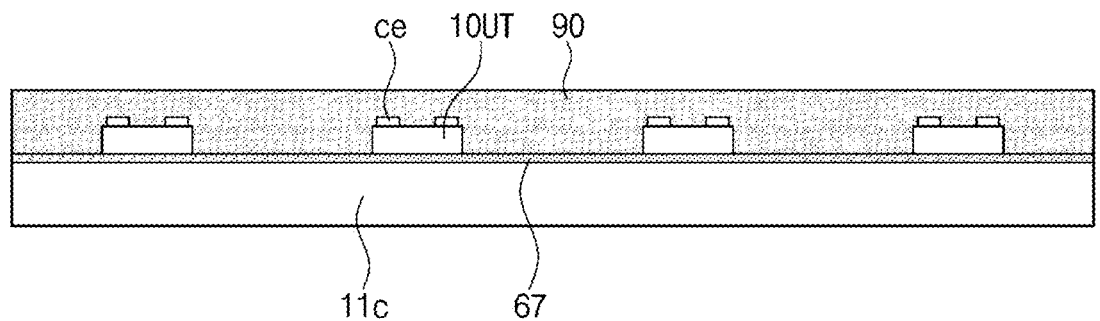

Referring to FIG. 21D, the molding layer 90 may be formed on the temporary substrate 11c to cover the light emitting units 10UT disposed on the temporary substrate 11c. The molding layer 90 may include an organic polymer, for example, which may block light and be cured after being coated or printed on the light emitting units 10UT.

Figure 21E:
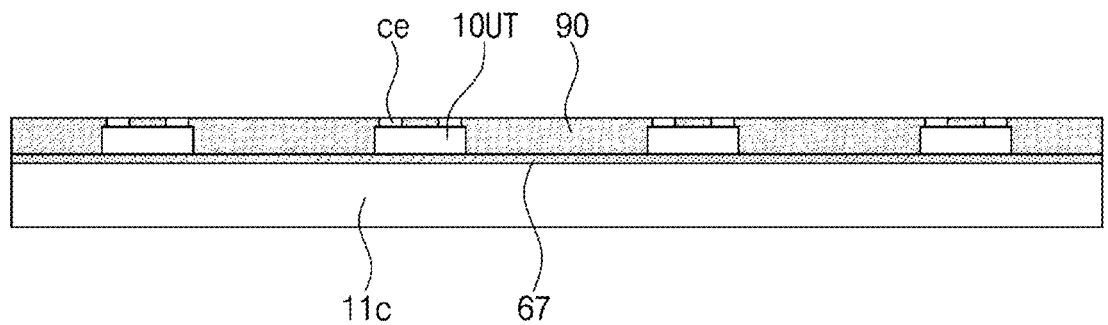

Referring to FIG. 21E, the molding layer 90 formed on the light emitting units 10UT may be chemically and/or physically polished, such that an upper surface of the molding layer 90 becomes substantially flat with an upper surface of the connection electrodes ce. In this manner, the upper surface of the connection electrodes ce disposed on the light emitting units 10UT is exposed to the outside.

Figure 21F:
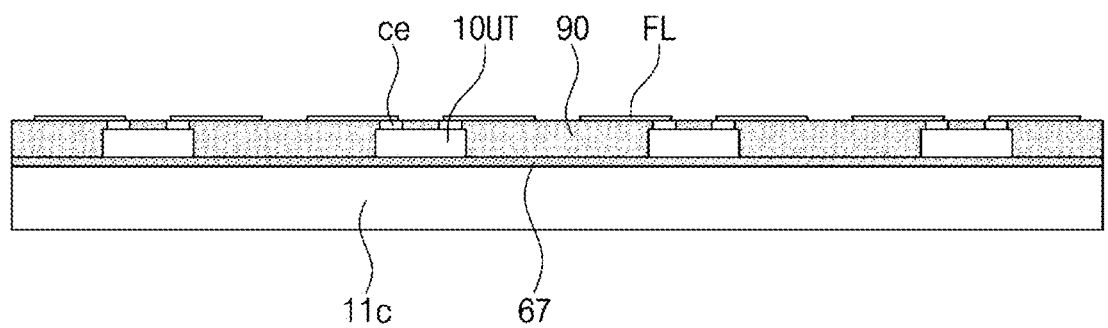

Referring to FIG. 21F, the fan-out lines FL are formed on the molding layer 90. The fan-out lines FL overlap with the connection electrodes ce so as to be connected to the connection electrodes ce, respectively.

Figure 21G:
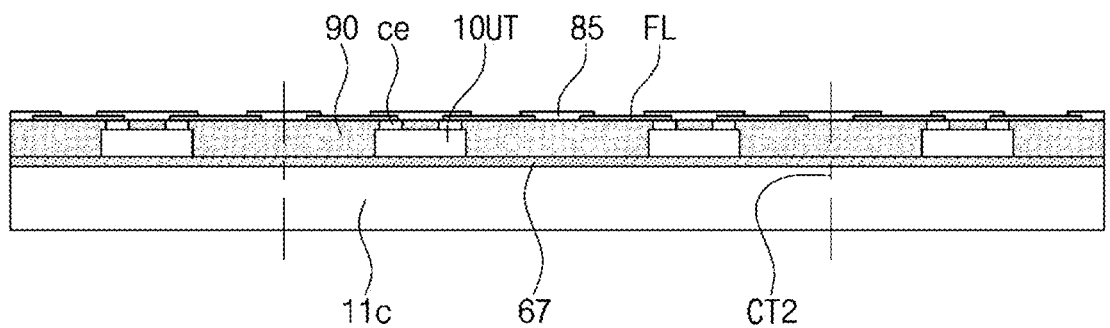

Referring to FIG. 21G, the third insulating layer 85 is formed on the molding layer 90, on which the fan-out lines are formed. The third insulating layer 85 is formed between two fan-out lines FL adjacent to each other and partially extends on the upper surface of the fan-out lines FL. Accordingly, the distance between the exposed portions of the two fan-out lines FL adjacent to each other may become greater than a distance between two actual fan-out lines.

When the molding layer 90 is cut along a second cutting line CT2, such that the light emitting units 10UT formed with the fan-out lines FL are included in the package in a predetermined size, the light emitting device package is formed. In this case, the molding layer 90 may be cut so that the light emitting units 10UT are separately included in the package, or may be cut into a large area such that the plural light emitting units 10UT are included in the package. The molding layer 90 may be cut to have a predetermined number and area of the light emitting units 10UT in consideration of the device to which the light emitting units 10UT are to be mounted.

Figure 21H:
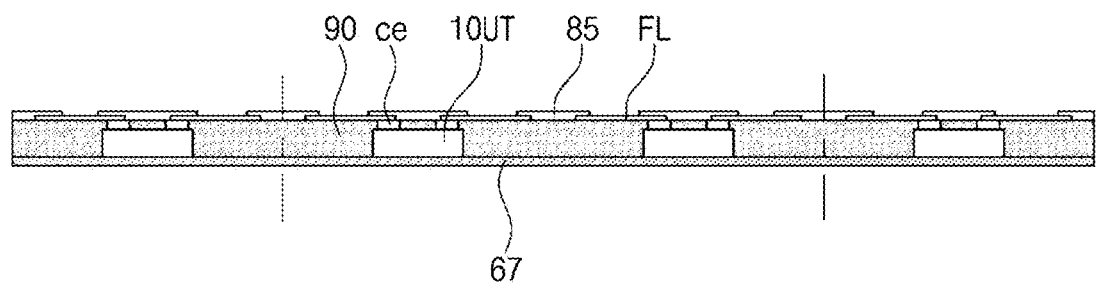

In the illustrated exemplary embodiment, the temporary substrate 11c is shown in the process of cutting the molding layer 90, however, the cutting process may be performed on areas except for the temporary substrate 11c. The temporary substrate 11c is removed as shown in FIG. 21H. The temporary substrate 11c may be removed by the laser lift-off process, or the like.

Figure 21I:
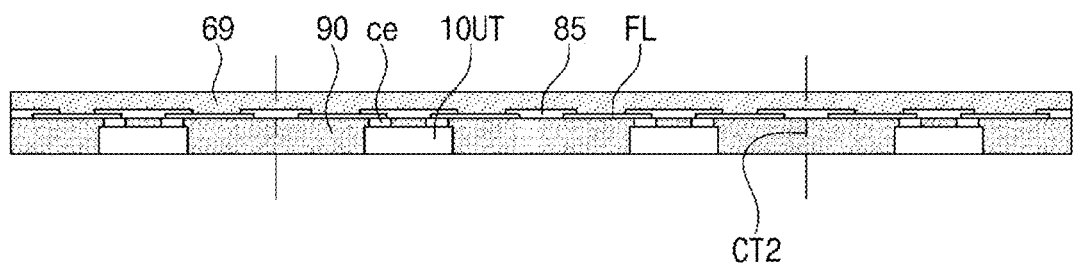

Referring to FIG. 21I, a fifth adhesive layer 69 is provided on the upper surface of the light emitting units 10UT, and the light emitting device package is attached to the fifth adhesive layer 69. The fifth adhesive layer 69 may be the pressure sensitive adhesive layer, and the fourth adhesive layer 67 formed on a lower portion of the light emitting device package is removed so as to expose the lower portion of the light emitting device package to the outside. The light emitting device package including the light emitting units 10UT may be transferred to another device while being attached to the fifth adhesive layer 69, and may be attached to the surface of another device.

In this manner, the fan-out structure of the light emitting devices according to an exemplary embodiment may be easily formed.

As described above, the light emitting device package may be provided as a module of various sizes. In particular, various numbers of light emitting device packages may be included in one module.

Figure 22A:
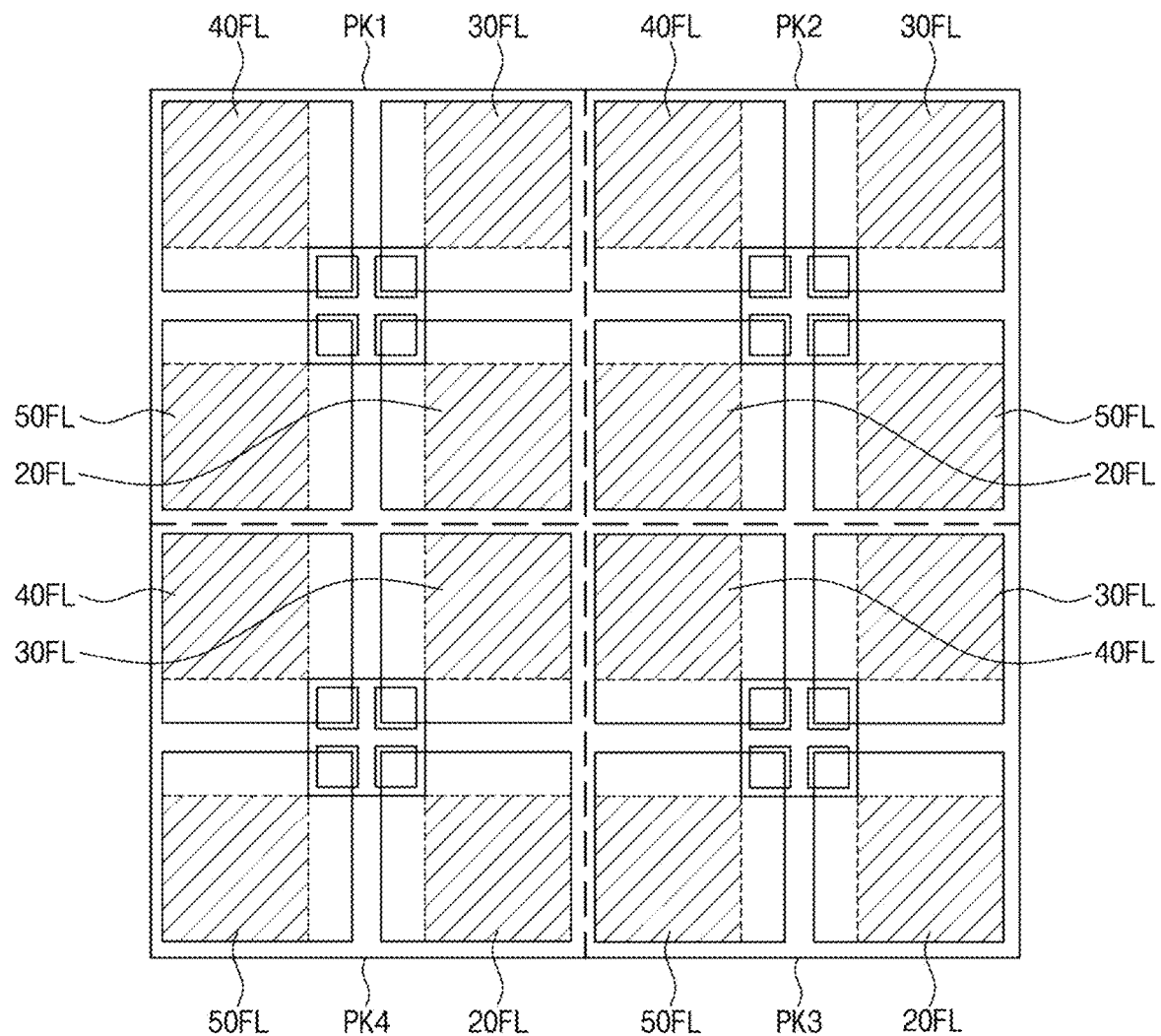
FIGS. 22A and 22B are plan views of a module including a light emitting device package according to an exemplary embodiment according to exemplary embodiments.
Figure 22B:
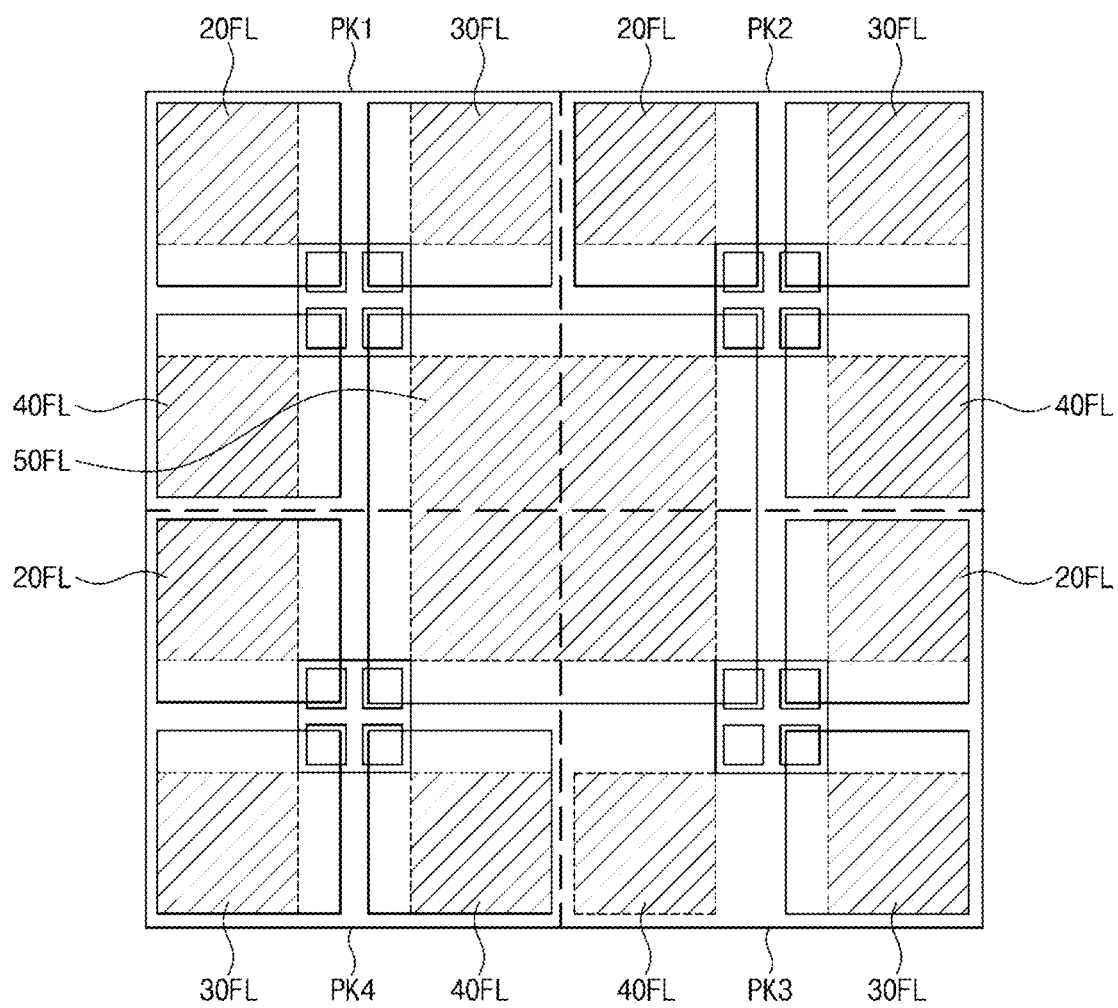

FIGS. 22A and 22B are plan views of modules including the light emitting device packages according to exemplary embodiments.

Referring to FIG. 22A, four light emitting device packages may be arranged in a matrix form having two rows by two columns in one module. The number or arrangement of the light emitting device packages may be changed in various ways depending on the application of the module. When four light emitting device packages are respectively referred to as first, second, third, and fourth light emitting device packages PK1, PK2, PK3, and PK4, the first, second, third, and fourth light emitting device packages PK1, PK2, PK3, and PK4 may be light emitting device packages that emit the same light or different lights from each other. In addition, even when the light emitting device packages emit the same color light, positions of each light emitting structure and the fan-out lines connected to the light emitting structures may be arranged differently.

According to an exemplary embodiment, each of the plural light emitting device packages provided in one module may be manufactured together, when being manufactured.

More particularly, referring to FIG. 22B, the lines applied with the same voltage may be formed as one single line. For example, when the light emitting device packages are employed as the pixels of a display device, the fourth fan-out lines 50FL of the first, second, third, and fourth light emitting device packages PK1, PK2, PK3, and PK4 may be integrally formed as a single non-separated element after disposing the first, second, third, and fourth light emitting device packages PK1, PK2, PK3, and PK4 to be adjacent to each other, when forming the fourth fan-out lines 50FL, to which the same common voltage is applied. In this case, an area of the one fourth fan-out line 50FL that is electrically connected to each of the first, second, third, and fourth light emitting device packages PK1, PK2, PK3, and PK4 may be increased. As such, the fourth fan-out line 50FL may be easily connected to an external device, and the heat-discharge effect may be improved due to the large area of the fourth fan-out line 50FL. In addition, the arrangement of redistribution lines may be facilitated when the redistribution lines to be described later are added to the light emitting device package.

The inventive concepts are not limited to the fan-out structure described above, and in some exemplary embodiments, additional redistribution lines may be formed in the light emitting device package to increase a degree of freedom regarding the positions of forming the fan-out lines and the electrodes.

Figure 23A:
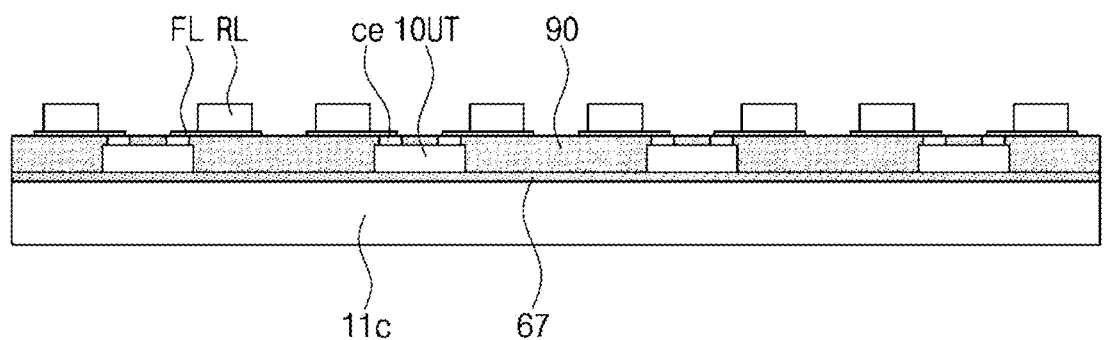
FIGS. 23A and 23B are cross-sectional views of a light emitting device package including additional redistribution lines are formed according to an exemplary embodiment.
Figure 23B:
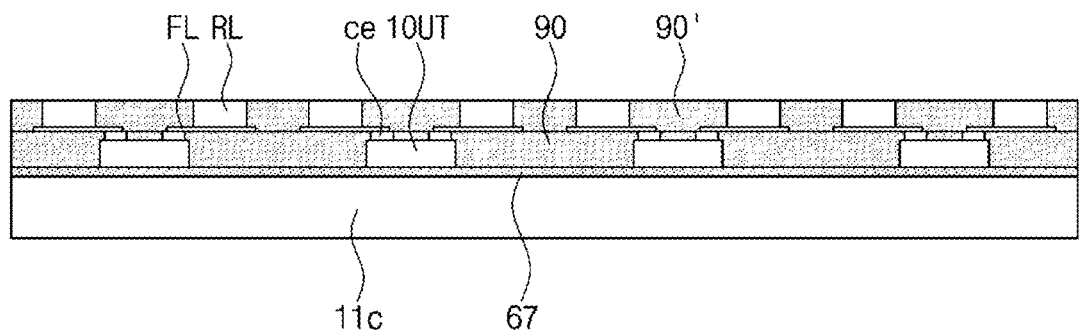
Figure 24A:
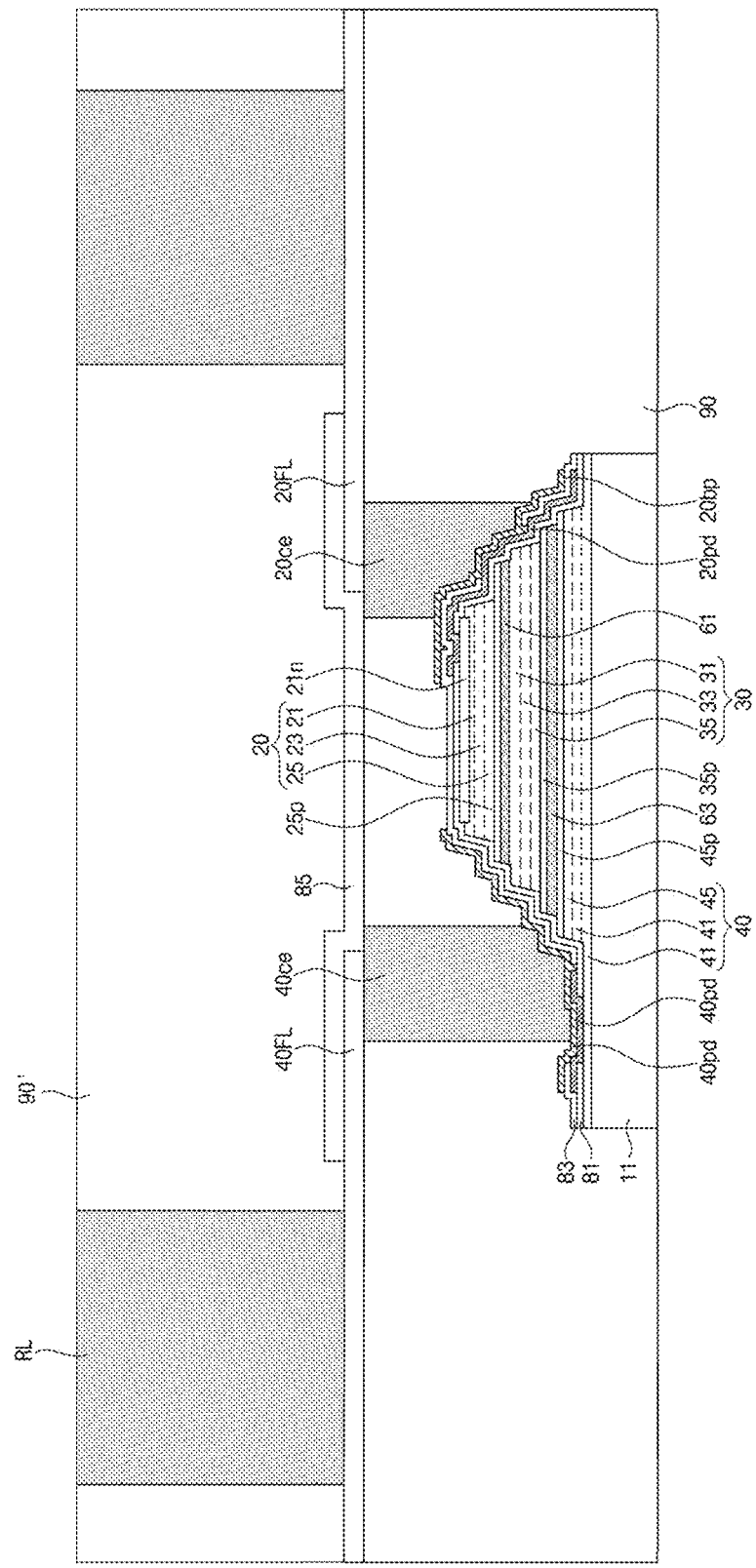
FIGS. 24A and 24B are a cross-sectional views one light emitting device package among the light emitting device packages shown in FIGS. 23A and 23B, respectively.
Figure 24B:
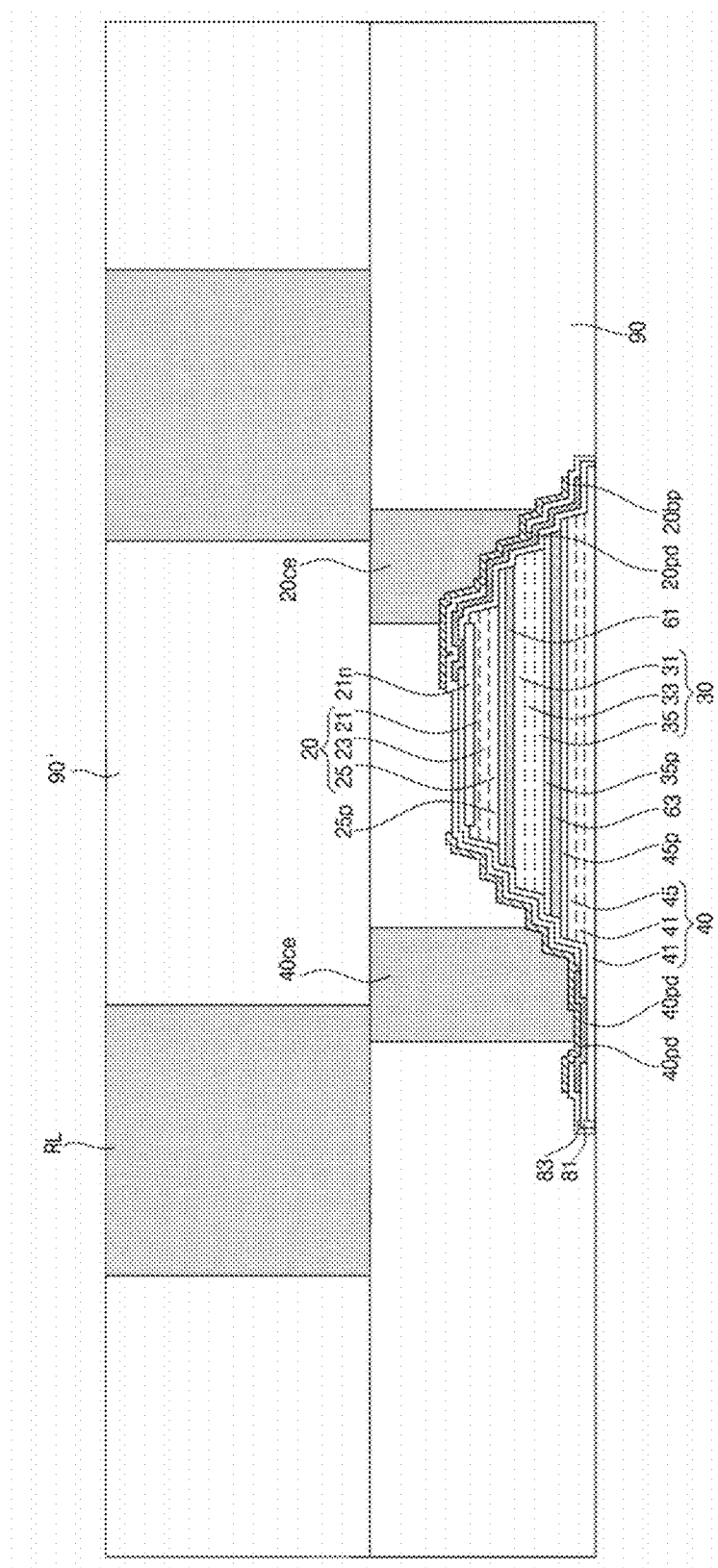

FIGS. 23A and 23B are cross-sectional views of a light emitting device package, on which redistribution lines are formed according to an exemplary embodiment, and FIGS. 24A and 24B are cross-sectional views corresponding to one light emitting device package in the light emitting device package shown in FIGS. 23A and 23B according to an exemplary embodiment. In particular, FIG. 24A is a cross-sectional view of a light emitting device package having the substrate 11 and FIG. 24B is a cross-sectional view of a light emitting device package when the substrate is used as a growth substrate and then removed by a method, such as laser lift-off.

Referring to FIGS. 23A, 23B, and 24A, the redistribution lines RL may be further formed on the temporary substrate 11c, on which the fan-out lines FL are formed by a plating process, for example. The redistribution lines RL may be disposed to correspond to the fan-out lines FL, respectively. Then, an additional molding layer 90' may be formed on the temporary substrate 11c, on which the redistribution lines RL are formed, and the additional molding layer 90' may be polished until an upper surface of the redistribution lines RL is exposed. The additional molding layer 90' may have a material having a black color or a low opacity, and may have a color different from that of the molding layer 90.

When adding the redistribution lines RL, a distance between the redistribution lines RL adjacent to each other may be different from a distance between the first, second, third, and fourth fan-out lines 20FL, 30FL, 40FL, and 50FL adjacent to each other. In particular, the distance between the redistribution lines RL adjacent to each other may be greater than the distance between the first, second, third, and fourth fan-out lines 20FL, 30FL, 40FL, and 50FL adjacent to each other, and thus, a probability of disconnection between the redistribution lines RL adjacent to each other may be further reduced.

Next, referring to FIGS. 23A, 23B, and 24B, since the substrate is removed by a laser lift-off method, after the substrate is used as a growth substrate in the light emitting device package according to the illustrated exemplary embodiment, a separate substrate is not provided below the lowest epitaxial stack, i.e, the third epitaxial stack 40, and the rear surface of the third epitaxial stack 40 may be exposed to the outside.

The first to third fan-out lines may be provided as in the above-described exemplary embodiment, but may be omitted depending on the position of the redistribution lines RL. In the illustrated exemplary embodiment, the first to third fan-out wires may be omitted, and the first to fourth connection electrodes 20ce, 30ce, 40ce, and 50ce may be directly connected to the redistribution lines RL, as shown as FIG. 24B. In this case, the redistribution liens RL may overlap the first to fourth connection electrodes 20ce, 30ce, 40ce, and 50ce in a plan view, and may be formed to be narrower than when fan-out lines are formed.

Figure 25:
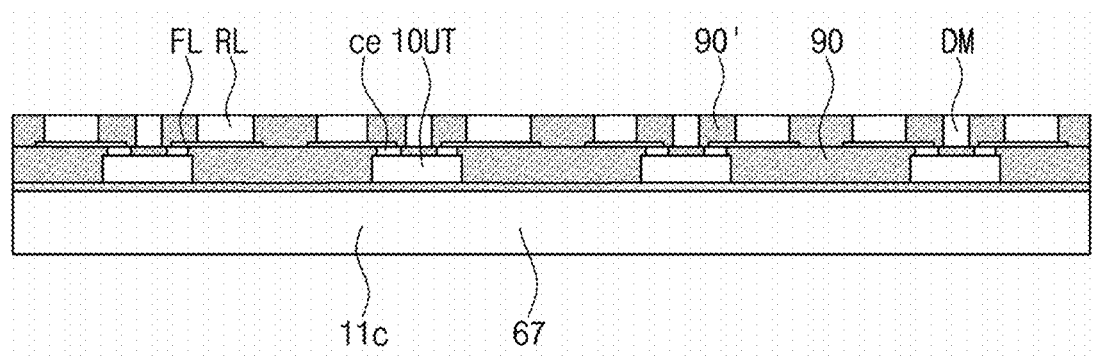
FIG. 25 is a cross-sectional view showing a dummy electrode formed on the light emitting device package to which the additional redistribution lines are formed.

FIG. 25 is a cross-sectional view of a dummy electrode formed on the light emitting device package, to which the additional redistribution lines are formed, according to an exemplary embodiment.

Referring to FIG. 25, according to an exemplary embodiment, when the redistribution lines are formed, dummy electrodes DM may be additional formed, which are insulated from the first, second, third, and fourth fan-out lines 20FL, 30FL, 40FL, and 50FL. The dummy electrodes DM may be disposed between two redistribution lines RL adjacent to each other, and may include a material having a high heat conductivity. The dummy electrodes DM may be disposed above each light emitting structure, or in areas adjacent to the light emitting structure to efficiently distribute the heat generated from each light emitting structure. Since the dummy electrodes DM include the material having the high heat conductivity, and distribute the heat therearound, the heat-discharge effect may be improved. However, the inventive concepts are not limited to a particular positions of the dummy electrodes, and the dummy electrodes may be formed at other positions, as needed, to improve the heat-discharge effect.

In addition, the inventive concepts are not limited to the structure of the redistribution lines as shown in FIGS. 23A, 23B, 24, and 25, and in some exemplary embodiments, the shape of the redistribution lines may be variously changed. In addition, the redistribution lines are illustrated as having a single-layer structure, however, in some exemplary embodiments, the redistribution lines may have a multi-layer structure. The shape of the redistribution lines may be changed in various ways depending on the device to which the light emitting device package is to be applied, thereby facilitating the mounting process of the light emitting device package.

As described above, when the redistribution lines are added to the light emitting device package, the rigidity of the light emitting device package may be increased by the additional molding layer 90'. This is because the brittleness of the molding layer 90 may be reduced by the additional molding layer 90' even though the brittleness of the molding layer 90 is large.

According to an exemplary embodiment, the light emitting device package may be mounted on various devices, e.g., a metal substrate or a printed circuit board, on which lines and an insulating layer are formed.

Figure 26:
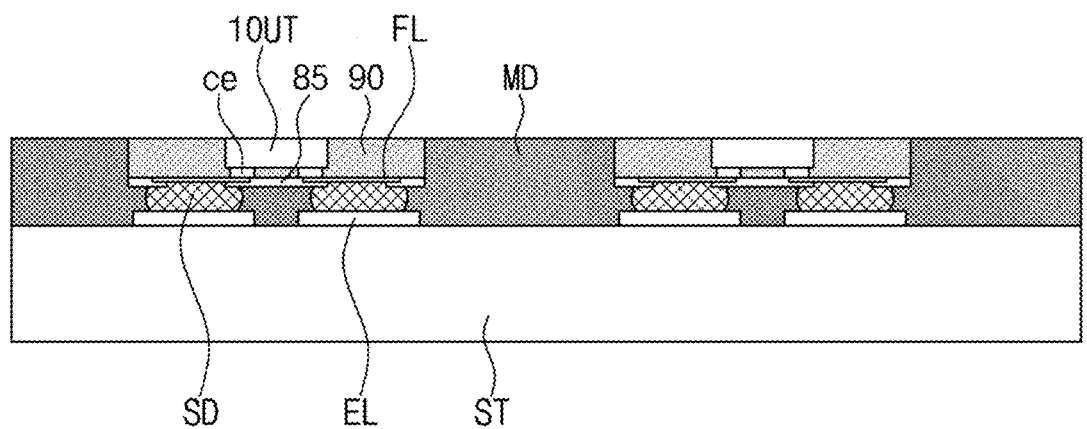
FIG. 26 is a cross-sectional view of a light emitting device package mounted on a printed circuit board on which electrodes are formed according to an exemplary embodiment.

FIG. 26 is a cross-sectional view of a light emitting device package mounted on the printed circuit board, on which electrodes are formed, according to an exemplary embodiment.

Referring to FIG. 26, the light emitting device package may be provided in a single or plural number, and may be disposed upside down on a printed circuit board ST, on which electrodes EL are formed to be electrically connected to the fan-out lines RL with a solder SD interposed therebetween. In particular, each light emitting device package is turned upside down, such that a rear surface of the light emitting structure faces upward, and then disposed on the printed circuit board ST. The solder SD is disposed between the exposed fan-out lines FL and the electrodes EL formed on the printed circuit board ST, and the fan-out lines FL and the electrodes EL disposed on the printed circuit board ST are electrically connected to each other by the solder SD, respectively.

According to an exemplary embodiment, a mold MD may be further disposed on the printed circuit board ST to support the light emitting device packages. The mold MD is disposed on the printed circuit board ST and covers side surfaces of the light emitting device packages and connection portions by the solder SD, thereby improving a stability of the printed circuit board ST mounted with the light emitting device packages. In this case, the mold MD is substantially filled in between the light emitting device packages and between the printed circuit board ST and each light emitting device package to substantially surround the solder SD disposed between the printed circuit board ST and each light emitting device package. The mold MD may be formed by providing a material for the mold to the printed circuit board ST, on which the light emitting device packages are mounted, and curing the material. For example, the mold MD may be formed by a transfer mold method or a vacuum lamination method. However, the inventive concepts are not be limited thereto, and various methods may be used to form the mold MD as long as the mold MD is substantially filled in between the light emitting device packages and between the printed circuit board ST and each light emitting device package. In this manner, the adhesive strength between the light emitting device packages and the printed circuit board ST may be improved, and the rigidity in overall structure of the light emitting device packages may also be increased.

According to an exemplary embodiment, the mold MD may include a light blocking material, and in this case, a color mixture of light emitted from adjacent light emitting device packages may be prevented. When the mold MD includes the light blocking material, light emitted from each light emitting device package may be guided to travel only in a direction (e.g., an upward direction in the drawings), to which the rear surface of the light emitting unit 10UT of the light emitting device package faces, and is prevented from traveling in other directions, e.g., directions to which the side and front surfaces of the light emitting unit 10UT face.

The light emitting device packages according to an exemplary embodiment may be arranged on the printed circuit board ST with a structure that facilitates repairing.

Figure 27:
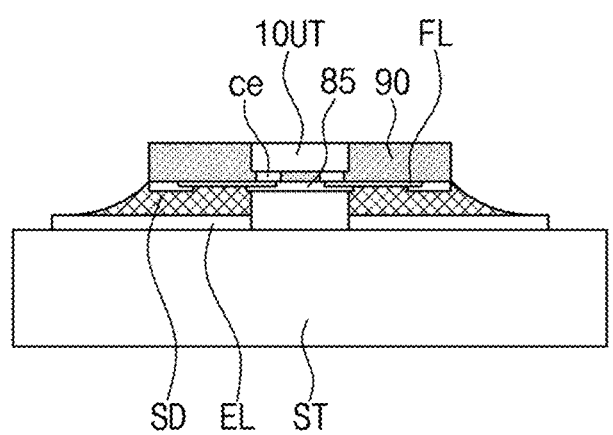
FIG. 27 is a cross-sectional view of one light emitting device package mounted on a printed circuit board.

FIG. 27 is a cross-sectional view of one light emitting device package mounted on the printed circuit board ST. According to an exemplary embodiment, a plural light emitting device packages may be arranged on the printed circuit board ST. More particularly, when the light emitting device package is used as the pixel of the display device, the plural light emitting device packages may be arranged on the printed circuit board ST. In this case, the light emitting device packages may be arranged in a matrix form on a substrate, where the electrodes and lines are formed, such as a printed circuit board, a glass substrate, or an organic polymer substrate. FIG. 27 exemplarily illustrates one light emitting device package among the plural light emitting device packages.

Referring to FIG. 27, each of the electrodes EL formed on the printed circuit board ST may have an area greater than that of a corresponding fan-out line among the fan-out lines FL of the light emitting device packages. The solder SD is provided between the electrodes EL disposed on the printed circuit board ST and the fan-out lines FL to correspond to the area of the electrodes EL disposed on the printed circuit board ST. Accordingly, the solder SD may include a portion exposed to the outside of the light emitting device package.

According to the device having the above-described connection structure, when defects occur in the light emitting device package, the defective light emitting device package may be separated and removed from the printed circuit board ST. For example, a laser beam may be irradiated onto the solder SD to melt the solder SD. Since the solder SD according to an exemplary embodiment is exposed to the outside of the light emitting device package, the laser beam may be easily irradiated onto the solder SD. In this manner, even though defects may occur in the light emitting device package, the device on which the light emitting device package is mounted may be easily repaired.

According to the above, the light emitting device package may have a simple structure, and may be simply manufactured. In addition, a display device may employ at least one or more light emitting device packages according to exemplary embodiments.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:
1. A light emitting device package comprising:
   a substrate;
   a light emitting structure including a plurality of epitaxial stacks sequentially stacked on the substrate and having a light emitting area defined by the epitaxial stacks, the epitaxial stacks comprising:
   a first epitaxial stack configured to emit a first light;
   a second epitaxial stack disposed on the first epitaxial stack and configured to emit a second light having a wavelength band different from the first light; and a third epitaxial stack disposed on the second epitaxial stack and configured to emit a third light having a wavelength band different from the first and second lights;

a plurality of bump electrodes disposed on the light emitting structure, at least a portion of each bump electrode overlapping with the light emitting area;

a molding layer covering a side surface and an upper surface of the light emitting structure; and a plurality of fan-out lines disposed on the molding layer and connected to the light emitting structure through the bump electrodes, wherein each of the first, second, and third epitaxial stacks comprises:
 a first type semiconductor layer;
 an active layer disposed on the first type semiconductor layer; and
 a second type semiconductor layer disposed on the active layer, wherein the bump electrodes comprise:
 a first bump electrode connected to the second type semiconductor layer of the first epitaxial stack;
 a second bump electrode connected to the second type semiconductor layer of the second epitaxial stack;
 a third bump electrode connected to the second type semiconductor layer of the third epitaxial stack; and
 a fourth bump electrode connected to the first type semiconductor layers of the first, second, and third epitaxial stacks, wherein the fan-out lines comprise first, second, third, and fourth fan-out lines respectively connected to the first, second, third, and fourth bump electrodes, wherein the fan-out lines include an exposed portion that does not overlap with the light emitting area, and wherein the molding layer is disposed between the bump electrodes.

2. The light emitting device package of claim 1, wherein an area of the fan-out lines overlapping with the light emitting area is less than an area of the bump electrodes overlapping with the light emitting area.

3. The light emitting device package of claim 1, further comprising connection electrodes disposed between the fan-out lines and the bump electrodes to connect the fan-out lines and the bump electrodes, respectively.

4. The light emitting device package of claim 3, wherein a distance between two connection electrodes adjacent to each other is greater than a distance between two bump electrodes adjacent to each other, and less than a distance between two fan-out lines adjacent to each other.

5. The light emitting device package of claim 1, wherein the first, second, third, and fourth bump electrodes are disposed over an edge of the first, second, and third epitaxial stacks.

6. The light emitting device package of claim 1, wherein a distance between two of the fan-out lines adjacent to each other is greater than a distance between two of the bump electrodes adjacent to each other.

7. The light emitting device package of claim 6, wherein a distance between the exposed portions of two fan-out lines adjacent to each other is greater than the distance between two bump electrodes adjacent to each other.

8. The light emitting device package of claim 1, further comprising pads disposed between the bump electrodes and the first, second, and third epitaxial stacks, the pads comprising:
 a first pad connecting the n-type semiconductor layer of the first epitaxial stack to the first bump electrode;
 a second pad connecting the n-type semiconductor layer of the second epitaxial stack to the second bump electrode;
 a third pad connecting the n-type semiconductor layer of the third epitaxial stack to the third bump electrode; and
 a fourth pad connecting the p-type semiconductor layers of the first, second, and third epitaxial stacks to the fourth bump electrode.

9. The light emitting device package of claim 8, further comprising an insulation layer disposed between the first, second, and third epitaxial stacks and the first, second, third, and fourth pads, the insulation layer having a plurality of contact holes defined therethrough,
 wherein the first, second, and third epitaxial stacks are connected to the first, second, third, and fourth pads respectively through the contact holes.

10. The light emitting device package of claim 9, wherein the contact holes comprise:
 a first contact hole through which a portion of the second type semiconductor layer of the first epitaxial stack is exposed;
 a second contact hole through which a portion of the second type semiconductor layer of the second epitaxial stack is exposed;
 a third contact hole through which a portion of the second type semiconductor layer of the third epitaxial stack is exposed; and
 a fourth contact hole through which a portion of the first type semiconductor layers of the first, second, and third epitaxial stacks is exposed.

11. The light emitting device package of claim 10, wherein the fourth contact hole includes:
 a first sub-contact hole through which a portion of the first type semiconductor layer of the first epitaxial stack is exposed; and
 a second sub-contact hole through which a portion of the first type semiconductor layer of each of the second and third epitaxial stacks is exposed.

12. The light emitting device package of claim 9, further comprising redistribution lines disposed on the insulation layer and respectively connected to the fan-out lines.

13. The light emitting device package of claim 12, wherein a distance between the redistribution lines adjacent to each other is different from a distance between the fan-out lines adjacent to each other.

14. A display device comprising:
 a plurality of pixels, each of the pixels comprising:
  a light emitting structure including a substrate and a plurality of epitaxial stacks sequentially stacked on the substrate and configured to emit light having different wavelength bands from each other, the light emitting structure having a light emitting area defined by the epitaxial stacks;
  a molding layer covering a side surface and an upper surface of the light emitting structure;
  a plurality of bump electrodes disposed on the light emitting structure, at least a portion of each bump electrode overlapping with the light emitting area; and
  a plurality of fan-out lines disposed on the molding layer and connected to the light emitting structure through the bump electrodes,
 wherein an area of the fan-out lines overlapping with the light emitting area is less than an area of the bump electrodes overlapping with the light emitting area.

15. A light emitting device package module comprising:
 a printed circuit board including a plurality of electrodes;

a light emitting device package disposed on the printed circuit board; and
a solder disposed between the printed circuit board and the light emitting device package, the light emitting device package comprising:
   a substrate;
   a light emitting structure including a plurality of epitaxial stacks sequentially stacked on the substrate and having a light emitting area defined by the epitaxial stacks, the epitaxial stacks comprising:
      a first epitaxial stack configured to emit a first light;
      a second epitaxial stack disposed on the first epitaxial stack and configured to emit a second light having a wavelength band different from the first light; and
      a third epitaxial stack disposed on the second epitaxial stack and configured to emit a third light having a wavelength band different from the first and second lights;
   a plurality of bump electrodes disposed on the light emitting structure at least a portion of each bump electrode overlapping with the light emitting area;
   a molding layer covering a side surface and an upper surface of the light emitting structure; and
   a plurality of fan-out lines disposed on the molding layer and connected to the light emitting structure through the bump electrodes,
wherein each of the first, second, and third epitaxial stacks comprises:
   a first type semiconductor layer;
   an active layer disposed on the first type semiconductor layer; and
   a second type semiconductor layer disposed on the active layer,
wherein the bump electrodes comprise:
   a first bump electrode connected to the second type semiconductor layer of the first epitaxial stack;
   a second bump electrode connected to the second type semiconductor layer of the second epitaxial stack;
   a third bump electrode connected to the second type semiconductor layer of the third epitaxial stack; and
   a fourth bump electrode connected to the first type semiconductor layers of the first, second, and third epitaxial stacks,
wherein the fan-out lines comprise first, second, third, and fourth fan-out lines respectively connected to the first, second, third, and fourth bump electrodes,
wherein the fan-out lines include an exposed portion that is spaced apart from the light emitting area, and
wherein the molding layer is disposed between the bump electrodes.

16. The light emitting device package module of claim 15, wherein a portion of the solder is exposed to an outside of the light emitting device package.

* * * * *